(12) United States Patent
Sadeghi et al.

(10) Patent No.: US 12,341,040 B2
(45) Date of Patent: Jun. 24, 2025

(54) INTEGRATED ADAPTIVE POSITIONING SYSTEMS AND ROUTINES FOR AUTOMATED WAFER-HANDLING ROBOT TEACH AND HEALTH CHECK

(71) Applicant: Lam Research Corporation, Fremont, CA (US)

(72) Inventors: Hossein Sadeghi, San Jose, CA (US); Richard M. Blank, San Jose, CA (US); Peter S. Thaulad, San Jose, CA (US); Mark E. Emerson, Newberg, OR (US); Arulselvam Simon Jeyapalan, Newark, CA (US); Marco Piccigallo, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 432 days.

(21) Appl. No.: 17/629,752

(22) PCT Filed: Jul. 21, 2020

(86) PCT No.: PCT/US2020/070300
§ 371 (c)(1),
(2) Date: Jan. 24, 2022

(87) PCT Pub. No.: WO2021/022291
PCT Pub. Date: Feb. 4, 2021

(65) Prior Publication Data
US 2022/0254666 A1    Aug. 11, 2022

Related U.S. Application Data

(60) Provisional application No. 62/879,278, filed on Jul. 26, 2019.

(51) Int. Cl.
*B25J 11/00* (2006.01)
*B25J 9/16* (2006.01)
(Continued)

(52) U.S. Cl.
CPC ...... *H01L 21/67259* (2013.01); *B25J 9/1692* (2013.01); *H01L 21/68707* (2013.01); *H01L 21/68721* (2013.01); *H01L 21/68742* (2013.01)

(58) Field of Classification Search
CPC ......... H01L 21/67259; H01L 21/68707; H01L 21/68721; H01L 21/68742;
(Continued)

(56) References Cited

U.S. PATENT DOCUMENTS

| | | | |
|---|---|---|---|
| 4,819,167 | A | 4/1989 | Cheng et al. |
| 5,001,327 | A | 3/1991 | Hirasawa et al. |

(Continued)

FOREIGN PATENT DOCUMENTS

| | | | |
|---|---|---|---|
| CN | 101154610 A | 4/2008 | |
| CN | 101911276 A | 12/2010 | |

(Continued)

OTHER PUBLICATIONS

English Translation for KR-20160144727 (Year: 2016).*
(Continued)

*Primary Examiner* — Rachid Bendidi
*Assistant Examiner* — Hossam M Abd El Latif
(74) *Attorney, Agent, or Firm* — Weaver Austin Villeneuve & Sampson LLP

(57) ABSTRACT

Systems and techniques for determining and using multiple types of offsets for providing wafers to a wafer support of a wafer station of a semiconductor processing tool are disclosed; such techniques and systems may use an autocalibration wafer that may include a plurality of sensors, including a plurality of edge-located imaging sensors that may be used to image fiducials associated with two different structures located in a selected wafer station.

19 Claims, 23 Drawing Sheets

(51) Int. Cl.
*B25J 13/00* (2006.01)
*B25J 13/08* (2006.01)
*H01L 21/67* (2006.01)
*H01L 21/677* (2006.01)
*H01L 21/68* (2006.01)
*H01L 21/687* (2006.01)

(58) Field of Classification Search
CPC  H01L 21/67778; H01L 21/681; B25J 9/1692; B25J 9/163; B25J 11/0095; B25J 13/006; B25J 13/086; B25J 13/087; B25J 13/088
USPC .......................................................... 700/254
See application file for complete search history.

(56) References Cited

U.S. PATENT DOCUMENTS

| | | |
|---|---|---|
| 5,483,138 A | 1/1996 | Shmookler et al. |
| 5,563,798 A | 10/1996 | Berken et al. |
| 5,564,889 A | 10/1996 | Araki |
| 5,706,201 A | 1/1998 | Andrews |
| 5,855,465 A | 1/1999 | Boitnott et al. |
| 5,855,681 A | 1/1999 | Maydan et al. |
| 6,195,619 B1 | 2/2001 | Ren |
| 6,198,976 B1 | 3/2001 | Sundar et al. |
| 6,315,512 B1 | 11/2001 | Tabrizi et al. |
| 6,315,878 B1 | 11/2001 | Patadia et al. |
| 6,405,101 B1 | 6/2002 | Johanson et al. |
| 6,430,468 B1 | 8/2002 | Tepman et al. |
| 6,478,532 B1 | 11/2002 | Coady et al. |
| 6,508,883 B1 | 1/2003 | Tanguay |
| 6,568,552 B1 | 5/2003 | Tabrizi et al. |
| 6,610,150 B1 | 8/2003 | Savage et al. |
| 6,678,581 B2 | 1/2004 | Hung et al. |
| 6,760,976 B1 | 7/2004 | Martinson et al. |
| 7,008,802 B2 | 3/2006 | Lu |
| 7,357,842 B2 | 4/2008 | Ishikawa et al. |
| 7,658,586 B2 | 2/2010 | Niewmierzycki et al. |
| 7,694,647 B2 | 4/2010 | Ishikawa et al. |
| 7,743,728 B2 | 6/2010 | Ishikawa et al. |
| 7,925,377 B2 | 4/2011 | Ishikawa et al. |
| 7,933,665 B2 | 4/2011 | Sakiya et al. |
| 8,060,252 B2 | 11/2011 | Gage et al. |
| 8,225,683 B2 | 7/2012 | Bailey, III |
| 8,293,071 B2 | 10/2012 | Lee |
| 8,489,237 B2 | 7/2013 | Gage et al. |
| 9,002,514 B2 | 4/2015 | Genetti et al. |
| 9,163,928 B2 | 10/2015 | Tang et al. |
| 9,892,956 B1 | 2/2018 | Konkola et al. |
| 9,960,068 B1 | 5/2018 | Konkola et al. |
| 10,109,517 B1 | 10/2018 | Blank et al. |
| 10,796,940 B2 | 10/2020 | Thaulad et al. |
| 11,581,214 B2 | 2/2023 | Thaulad et al. |
| 12,217,985 B2 | 2/2025 | Topping et al. |
| 2001/0020199 A1 | 9/2001 | Bacchi et al. |
| 2002/0053509 A1 | 5/2002 | Hanson et al. |
| 2002/0098072 A1 | 7/2002 | Sundar |
| 2003/0135302 A1 | 7/2003 | Hung et al. |
| 2003/0202865 A1 | 10/2003 | Ponnekanti et al. |
| 2004/0031340 A1 | 2/2004 | Renken |
| 2004/0067127 A1 | 4/2004 | Hofmeister et al. |
| 2004/0129940 A1 | 7/2004 | Iwase et al. |
| 2004/0151574 A1 | 8/2004 | Lu |
| 2004/0258514 A1 | 12/2004 | Raaijmakers |
| 2005/0137751 A1 | 6/2005 | Cox et al. |
| 2005/0145879 A1 | 7/2005 | Nakayama et al. |
| 2005/0220576 A1 | 10/2005 | Kim et al. |
| 2005/0265814 A1 | 12/2005 | Coady |
| 2006/0020367 A1 | 1/2006 | Nangoy |
| 2006/0039781 A1 | 2/2006 | Niewmierzycki et al. |
| 2006/0045664 A1 | 3/2006 | Niewmierzycki et al. |
| 2006/0182538 A1 | 8/2006 | Lee et al. |
| 2006/0236793 A1 | 10/2006 | Hunter |
| 2008/0152463 A1 | 6/2008 | Chidambaram et al. |
| 2008/0319559 A1 | 12/2008 | De Ridder et al. |
| 2009/0142163 A1 | 6/2009 | Genetti et al. |
| 2009/0143911 A1 | 6/2009 | Gage et al. |
| 2010/0228374 A1 | 9/2010 | Pike |
| 2010/0278623 A1 | 11/2010 | Blank et al. |
| 2012/0014773 A1 | 1/2012 | Gage et al. |
| 2012/0022827 A1 | 1/2012 | Hertgens et al. |
| 2012/0224945 A1 | 9/2012 | Douki et al. |
| 2014/0271051 A1 | 9/2014 | Hiroki |
| 2014/0365011 A1 | 12/2014 | Hosek et al. |
| 2015/0114292 A1 | 4/2015 | Haverkamp et al. |
| 2015/0249028 A1 | 9/2015 | Genetti et al. |
| 2016/0126128 A1 | 5/2016 | Bonora et al. |
| 2016/0358808 A1 | 12/2016 | Madsen et al. |
| 2017/0004987 A1 | 1/2017 | Fairbairn |
| 2017/0018446 A1 | 1/2017 | Yin et al. |
| 2017/0032510 A1 | 2/2017 | Francken et al. |
| 2018/0014411 A1* | 1/2018 | Vronsky ................ B41J 29/393 |
| 2018/0151407 A1 | 5/2018 | Stone |
| 2018/0158716 A1 | 6/2018 | Konkola et al. |
| 2018/0211864 A1 | 7/2018 | Nordin et al. |
| 2019/0172738 A1 | 6/2019 | Hiester et al. |
| 2019/0172742 A1* | 6/2019 | Mochizuki ........... H01L 21/681 |
| 2019/0304826 A1* | 10/2019 | Liu .................... G01N 21/9505 |
| 2019/0390985 A1* | 12/2019 | Kwok .................... G01B 11/24 |
| 2020/0144097 A1 | 5/2020 | Thaulad et al. |
| 2022/0028714 A1 | 1/2022 | Thaulad et al. |
| 2022/0172967 A1 | 6/2022 | Topping et al. |

FOREIGN PATENT DOCUMENTS

| | | |
|---|---|---|
| CN | 102017121 A | 4/2011 |
| CN | 102203919 A | 9/2011 |
| CN | 102017121 B | 1/2013 |
| CN | 105762089 A | 7/2016 |
| CN | 106030775 A | 10/2016 |
| CN | 106468541 A | 3/2017 |
| CN | 106773542 A | 5/2017 |
| CN | 206907745 U * | 1/2018 |
| CN | 108374157 A | 8/2018 |
| CN | 118140300 A | 6/2024 |
| EP | 0288233 A2 | 10/1988 |
| EP | 1925577 A1 | 5/2008 |
| JP | H10340940 A | 12/1998 |
| JP | 2002280282 A | 9/2002 |
| JP | 3560823 B2 | 9/2004 |
| JP | 2005202933 A | 7/2005 |
| JP | 2005521926 A | 7/2005 |
| JP | 2006186171 A | 7/2006 |
| JP | 2006522476 A | 9/2006 |
| JP | 2007227953 A | 9/2007 |
| JP | 2011091071 A | 5/2011 |
| JP | 2011253844 A | 12/2011 |
| JP | 2012523682 A | 10/2012 |
| JP | 3181265 U | 1/2013 |
| JP | 2014150227 A | 8/2014 |
| JP | 2016100407 A | 5/2016 |
| JP | 2016139737 A | 8/2016 |
| JP | 2018538765 A | 12/2018 |
| JP | 2019102728 A | 6/2019 |
| KR | 19990030721 A | 5/1999 |
| KR | 20020095371 A | 12/2002 |
| KR | 20050072349 A | 7/2005 |
| KR | 20050072621 A | 7/2005 |
| KR | 20050092278 A | 9/2005 |
| KR | 100595135 B1 | 6/2006 |
| KR | 100676823 B1 | 2/2007 |
| KR | 100701080 B1 | 3/2007 |
| KR | 200436002 Y1 | 4/2007 |
| KR | 20090045504 A | 5/2009 |
| KR | 20130125158 A | 11/2013 |
| KR | 20160144727 A * | 12/2016 |
| KR | 20170015209 A | 2/2017 |
| KR | 20190031857 A | 3/2019 |
| KR | 20190041126 A | 4/2019 |
| KR | 102533126 B1 | 5/2023 |
| TW | 200731452 A | 8/2007 |
| TW | 201713471 A | 4/2017 |
| WO | WO-2014069291 A1 | 5/2014 |
| WO | WO-2021022291 A1 | 2/2021 |

(56) References Cited

FOREIGN PATENT DOCUMENTS

OTHER PUBLICATIONS

Chinese First Office Action, dated Dec. 2, 2011, issued in Application No. 200810178495.1.
Chinese Second Office Action, dated Nov. 26, 2012, issued in Application No. 200810178495.1.
Chinese Third Office Action, dated Mar. 11, 2013, issued in Application No. 200810178495.1.
CN Office Action dated Apr. 25, 2024 in CN Application No. 201980088012.5 with English translation.
CN Office Action dated Mar. 19, 2024 in CN Application No. 202080066598.8 with English translation.
CN Office Action dated Oct. 11, 2023 in Application No. CN202080066598.8 with English translation.
International Preliminary Report on Patentability and Written Opinion dated May 2, 2024 in PCT Application No. PCT/US2022/047055.
International Preliminary Report on Patentability dated Feb. 10, 2022 issued in Application No. PCT/US2020/070300.
International Search Report and Written Opinion dated Feb. 16, 2023 in PCT Application No. PCT/US2022/047055.
Korean Final Office Action dated Jan. 27, 2016 issued in KR 10-2015-0082832.
Korean Office Action dated Mar. 11, 2015 issued in KR 10-2008-0119291.
Korean Office Action dated Sep. 22, 2015 issued in KR 10-2015-0082832.
SG Office Action dated Jul. 21, 2023, in application No. SG11202110712S.
TW Office Action dated Jul. 17, 2023, in Application No. TW109110402 with English translation.
TW Office Action dated Jul. 31, 2023 in Application No. TW108139880 with English Translation.
US Final Office Action, dated Dec. 23, 2011, issued in U.S. Appl. No. 11/998,857.
U.S. Non-Final Office Action dated Dec. 1, 2023 in U.S. Appl. No. 17/593,791.
US Notice of Allowance, dated Dec. 3, 2014, issued in U.S. Appl. No. 11/998,857.
U.S. Notice of Allowance dated Jun. 7, 2022 in U.S. Appl. No. 17/309,180.
US Notice of Allowance, dated Jun. 29, 2016, issued in U.S. Appl. No. 14/636,558.
US Notice of Allowance, dated Mar. 15, 2013, issued in U.S. Appl. No. 13/243,906.
U.S. Notice of Allowance dated Oct. 12, 2022, in U.S. Appl. No. 17/309,180.
US Notice of Allowance, dated Sep. 19, 2011, issued in U.S. Appl. No. 11/998,858.
US Notice of Allowance [Supplemental Notice of Allowability], dated Jan. 27, 2015, issued in U.S. Appl. No. 11/998,857.
US Office Action, dated Apr. 15, 2011, issued in U.S. Appl. No. 11/998,858.
US Office Action, dated Dec. 2, 2015, issued in U.S. Appl. No. 14/636,558.
US Office Action, dated Jun. 24, 2011, issued in U.S. Appl. No. 11/998,857.
US Office Action, dated Nov. 14, 2012, issued in U.S. Appl. No. 13/243,906.
CN Office Action dated Aug. 15, 2024 in CN Application No. 202080039812 with English translation.
CN Office Action dated Oct. 18, 2024 in CN Application No. 202080066598.8 with English translation.
JP Office Action dated Aug. 20, 2024 in JP Application No. 2022-505392, with English Translation.
KR Notice of Allowances dated Sep. 10, 2024 in KR Application No. 10-2021-7017305 with English Translation.
KR Office Action dated Jun. 17, 2024 in KR Application No. 10-2021-7017305, with English Translation.
KR Office Action dated Sep. 14, 2024 in KR Application No. 10-2021-7035322, with English Translation.
KR Office Action dated Sep. 24, 2024 in KR Application No. 10-2022-7006602, with English Translation.
TW Office Action dated Aug. 19, 2024 in TW Application No. 109124912, with English Translation.
U.S. Final Office Action dated Jun. 17, 2024 in U.S. Appl. No. 17/593,791.
U.S. Notice of Allowance dated Oct. 9, 2024 in U.S. Appl. No. 17/593,791.
U.S. Notice of Allowance dated Sep. 26, 2024 in U.S. Appl. No. 17/593,791.
U.S. Appl. No. 18/703,238, inventors Thaulad P.S, et al., filed Apr. 19, 2024.
International Preliminary Report on Patentability dated May 20, 2021 issued in Application No. PCT/US2019/059261.
International Preliminary Report on Patentability dated Oct. 14, 2021, in application No. PCT/US2020/025389.
International Search Report and Written Opinion dated Feb. 25, 2020 issued in Application No. PCT/US2019/059261.
International Search Report and Written Opinion dated Jul. 23, 2020 issued in Application No. PCT/US2020/025389.
International Search Report and Written Opinion dated Nov. 4, 2020 issued in Application No. PCT/US2020/070300.
US Ex Parte Quayle dated Apr. 17, 2020 issued in U.S. Appl. No. 16/180,691.
US Notice of Allowance dated Jun. 29, 2020 issued in U.S. Appl. No. 16/180,691.
U.S. Appl. No. 17/309,180, inventors Thaulad et al., filed May 3, 2021.
U.S. Appl. No. 17/593,791, inventors Topping et al., filed Sep. 24, 2021.
KR Notice of Allowance dated Feb. 21, 2025 in KR Application No. 10-2021-7035322, with English Translation.
U.S. Appl. No. 18/988,750, inventors Topping S et al., filed on Dec. 19, 2024.

* cited by examiner

INTEGRATED ADAPTIVE POSITIONING SYSTEMS AND ROUTINES FOR AUTOMATED WAFER-HANDLING ROBOT TEACH AND HEALTH CHECK

RELATED APPLICATION DATA

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor processing tools utilize wafer-handling robots to move semiconductor wafers in between various wafer stations. Since wafer-handling robots typically pick up semiconductor wafers from below using a blade- or spatula-type end effector and the semiconductor wafers are not positively secured to the wafer-handling robot end effector, there is often some small degree of variance in relative positioning between the end effector and the semiconductor wafers placed thereupon. Due to the sensitivity of semiconductor processing operations, it is typical to correct for such variance when placing semiconductor wafers using a wafer-handling robot so that the semiconductor wafers are placed in their respective processing stations within an acceptable tolerance range at a desired location, e.g., generally centered in the processing stations. Modern semiconductor processing tools utilize active wafer centering (AWC) systems to aid in such wafer placements.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some implementations, a system for assisting in the calibration of a wafer-handling robot for a semiconductor processing tool may be provided. The system may include, for example, an autocalibration wafer that includes a substrate sized to be carried by the wafer-handling robot and having a first side that is configured to contact an end effector of the wafer-handling robot when the substrate is carried by the wafer-handling robot; a plurality of first imaging sensors supported by the substrate and positioned at locations offset from a common point of the substrate, each first imaging sensor having a downward-facing field of view when the substrate is oriented with the first side facing downwards; and a first controller that is communicatively connected with each of the first imaging sensors.

In some implementations of the system, the first imaging sensors may be arranged in a circular array about the common point.

In some implementations of the system, the substrate may be nominally circular and may have the same diameter as semiconductor wafers that the semiconductor processing tool is configured to process.

In some implementations of the system, the substrate may be nominally circular and may have the same diameter as an edge ring that the semiconductor processing tool is configured to use.

In some implementations of the system, the substrate may be nominally circular and may have a diameter in between an outer diameter and an inner diameter of an edge ring that the semiconductor processing tool is configured to use.

In some implementations of the system, the substrate may be nominally circular and may have a diameter within ±10% of the average between an outer diameter and an inner diameter of an edge ring that the semiconductor processing tool is configured to use.

In some implementations of the system, the substrate may be a nominally circular disk having a diameter selected from the group consisting of: 200 mm, 300 mm, and 450 mm.

In some implementations of the system, the autocalibration wafer may further include a power source configured to provide power to at least the first controller and the first imaging sensors.

In some implementations of the system, the power source may be a rechargeable battery, and the autocalibration wafer may further include a wireless charging feature configured to charge the rechargeable battery when interfaced with an electromagnetic field.

In some implementations of the system, the autocalibration wafer may further include a first wireless communications interface, and the first wireless communications interface may be communicatively connected with the first controller.

In some implementations of the system, the first wireless communications interface may include one or more wireless communications interfaces such as a Bluetooth transceiver or a WiFi transceiver.

In some implementations of the system, the autocalibration wafer may further include one or more orientation sensors, and the one or more orientation sensors may be communicatively connected with the first controller.

In some implementations of the system, each orientation sensor may be an inclinometer or an accelerometer.

In some implementations of the system, the autocalibration wafer may further include one or more vibration sensors, and the one or more vibration sensors may be communicatively connected with the first controller.

In some implementations of the system, each vibration sensor may be an accelerometer, a laser microphone, or an optical distance measurement sensor.

In some implementations of the system, the autocalibration wafer may further include one or more proximity sensors each configured to measure a distance between the first side and an object located beneath that proximity sensor when the first side is facing downward, and the one or more proximity sensors may be communicatively connected with the first controller.

In some implementations of the system, each proximity sensor may be an optical proximity sensor, an inductive proximity sensor, or a capacitive proximity sensor.

In some implementations of the system, the first imaging sensors may be arranged in a circular array about the common point, the substrate may be nominally circular and may have the same diameter as semiconductor wafers that the semiconductor processing tool is configured to process, the substrate may be a nominally circular disk having a diameter selected from the group consisting of: 200 mm, 300 mm, and 450 mm, and the autocalibration wafer may further include a rechargeable battery configured to provide power to at least the first controller and the first imaging sensors, a wireless charging feature configured to charge the rechargeable battery when interfaced with an electromagnetic field, a first wireless communications interface that may be communicatively connected with the first controller and that may include one or more wireless communications interfaces such as a Bluetooth transceiver or a WiFi transceiver, one or more vibration sensors that may be communicatively connected with the first controller, and one or more proximity sensors, each proximity sensor communicatively connected with the first controller and configured to measure a distance between the first side and an object located beneath that proximity sensor when the first side is facing downward In some implementations of the system, the system may further include the semiconductor processing tool, and the semiconductor processing tool may include a wafer-handling robot, one or more wafer stations, and a second controller. In such implementations, each wafer station may include one or more corresponding wafer supports, the wafer-handling robot and the second controller may be communicatively connected, and the second controller and the first controller, in aggregate, may be configured to: a) select a first wafer support of the one or more wafer supports of a first wafer station of the one or more wafer stations, b) cause the wafer-handling robot to position the autocalibration wafer above the first wafer station, and c) cause each first imaging sensor to obtain a corresponding first image of a fiducial of the first wafer support while the autocalibration wafer is positioned above the first wafer support.

In some implementations of the system, the second controller and the first controller, in aggregate, may be further configured to determine location information for a center point of the first wafer support based on the first images.

In some such implementations of the system, the second controller and the first controller, in aggregate, may be further configured to: d) cause the wafer-handling robot to retrieve a calibration wafer, and e) cause the wafer-handling robot to transfer the calibration wafer to the first wafer support such that a center point of the calibration wafer is nominally centered on a center point of the first wafer support when viewed along a vertical axis.

In some implementations of the system, the second controller and the first controller, in aggregate, may be further configured to: f) cause the wafer-handling robot to position the autocalibration wafer over the first wafer support and the calibration wafer, g) cause each first imaging sensor to obtain a corresponding second image of a fiducial of the first wafer support and a fiducial of the calibration wafer while the autocalibration wafer is positioned over the first wafer support and the calibration wafer, and h) determine a wafer/wafer support horizontal offset between the center point of the calibration wafer and the center point of the first wafer support based on gap sizes between the fiducials of the first wafer support and the calibration wafer in the second images.

In some implementations of the system, the second controller and the first controller, in aggregate, may be further configured to: i) compare the wafer/wafer support horizontal offset to a threshold wafer/wafer support horizontal offset, and j) cause, responsive to determining that the wafer/wafer support horizontal offset is above the threshold wafer/wafer support horizontal offset, the wafer-handling robot to reposition the calibration wafer relative to the first wafer support to reduce the wafer/wafer support horizontal offset.

In some implementations of the system, the second controller and the first controller, in aggregate, may be further configured to repeat (f) through (j) N times or until the wafer/wafer support horizontal offset is at or below the threshold wafer/wafer support horizontal offset, whichever occurs first.

In some implementations of the system, the second controller and the first controller, in aggregate, may be further configured to: d) cause the wafer-handling robot to retrieve a first edge ring, and e) cause the wafer-handling robot to transfer the first edge ring to the first wafer support such that a center point of the first edge ring is nominally centered on a center point of the first wafer support when viewed along a vertical axis.

In some implementations of the system, the second controller and the first controller, in aggregate, may be further configured to: f) cause the wafer-handling robot to position the autocalibration wafer over the first wafer support and the first edge ring, g) cause each first imaging sensor to obtain a corresponding second image of a fiducial of the first wafer support and a fiducial of the first edge ring while the autocalibration wafer is positioned over the first wafer support and the first edge ring, and h) determine an edge ring/wafer support horizontal offset between the center point of the first edge ring and the center point of the first wafer support based on gap sizes between the fiducials of the first wafer support and the first edge ring in the second images.

In some implementations of the system, the second controller and the first controller, in aggregate, may be further configured to: i) compare the edge ring/wafer support horizontal offset to a threshold edge ring/wafer support horizontal offset, and j) cause, responsive to determining that the edge ring/wafer support horizontal offset is above the threshold edge ring/wafer support horizontal offset, the wafer-handling robot to reposition the first edge ring relative to the first wafer support to reduce the edge ring/wafer support horizontal offset.

In some implementations of the system, the second controller and the first controller, in aggregate, may be further configured to repeat (f) through (j) N times or until the edge ring/wafer support horizontal offset is at or below the threshold edge ring/wafer support horizontal offset, whichever occurs first.

In some implementations of the system, the second controller and the first controller, in aggregate, may be further configured to: f) cause the wafer-handling robot to retrieve a calibration wafer, and g) cause the wafer-handling robot to transfer the calibration wafer to the first wafer support such that a center point of the calibration wafer is nominally centered on the center point of the first edge ring when viewed along the vertical axis.

In some implementations of the system, the second controller and the first controller, in aggregate, may be further configured to: h) cause the wafer-handling robot to position the autocalibration wafer over the first wafer support, the first edge ring, and the calibration wafer, i) cause each first imaging sensor to obtain a corresponding second image of a fiducial of the calibration wafer and the fiducial of the first edge ring while the autocalibration wafer is positioned over the first wafer support, the calibration wafer, and the first edge ring, and j) determine an edge ring/wafer horizontal offset between the center point of the first edge ring and the center point of the calibration wafer based on gap sizes between the fiducials of the calibration wafer and the first edge ring in the second images.

In some implementations of the system, the second controller and the first controller, in aggregate, may be further configured to: k) compare the edge ring/wafer horizontal offset to a threshold edge ring/wafer horizontal offset, and l) cause, responsive to determining that the edge ring/wafer horizontal offset is above the threshold edge ring/wafer horizontal offset, the wafer-handling robot to reposition the calibration wafer relative to the first edge ring to reduce the edge ring/wafer horizontal offset.

In some implementations of the system, the second controller and the first controller, in aggregate, may be further configured to repeat (h) through (l) M times or until the edge ring/wafer horizontal offset is at or below the threshold edge ring/wafer horizontal offset, whichever occurs first.

In some implementations of the system, the second controller and the first controller, in aggregate, may be further configured to: cause the wafer-handling robot to re-position the autocalibration wafer over the first wafer support, the first edge ring, and the calibration wafer, cause each first imaging sensor to obtain a corresponding third image of the fiducial of the calibration wafer and a fiducial of the first wafer support while the autocalibration wafer is positioned over the first wafer support, the calibration wafer, and the first edge ring, and determine a wafer support/wafer horizontal offset between the center point of the first wafer support and the center point of the calibration wafer based on gap sizes between the fiducials of the calibration wafer and the first wafer support in the third images.

In some implementations of the system, the second controller and the first controller, in aggregate, may be further configured to: compare the wafer support/wafer horizontal offset to a threshold wafer support/wafer horizontal offset, and cause, responsive to determining that the wafer support/wafer horizontal offset is above the threshold wafer support/wafer horizontal offset, the wafer-handling robot to reposition, relative to the first wafer support, at least one item selected from the group consisting of: the calibration wafer and the edge ring.

In some implementations of the system, the semiconductor processing tool may include a semiconductor processing chamber, the first wafer station may be in the semiconductor processing chamber, and the first wafer support may include a pedestal in the semiconductor processing chamber, In some implementations of the system, the semiconductor processing tool may include a load lock for transferring wafers between different pressure environments, the first wafer station may be in the load lock, and the first wafer support may be a structure in the load lock.

In some implementations of the system, the semiconductor processing tool may include a buffer for storing one or more wafers before, after, or in between processing operations, the first wafer station may be in the buffer, and the first wafer support may be one of a plurality of wafer support ledges in the buffer.

In some implementations of the system, the semiconductor processing tool may include a load lock for transferring wafers between different pressure environments, the first wafer station may be in the load lock, and the first wafer support may be a structure in the load lock.

In some implementations of the system, the system may further include the semiconductor processing tool, and the semiconductor processing tool may include: a wafer-handling robot; one or more wafer stations; and a second controller. In such a system, each wafer station may include one or more corresponding wafer supports, the wafer-handling robot and the second controller may be communicatively connected, and the second controller and the first controller, in aggregate, may be configured to: a) select a first wafer support of the one or more wafer supports of a first wafer station of the one or more wafer stations, b) cause the wafer-handling robot to transfer the autocalibration wafer to the first wafer station, and c) cause the one or more orientation sensors to obtain an inclination measurement for the substrate.

In some implementations of the system, the second controller may be configured to remove an edge ring from the first wafer support prior to performing (b).

In some implementations of the system, the system may further include the semiconductor processing tool, and the semiconductor processing tool may include: a wafer-handling robot; one or more wafer stations; and a second controller. In such an implementations, each wafer station may include one or more corresponding wafer supports, the wafer-handling robot and the second controller may be communicatively connected, the second controller and the first controller, in aggregate, may be configured to: a) select a first wafer support of the one or more wafer supports of a first wafer station of the one or more wafer stations, b) cause relative translation to occur between a plurality of lift pins of the first wafer support and the first wafer support such that the lift pins protrude from the first wafer support, c) cause the wafer-handling robot to transfer the autocalibration wafer to the lift pins, d) cause further relative translation to occur between the lift pins and the first wafer support while the autocalibration wafer is supported by the lift pins, e) obtain vibration data from the one or more vibration sensors during (d), f) evaluate the vibration data to determine if the vibration data indicates that vibrations that exceed a predetermined threshold, and g) provide a notification when the vibration data exceeds the predetermined threshold.

In some implementations of the system, the second controller may be configured to, as part of (d), cause the further relative translation between the lift pins and the first wafer support to occur such that the lift pins no longer protrude from the first wafer support and the autocalibration wafer rests on an upper surface of the first wafer support.

In some implementations of the system, the system may include the semiconductor processing tool, and the semiconductor processing tool may include: a wafer-handling robot; one or more wafer stations; and a second controller. In such a system, the wafer-handling robot and the second controller may be communicatively connected, and the second controller and the first controller, in aggregate, may be configured to: a) select a first wafer support of the one or more wafer supports of a first wafer station of the one or more wafer stations based, at least in part, on an indication that an edge ring is supported by the first wafer support, b) cause the autocalibration wafer to be placed onto the edge ring, c) cause each proximity sensor to measure a distance between the first wafer support and the autocalibration wafer, d) determine one or more height measurements associated with the edge ring based on the one or more distances, e) evaluate the one or more height measurements to determine if a height associated with the edge ring exceeds a predetermined threshold, and f) provide a notification when the height associated with the edge ring exceeds the predetermined threshold.

BRIEF DESCRIPTION OF THE DRAWINGS

The various implementations disclosed herein are illustrated by way of example, and not by way of limitation, in the figures of the accompanying drawings, in which like reference numerals refer to similar elements.

Figure 1:
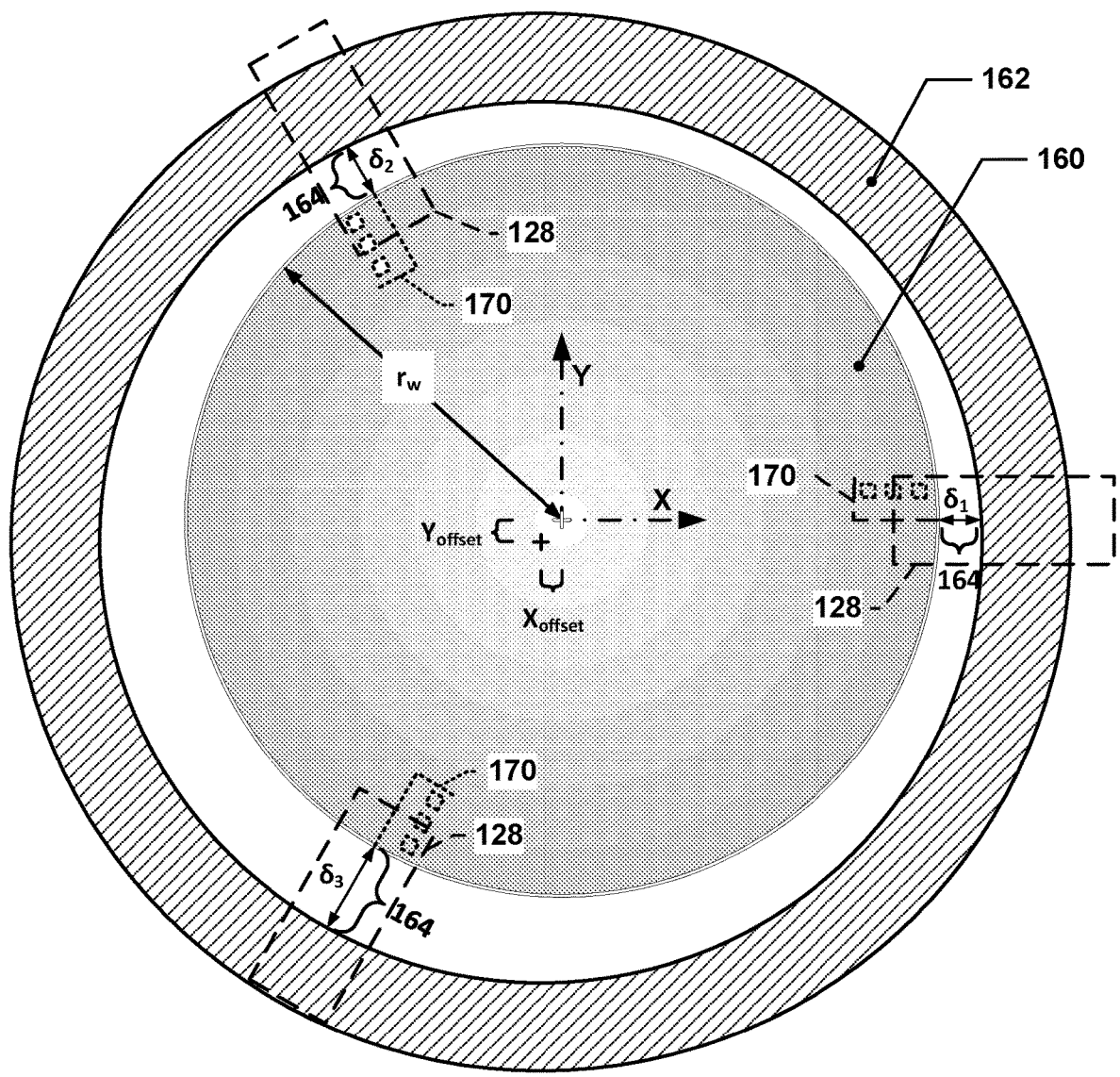
FIG. 1 depicts an example of a calibration wafer placed relative to an edge ring.

The Figures herein are generally not drawn to scale, although various aspects of the Figures, e.g., as discussed below, may be drawn to scale.

DETAILED DESCRIPTION

In typical semiconductor processing systems, accurate placement of wafers in preparation for various semiconductor processing operations and/or wafer-handling operations is achieved through a manual or semi-automated teaching process which typically requires the involvement of a technician or other human oversight in order to (1) "teach" a wafer-handling robot the desired locations of semiconductor wafers, edge rings, and/or wafer supports, such as electrostatic chucks (ESCs) with respect to each other or relative to an end effector of a wafer-handling robot, (2) "teach" an active wafer centering (AWC) system, and (3) perform wafer placement repeatability verification; once the wafer-handling robot has been taught such locations, any potential deviation in wafer placement from such a location for any given wafer, e.g., due to slight misalignments between that wafer and the end effector arising during the transfer of the wafer to the end effector, may be corrected out through using the AWC. Such manual or semi-automated teaching processes are time-consuming and cumbersome to implement.

Such teaching processes typically begin with training a wafer-handling robot the various locations where wafers are to be picked from or placed into during semiconductor processing tool operation. Generally speaking, while wafer-handling robots may be initially configured to have a general sense of where each such location is in a tool, wafer-handling robots will require some degree of customization to adapt their operation to the unique characteristics of the particular semiconductor processing tool that they are installed in, e.g., to accommodate different assembly tolerances or part tolerances. In order to accomplish this, wafer-handling robots may be placed into a teaching mode in which the wafer-handling robot may, for each location that is to be "taught," be guided into a position that corresponds with the position or configuration that the wafer-handling robot would be in under certain "ideal" conditions for that location—for example, the position or configuration that the wafer-handling robot is in when a semiconductor wafer is positioned with its center within a known distance (which may generally be desirably minimized or reduced to zero) from a reference point on an end effector of the wafer-handling robot and also within a known distance (which may also generally be desirably minimized or reduced to zero) from, for example, of the center of a wafer support at that location.

In typical wafer-handling robot training, the "ideal" positioning of the wafer-handling robot for each location may be achieved, for example, through the use of one or more fixtures or other structures that may interface with a feature on the wafer-handling robot end effector that serves as a reference point and with another feature that is fixed with respect to the target location. For example, in some wafer-handling robot teaching scenarios, a disk-like fixture having a diameter similar to that of a semiconductor wafer may be pinned into place on the end effector of the wafer-handling robot using, for example, a shaft or pin that passes through the center of the disk and through a reference feature, e.g., a hole, in the end effector that is centered on what is intended to be the location on the end effector on which semiconductor wafers will be centered when carried by the wafer-handling robot using the end effector. There may be similar pins that may be installed in features of the wafer support that may contact the edge of the disk when the end effector/disk are urged against such pins, thereby causing the disk and end effector to be guided into a particular position, e.g., a centered position. During such wafer-handling robot movement, the wafer-handling robot may be placed into an unpowered state that allows for the joints/arm segments of the wafer-handling robot to be easily moved through manual manipulation by an operator. Once the wafer-handling robot is properly positioned, the wafer-handling robot controller may obtain measurements of the various linkage positions of the wafer-handling robot, e.g., through obtaining measurements of relative or absolute angular displacement of the various rotational joints of the wafer-handling robot, in order to determine what the associated kinematic state of the wafer-handling robot is when in the desired position. Once the wafer-handling robot has obtained such positional information and associated it with that location, the location may be considered to have been taught to the wafer-handling robot.

Once a wafer-handling robot has been taught the various locations to which wafers will be delivered (or from which wafers will be retrieved), the wafer-handling robot may be controlled so as to enter the kinematic state that was taught for a location when performing future wafer transfer operations involving that location. If the semiconductor wafers placed on the end effector of the wafer-handling robot are placed so as to be exactly centered on the reference point of the end effector, those same semiconductor wafers will similarly be adequately centered in the destination location when placed there by the end effector of the wafer-handling robot after the wafer-handling robot is returned to the taught kinematic state for that location. However, due to various reasons, semiconductor wafers placed on the end effector of the wafer-handling robot may not be exactly centered on the reference point of the end effector. Such misalignments may appear to be relatively minor, e.g., on the scale of tens of micrometers, but even such minute misalignments may be detrimental to wafer processing operations. The use of active wafer centering (AWC) systems to allow for correction of such end effector/wafer misalignments has become commonplace within the industry.

In a typical AWC configuration, optical AWC sensors and optical beam emitters are positioned outside of a semiconductor wafer processing chamber in fixed locations such that a semiconductor wafer, when passed into the processing chamber by a wafer-handling robot, travels through two or more of the optical beams emitted by the optical beam emitters. The AWC sensors may detect when each optical beam encounters an edge of a semiconductor wafer (as evidenced by either the occlusion or reestablishment of an optical beam directed at one of the optical sensors). The AWC system may, at each instant in which an edge of the semiconductor wafer triggers one of the AWC optical sensors, obtain from sensors of the wafer-handling robot defining coordinate locations for a reference point, e.g., a point that is nominally centered on the semiconductor wafer (this may only be an estimated or desired center location, as the exact placement of the semiconductor wafer on the end effector may not be known), on the end effector of the wafer-handling robot. For a circular semiconductor wafer and with at least two AWC optical beam sensors, the resulting four or more coordinates are sufficient (and as few as three coordinates can be used) to determine the location of the center point of the semiconductor wafer relative to the semiconductor processing chamber (the AWC sensor and the wafer-handling robot base are both fixedly mounted with respect to the semiconductor processing chamber). Once such wafer center information has been obtained, it may be used as either a reference location for future wafer placements or may serve as a measurement of a current wafer position that may need correction.

For example, to train an AWC system, a reference wafer of some sort may be manually centered on a desired destination, e.g., a pedestal in a semiconductor processing chamber. Such manual centering may, for example, be performed with the aid of a fixture or a jig that guides the reference wafer to be properly centered with respect to the pedestal. Once the reference wafer is considered to be sufficiently centered on the pedestal, the wafer-handling robot may be controlled to retrieve the reference wafer and remove it from the semiconductor processing chamber; as the reference wafer is removed from the semiconductor processing chamber, the AWC system may be used to measure and determine the center of the reference wafer. This information, coupled with information from the wafer-handling robot that describes the displacements undergone by the reference wafer in moving from the pedestal-centered location to the center location determined by the AWC system, allows for future wafer placements to be adjusted to achieve similar wafer-pedestal centering. For example, if a new wafer is placed on the wafer-handling robot and passed through the AWC sensor in the same manner as the reference wafer, the center of the new wafer may be found to be somewhat offset, e.g., 0.5 mm in the X direction and 0.25 mm in the Y direction, from the previously-determined center location of the reference wafer. To correct for such variance, the wafer-handling robot may be controlled to account for such displacements when placing the new wafer on the pedestal by applying a corrective displacement when placing the new wafer, e.g., by moving the new wafer by an additional −0.5 mm in the X direction and −0.25 mm in the Y direction before, after, or during displacement of the new wafer by the inverse of the displacement used to bring the reference wafer from the pedestal and to and through the AWC sensor.

Similar techniques using AWC systems may also be used for adjusting the placement of edge rings onto wafer supports, e.g., the center point of an edge ring may be determined using an AWC as it passes through the optical beams of an AWC system, and any offset between such an edge ring center point and, for example, a reference location used by the AWC system as the "ideal" center placement for a wafer or edge ring. In implementations in which an AWC system is used in conjunction with edge ring placement, there may be more edge/optical beam intersections than with a semiconductor wafer due to the edge ring having both an inner edge and an outer edge (thus, there may be four edge/optical beam intersections detected by each optical sensor as the edge ring passes through the AWC optical sensors instead of just two, as is the case when a semiconductor wafer is passed through the optical beam sensors). In such implementations, the data resulting from some of the edge/optical beam intersections, e.g., the intersections of the optical beams with the outer edge of the edge ring, may be ignored, and the center of the edge ring may be determined based on the remaining edge/optical beam intersections, e.g., the intersections of the optical beams with the inner edge of the edge ring. The reference point used by the AWC system to evaluate the degree to which an edge ring deviates from a desired placement on a wafer-handling robot end effector may, in some implementations, be the same reference point that may be used for semiconductor wafer AWC correction, i.e., a reference point determined based on measurements obtained from a semiconductor wafer using the AWC system. In other implementations, the reference point used for edge ring AWC correction may be obtained based on measurements obtained from an edge ring using the AWC system, e.g., the AWC system may be trained with an edge ring in order to obtain a reference point for future edge ring placements. It will be understood that the placement techniques discussed herein, as well as the AWC training and correction techniques discussed herein, may generally be applicable in the context of both semiconductor wafer placement operations and edge ring placement operations.

AWC systems are widely used in the semiconductor processing industry and have typically provided good wafer-centering performance. However, the training process is labor-intensive, may occupy a significant period of time, and is prone to user error. While such training may occur as part of initial semiconductor processing tool set-up, such training may need to be repeated periodically over the lifetime of the tool, e.g., when any modifications to the relative locations of the semiconductor processing chamber, AWC sensor, and the wafer-handling robot have occurred, or if wafer processing operations begin to exhibit non-uniformities indicating that the placement of semiconductor wafers on the pedestal has drifted off-center, or generally if any maintenance is performed on the chamber, including a wet clean. It will be understood that references to placing wafers or edge rings onto wafer supports, pedestals, or other equipment by a wafer-handling robot may also, in various implementations, implicitly include indirect placement of the wafer or edge ring onto the wafer support. For example, in many semiconductor processing machines, vertically-translating lift pins positioned in the wafer support may be used to lift wafers off of a wafer-handling robot end effector, allowing the end effector to then be moved out from underneath the wafer without moving the wafer. The lift pins may then be controlled to lower the wafer onto the wafer support. The same process may be repeated in reverse to remove a wafer or other structure from a wafer support. The term "wafer support," as used herein, may refer to any of a variety of structures that are configured to support a semiconductor wafer within a semiconductor processing tool (other than the end effector of a wafer-handling robot). Wafer supports may include, for example, pedestals, ESCs, or other generally circular platform-like structures that may be located within semiconductor processing chambers (or other chambers) and that generally contact a semiconductor wafer in a distributed manner, e.g., through face-to-face contact between the back side of the semiconductor wafer and the top face of the wafer support, as well as structures that may support the semiconductor wafer through more restrictive contact, e.g., arcuate support ledges that may only contact the semiconductor wafer at points along the semiconductor wafer's outer circumference. Wafer supports may include not only components that directly contact the semiconductor wafer, but may also include components or portions that extend beyond the outer circumference of the semiconductor wafer, e.g., an annular portion of a pedestal or ESC that may extend beyond the outer circumference of a semiconductor wafer. Wafer supports may, in some instances, be equipped to provide for movement of the semiconductor wafers supported thereby, e.g., vertical movement and/or rotational movement. Wafer supports may also, in some instances, include lift pins, such as those discussed above, or other mechanisms that may be caused to extend upwards relative to the remainder of such wafer supports, thereby lifting semiconductor wafers off of the remainder of the wafer supports. In some instances, a wafer support may include various removable components, such as edge rings. For example, some wafer supports may be configured to be used with a removable edge ring, e.g., an edge ring that is designed to be able to be removed by a wafer-handling robot of a semiconductor processing tool, that may interface with one or more non-removable edge rings, e.g., edge rings that are not designed to be able to be removed by a wafer-handling robot of a semiconductor processing tool—such non-removable edge rings may, of course, still be removed by a technician, that are, for the purposes of this disclosure, considered to be part of the wafer support.

The present disclosure contemplates an autocalibration system, e.g., an adaptive positioning system, that may be used in conjunction with an AWC system (or similar apparatus) and/or wafer-handling robot in order to, among other things, provide for automated teaching of the AWC system and/or the wafer-handling robot for a semiconductor processing tool; such a system may be used for automated teaching of a wafer-handling robot either under vacuum or atmospheric pressure, as the chambers within which the teaching occurs may be sealed as they would be during normal semiconductor processing operations. Such an autocalibration system may also allow for various aspects of component or wafer placement to be evaluated and/or corrected, as needed, in order to comply with process requirements. The autocalibration system may also be used to guide the placement of edge rings, which are nominally annular structures that have an inner diameter that is typically sized just slightly larger (or smaller, in some cases) than the outer diameter of a semiconductor processing wafer, thereby effectively "extending" the diameter of the semiconductor wafer during processing. Edge rings have the effect of causing any "edge effects" that might degrade on-wafer process result uniformity to occur on the outer edge of the edge ring (where wafer uniformity is largely unaffected) rather than on the semiconductor wafer itself.

Central to the autocalibration system is an autocalibration wafer, which may also be referred to as an adaptive positioning system (APS) wafer, that may collect a large amount of information from a variety of on-board sensors; this allows the autocalibration wafer to be used as part of an entirely automated teaching process. Such an autocalibration wafer may be used, for example, to perform diagnostic evaluations of components in a semiconductor processing tool, as well as to obtain information that allows the operation of the semiconductor processing tool to be adjusted to enhance wafer processing performance.

Generally speaking, the autocalibration wafer for a particular semiconductor processing tool may have a size and shape similar to that of a wafer and/or edge ring that the semiconductor processing tool is configured to process, thereby allowing the autocalibration wafer to be transported by a wafer-handling robot of the semiconductor processing tool in generally the same manner as the wafer-handling robot transports semiconductor wafers during processing. Thus, the autocalibration wafer may be sized so as to have a maximum height and diameter that are less than the smallest vertical and horizontal clearances of passages of the semiconductor processing tool through which wafers may be transported by the wafer-handling robot.

As noted above, the autocalibration wafer may include a variety of sensors—although the number and type of sensors may vary depending on the particular functionalities provided by the autocalibration wafer. It will be understood that an autocalibration wafer in accord with this disclosure may be configured to provide any one of, some, or all of the sensors/functionalities discussed herein.

In addition to the various sensors that the autocalibration wafer may include, the autocalibration wafer may also include various components for controlling and obtaining data from those sensors, communicating with other components (such as a controller of a semiconductor processing tool), and/or storing and/or manipulating the data collected from the sensors. Such autocalibration wafers may thus be linked to a controller of a semiconductor processing tool, introduced into the semiconductor processing tool, and then, through actions caused by one or both of a controller (or controllers) of the autocalibration wafer and the controller (or controllers) of the semiconductor processing tool, caused to perform various sensing and data collection operations during various phases of a calibration routine or placement routine performed by the semiconductor processing tool. As will be apparent from the examples discussed in more detail below, such a calibration routine or placement routine may be performed by the semiconductor processing tool with little or no human oversight.

Generally speaking, the autocalibration wafer may have a substrate with an overall shape similar to that of a semiconductor wafer, e.g., a generally circular shape, although it will be recognized that the autocalibration wafer may, in some instances, be shaped differently—for example, portions of the substrate that are not used to support sensors or other components, or that do not come into contact with, for example, contact pads on an end effector or lift pins of a pedestal, may be omitted, which may result in openings or notches in the autocalibration wafer. Moreover, in some implementations, the autocalibration wafer may have peninsulas or other protrusions along an otherwise nominally circular exterior edge, e.g., to support a sensor at a location that is beyond the nominal outer diameter of the corresponding semiconductor wafer. The autocalibration wafer may also include one or more indexing features, e.g., a flat edge, a notch, etc., along an exterior boundary to provide a mechanism for identifying the orientation of the autocalibration wafer. Reference may be made herein to the "center" of the autocalibration wafer, which will be understood to refer to a point of the autocalibration wafer that is intended to be positioned in the same position as the center of a semiconductor wafer or edge ring is positioned when the autocalibration wafer is transported or positioned within the semiconductor processing tool in a similar manner to how the semiconductor wafer or the edge ring are typically transported or positioned. It will be understood that while the center of the autocalibration wafer may coincide with a geometric center of the substrate and/or a center of mass of the autocalibration wafer, such alignment is not a necessary condition.

In most implementations, the autocalibration wafer may have a plurality of downward-facing imaging sensors, e.g., charge-coupled device (CCD) sensors or complementary metal oxide semiconductor (CMOS) sensors, located at various positions at radial offsets from the center of the autocalibration wafer. Such offsets may be selected such that when the autocalibration wafer is, for example, positioned above a semiconductor wafer placed on a wafer support of the semiconductor processing tool, each imaging sensor has a field of view that is wide enough to capture a portion of the edge of semiconductor wafer, as well as a portion of the wafer support. If the semiconductor processing tool typically uses an edge ring during wafer processing operations, then the imaging sensors may be radially offset from the center of the autocalibration wafer such that the imaging sensor field of view is wide enough to capture a portion of the edge ring (when placed on the wafer support) as well. In some implementations of an autocalibration wafer, the downward-facing imaging sensors may be placed along a circle that has a diameter of nominally the same size, e.g., within ±10% or ±20% of, as the semiconductor wafers that the semiconductor processing tool is configured to process. In yet other implementations, the downward-facing imaging sensors may be placed along a circle that has a diameter in between that of the semiconductor wafers that the semiconductor processing tool is configured to process and an edge ring that the semiconductor processing tool is configured to use. In some such implementations, the downward-facing imaging sensors may be positioned along a diameter that is the average, or within, for example, ±10% of the average, of the nominal outer diameter of the edge ring and the nominal inner diameter of the edge ring or the nominal outer diameter of the semiconductor wafer. Such positioning may, for example, cause the downward-facing imaging sensors to be able to simultaneously capture the outer edge of a wafer support (or an edge of a feature on the wafer support, e.g., an ESC), the outer and/or inner edges of the edge ring, and the outer edge of the semiconductor wafer within their fields of view when the autocalibration wafer is generally positioned at a location centered above the wafer support (and when the semiconductor wafer and/or edge ring are centered on the wafer support).

Such imaging sensor placement allows the autocalibration wafer to simultaneously obtain images of various fiducials associated with a wafer support and a semiconductor wafer and/or an edge ring placed on that wafer support. Fiducials, as the term is used herein, refer to features that are assumed as being generally fixed in respect to particular structures, e.g., a circular edge of a component may serve as a fiducial of the center point of that structure (it will be understood that such fiducials may, over time, undergo changes in size and/or shape due, for example, to erosion or deposition occurring due to wafer processing operations; such gradual changes in shape and/or size should not be considered to change the "fixed" nature of such fiducials in the context of this disclosure. In the examples discussed herein, the fiducials used are features such as the outer edge of a semiconductor wafer, outer and/or inner edges of an edge ring, the outer edge of a wafer support or an edge of a feature of the wafer support, a surface discontinuity in a wafer support (for example, a wafer support's upper surface may have a circular boss surrounded by an annular surface that is recessed downward from the circular boss; the transition between the circular boss and the annular surface may be such a surface discontinuity), or any other feature that is suitable for the techniques discussed herein.

The images obtained of a given set of fiducials for a semiconductor wafer, edge ring, or other structure may then be analyzed to determine an offset (or offsets) between reference points on two structures associated with those fiducials. For example, if the fiducials used are the outer circular edge of a semiconductor wafer and an inner circular edge of an edge ring encircling the semiconductor wafer, then the relative sizes of the radial gaps between the outer edge of the semiconductor wafer and the inner edge of the edge ring in each image may be determined and used to generate an estimate of the degree to which the center of the semiconductor wafer is offset from the center of the edge ring. Generally speaking, images from at least three imaging sensors must be used to make such a determination (similar techniques may be practiced with images from only two imaging sensors, but will generally not be as accurate, as assumptions must be made as to the relative sizes of the fiducials used). In some instances, some fiducials may not be visible at all times, in which case intermediate fiducials may be needed. For example, if a semiconductor wafer is to be centered on an ESC that has a smaller outer diameter than the diameter of the wafer and the ESC outer edge is to serve as the fiducial for such wafer placement, it will not be possible to obtain images from imaging sensors of an autocalibration wafer in which the outer edge of the ESC and the outer edge of the semiconductor wafer are simultaneously visible—any radial gaps that exist between such edges will therefore not be able to be identified, and the centeredness of the semiconductor wafer on the ESC cannot be directly determined. In such cases, estimates of the centeredness of the semiconductor wafer on the ESC may still be determined using an intermediate fiducial, e.g., the inner edge of an edge ring. For example, if the edge ring is placed on the wafer support such that it encircles the ESC, an autocalibration wafer may be used to determine the radial gaps between the inner edge of the edge ring and the outer edge of the ESC. The center-to-center offset of the inner edge of the edge ring and the ESC outer edge may then be determined based on the radial gaps and the edge ring re-positioned, if needed, until the edge ring is centered to an acceptable degree on the ESC. The inner edge of the edge ring may, after the edge ring is centered, serve as a "proxy" for the outer edge of the ESC; when the semiconductor wafer is subsequently placed on the wafer support and within the edge ring, the autocalibration wafer imaging sensors may be used to obtain images of the radial gaps between the outer edge of the semiconductor wafer and the inner edge of the edge ring. The center-to-center offset between the semiconductor wafer outer edge and the edge ring inner edge may, since the edge ring inner edge is centered on the ESC outer edge, serve as a proxy of the center-to-center offset between the semiconductor wafer outer edge and the ESC outer edge. In such cases, there may be further refinement of the center-to-center offset between the semiconductor wafer outer edge and the edge ring inner edge based on the actual measured center-to-center offsets between the semiconductor wafer outer edge and the edge ring inner edge and between the edge ring inner edge and the outer edge of the ESC. For example, if the edge ring is ultimately positioned such that the center of the inner edge of the edge ring has an XY offset from the center of the outer edge of the ESC of (15 m, 10 µm), which may be considered to be within an acceptable centeredness range, and the semiconductor wafer is then placed such that the center of the outer edge of the semiconductor wafer has an XY offset (in the same coordinate system) from the center of the inner edge of the edge ring of (−5 µm, 12 µm), then the XY offset between the center of the semiconductor wafer and the center of the outer edge of the ESC may be determined by summing these two offset pairs, e.g., (15 µm−5 µm, 10 µm+12 µm)=(10 m, 22 µm), e.g., ~24 µm total offset.

Once fiducials for two structures have been imaged by the autocalibration wafer and an offset between the two structures determined, the offset can be compared against a threshold offset, which may represent the maximum offset between those structures that is considered acceptable for proper operation of the semiconductor processing tool. If the offset exceeds the threshold offset, then the semiconductor processing tool may cause corrective action to be taken.

While various techniques may be used to determine a center-to-center offset between two structures and are considered within the scope of this disclosure, an example technique for determining such an offset is provided in the context of FIG. 1. FIG. 1 depicts an example of a calibration wafer placed relative to an edge ring. In FIG. 1, an edge ring 162 is shown with a calibration wafer 160 placed within the inner diameter of the edge ring 162. For clarity, the term calibration wafer or reference wafer is used herein to refer to a wafer that is sized identically or similarly to a typical semiconductor wafer processed by the semiconductor processing tool—calibration wafers are intended to serve as stand-ins for such normal wafers, e.g., such as may be processed by a semiconductor processing tool. Calibration or reference wafers may, in some instances, include calibration markers or other features that may be recognized by machine vision algorithms to aid in centering and calibration operations. Autocalibration wafers, as used herein, refers to wafers that are "smart" or otherwise equipped with sensors and other electronics that enable such autocalibration wafers to obtain data and measure various parameters relating to semiconductor processing tool performance.

The calibration wafer 160 and edge ring 162 are not shown to scale in FIG. 1 to make it easier to see, for example, the misalignment between the centers (shown with crosshairs) of the edge ring 162 and the calibration wafer 160 and the gaps in between the outer edge of the calibration wafer 160 and the inner edge of the edge ring 162. The calibration wafer 160 may include a set of calibration markers 170, which may be positioned along the outer circumference of the calibration wafer and may be spaced apart by some known amount, e.g., 120° apart in this example. The downward-facing first imaging sensors of an autocalibration wafer may be caused to be positioned such that the calibration markers 170 and the gaps 164 between the edge ring 162 and the calibration wafer 160 are within the fields of view 128 of the first imaging sensors.

In such a technique, certain assumptions may be made regarding various factors—for example, the diameter of the calibration wafer may be assumed to be a known quantity, e.g., 300 mm. Thus, the radius $r_w$ from the center point of the calibration wafer 160 to the edge of the calibration wafer 160 may be assumed to be constant (there may be some portions along the edge of the calibration wafer where the radius may be shorter, e.g., if there is an indexing flat or notch along the edge, but the calibration wafer may have a constant radius in the fields of view of the first imaging sensors). As noted above, the calibration wafer may also, for example, have calibration markers 170, the location of which may be known to high certainty. In this example, the calibration markers 170 are known to be spaced apart by 120° about the circumference of the calibration wafer. The calibration markers may include, for example, features such as radial lines (which may be identified in the image data and used to establish a directional vector in each image along which the gap 164 is evaluated) and squares (as shown) or circles that may be of a known size, e.g., 2 mm, that may be used to determine the scale of the imaged features. For example, if a gap 164 is identified in an image and has a size that is 0.23 times the size of an edge of a 2 mm calibration marker square in the same image, then the size of the gap may be determined to be 0.23*2 mm=0.46 mm. In some implementations, such calculations may take into account, e.g., using machine vision or optical image correction techniques, the distortion of the images due to lens effects (e.g., using for example a checker board pattern) and may correct for such distortion using, for example calibration data associated with the autocalibration wafer.

It will be understood that the calibration markers discussed above may, in some implementations, be omitted, and fiducials such as the circular edges of various components may be used instead to determine center locations of such components.

If one assumes that the center of the calibration wafer 160 also serves as the origin of a coordinate system in which the center-to-center offset between the edge ring 162 and the calibration wafer 160 is to be determined, solving for the center location of the edge ring may be done by determining the location of three points along the inner (or outer) edge of the edge ring 162 and then determining the center location of a circle defined by those three points. Once the center location of the edge ring 162 in the coordinate system of the calibration wafer is known, then it is a simple process to extract the center-to-center offset between those two components.

The gaps 164, in conjunction with the radius $r_w$ of the calibration wafer 160 and the angle along which each gap 164 was measured, may be used to determine the locations of three points along the inner edge of the edge ring 162. For example, for the gap 164 $\delta_1$, the gap $\delta_1$ may be added to the radius $r_w$ to obtain a radial distance from the calibration wafer origin/center to the inner edge of the edge ring 162. An XY coordinate pair for the point where the gap terminates at the inner edge of the edge ring may be determined using trigonometric relations based on the angular position of the radius extending from the center of the calibration wafer to the point where the gap terminates at the inner edge of the edge ring 162. In this example, the angular position of this radius is 0 degrees. Thus, the XY coordinates for such a point may be determined according to:

$$X = (r_w + \delta_x) \cdot \sin(\theta)$$

$$Y = (r_2 + \delta_x) \cdot \cos(\theta)$$

where $\delta_x$ is the relevant gap distance, $r_w$ is the calibration wafer radius, and θ=angle between radius extending from the calibration wafer origin to the gap and polar axis extending from the origin.

Thus, for example, if $r_w$=150 mm, $\delta_1$=17.338 mm, $\delta_2$=22.823 mm, and $\delta_3$=37.69 mm, then:

| Gap | δ | $r_w$ | θ | X | Y |
|---|---|---|---|---|---|
| 1 | 17.338 mm | 150 mm | 0° | 0 mm | 167.34 mm |
| 2 | 22.823 mm | 150 mm | 120° | 149.67 mm | −86.41 mm |
| 3 | 37.69 mm | 150 mm | 240° | −162.5 mm | −93.85 mm |

It will be understood that the dimensions provided above are scaled based on the proportions of FIG. 1, and that such values for δ are unrealistically large for a typical semiconductor processing tool and wafer-handling robot. In actual practice, the δ values that may be obtained may frequently be on the order of less than 1 mm, e.g., less than 800 μm.

Once three pairs of XY coordinates are known for locations along the inner edge of the edge ring, a determination may be made as to the location of the center of the edge ring 162 relative to the coordinate system origin (the center of the calibration wafer) using the following equations:

$$x_c = \frac{(y_2 - y_3)(x_1^2 + y_1^2) + (y_3 - y_1)(x_2^2 + y_2^2) + (y_1 - y_2)(x_3^2 + y_3^2)}{2 \cdot [x_1(y_2 - y_3) - y_1(x_2 - x_3) + x_2 y_3 - x_3 y_2]}$$

$$y_c = \frac{(x_3 - x_2)(x_1^2 + y_1^2) + (x_3 - x_1)(x_2^2 + y_2^2) + (x_2 - x_1)(x_3^2 + y_3^2)}{2 \cdot [x_1(y_2 - y_3) - y_1(x_2 - x_3) + x_2 y_3 - x_3 y_2]}$$

where ($x_1$, $y_1$), ($x_2$, $y_2$), and ($x_3$, $y_3$) are each coordinate pairs, and ($x_c$, $y_c$) is the coordinate pair of the center of the edge ring. Thus, in the present example, ($x_c$, $y_c$)=(−8.378 mm, −8.618 mm) After establishing the center offset between the edge ring and calibration wafer, appropriate actions may be taken to reduce the center offset between these two components. For example, in the present scenario, the edge ring could be retrieved by the wafer-handling robot and then moved by the reverse of the offset, e.g., (+8.378 mm, +8.618 mm), in order to center the edge ring on the calibration wafer. Alternatively, the calibration wafer may be moved by the offset (−8.378 mm, −8.618 mm) to center the calibration wafer on the edge ring. If the autocalibration wafer coordinate system is not aligned with the coordinate system used by the wafer-handling robot, the center-to-center offsets obtained using the autocalibration wafer may be transformed into equivalent offsets in the coordinate system used by the wafer-handling robot prior to using the wafer-handling robot to correct the placement of, for example, the edge ring. Once the calibration wafer is acceptably centered, the calibration wafer may then be used to train the AWC of the semiconductor processing tool. Various techniques involving the use of an autocalibration wafer for enhancing centering operations in a semiconductor processing tool are discussed in more detail further below, but are prefaced by an overall description of various features of autocalibration wafers.

Figure 2:
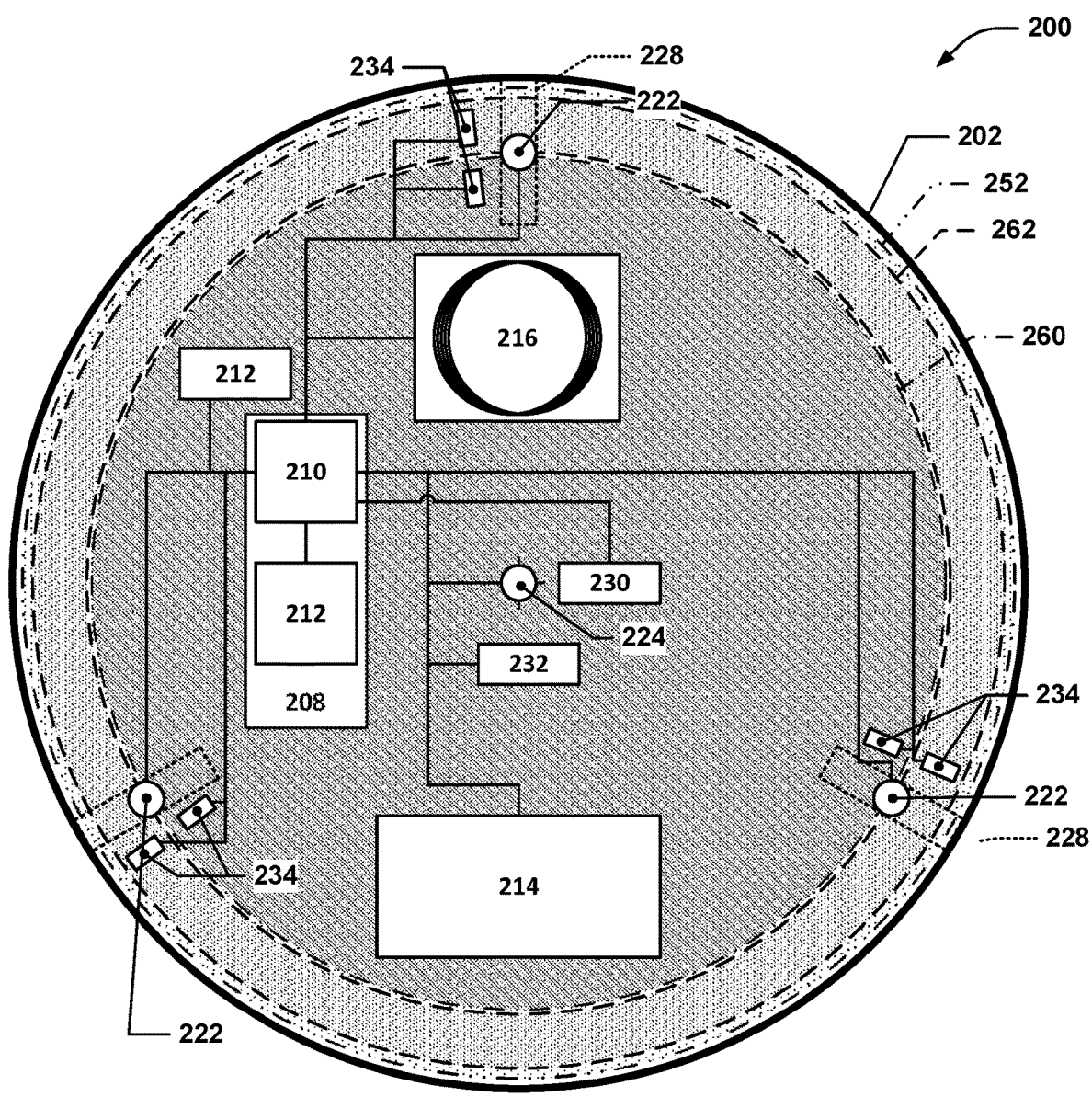
FIG. 2 depicts a schematic of an example autocalibration wafer.

FIG. 2 depicts a schematic of an example autocalibration wafer with broken lines/shaded regions showing a wafer support, edge ring, and calibration wafer positioned thereebeneath. In FIG. 2, an autocalibration wafer 200 is shown that includes a substrate 202 to which a plurality of different sensors and other electrical components are mounted. Also shown in FIG. 2, although not part of the autocalibration wafer 200, are a calibration wafer 260, an annular edge ring 262, and a wafer support 252; these additional components are shown arranged concentrically with the autocalibration wafer 200, as would be the case during some stages of normal use if the calibration wafer 260, the edge ring 262, the wafer support 252, and the autocalibration wafer 200 are all centered with respect to one another. In the depicted example, the autocalibration wafer 200 is shown as being larger in diameter than the wafer support 252, the edge ring 262, and the calibration wafer 260—in actual practice, the autocalibration wafer 200 may be similar in size to the calibration wafer 260. As noted earlier, the wafer support 252 may include multiple components, e.g., an ESC that may be slightly smaller in diameter than the calibration wafer 260, as well as a support structure that extends beyond the ESC and supports the edge ring 262. For simplicity, such separate structures are not shown in FIG. 2.

The sensors shown as being part of the example autocalibration wafer of FIG. 2 may include, for example, a plurality of first imaging sensors 222, which may, for example, be CCDs or CMOS devices. The first imaging sensors 222 may be configured with optics or other focusing systems and arranged to provide a downward-looking field of view. As shown in FIG. 2, the fields of view 228 of the first imaging sensors 222 are shown as being elongate rectangular areas that span across the outer edge of the calibration wafer 260, the inner and outer edges of the edge ring 262, and the outer edge of the wafer support 252 when the autocalibration wafer 200 is positioned at a predefined height or range of heights above the calibration wafer 260, edge ring 262, and wafer support 252 (for example, at the height that the end effector of a wafer-handling robot would normally be at when delivering wafers to the wafer support 252). The field of view 228 of each first imaging sensor 222 may be any of a variety of shapes, e.g., circular or elliptical, as well, and may also extend radially outward to a lesser degree than shown. For example, in some implementations, the fields of view 228 of the first imaging sensors 222 may only extend out far enough to capture the inner edge of the edge ring 262 but not the outer edge of the edge ring 262. By positioning the first imaging sensors 222 such that the first imaging sensors 222 are located generally directly over the outer edge of the calibration wafer 260 and the inner edge of the edge ring 262, if used, the first imaging sensors 222 may be positioned to obtain image data that may more accurately reflect the size of any gaps that may exist between various fiducials in the images, such as the edges of such components. In particular, such imaging sensor placement may reduce the effect that height mismatches may have on gap size determination, leading to more accurate gap size estimation. For example, if an imaging sensor obtains image data of a gap along a line of sight that is at a very shallow angle with reference to the autocalibration wafer, e.g., as may be the case with an imaging sensor that is mounted near the center of the autocalibration wafer, then any slight variance in height in either the edge ring or the calibration wafer may be magnified and cause the gap size to fluctuate in an unpredictable manner. Locating the imaging sensors near the periphery of the autocalibration wafer may act to significantly reduce the impact such effects may have.

In addition to the first imaging sensors 222, the autocalibration wafer 200 may, in some instances, include further imaging sensors, such as centrally-located, downward-facing second imaging sensor 224, which may be configured to obtain images directly below the center of the autocalibration wafer. Such an imaging sensor may be used in calibration routines in which the fiducial to be imaged is located near where the center of a semiconductor wafer is typically placed, e.g., a wafer support for receiving a wafer may have cross-hair fiducial marks located at the center of the wafer support that may be imaged by the second imaging sensor in order to assist in locating the center of the wafer support relative to the autocalibration wafer. For example, the wafer support may have a fiducial in the middle that may be imaged by the second imaging sensor 224 when the autocalibration wafer 200 is positioned over the wafer support by an end effector of a wafer-handling robot in order to facilitate teaching the wafer-handling robot the location of the wafer support. Such a sensor may also be used to center the autocalibration wafer on the end effector of the wafer-handling robot as well. For example, the end effector of a wafer-handling robot may include a fiducial that is generally positioned in a location that is observable by the second imaging sensor 224 when the autocalibration wafer 200 is generally centered over the end effector. When the wafer-handling robot is actuated to retrieve the autocalibration wafer, the end effector may be moved underneath the autocalibration wafer such that the fiducial is within the field of view of the second imaging sensor 224. The second imaging sensor 224 may then be caused to obtain images of the fiducial, which may be analyzed to determine how far off-center the fiducial is with respect to the center of the autocalibration wafer 200. The wafer-handling robot may then be caused to reposition the end effector such that the off-centeredness of the fiducial with respect to the autocalibration wafer 200 is reduced to an acceptable limit. It will be understood that other implementations of the autocalibration wafer 200 discussed herein may use sensors other than imaging sensors to obtain radial gap data and/or centeredness data. For example, ultrasonic sensors may be used to obtain a contour map that may show three-dimensional fiducials and the above-referenced distances and gaps may be determined from those contour maps in a manner similar to how such distances and gaps may be determined from imaging data. It will thus be understood that any sensor that is able to be used to evaluate the gaps between fiducials discussed above and/or the centeredness of the autocalibration wafer 200 relative to the wafer support may be used in place of the above-discussed imaging sensors.

Some implementations of the autocalibration wafer 200 may also include a variety of non-imaging sensors, such as one or more vibration sensors 230, an orientation/tilt sensor or sensors 232, and/or one or more proximity sensors 234.

The vibration sensors 230 may be used to monitor vibrations experienced by the autocalibration wafer during various operations, e.g., during wafer-handling robot operation or during lift pin retraction or extension. For example, in some wafer stations, the wafer support may be a pedestal or similar structure and may include a plurality, e.g., three, lift pins, which are thin pins that may be caused to vertically translate relative to an electrostatic chuck (ESC) or other wafer-supporting structure. Such lift pins are typically arranged in an equilateral triangle within the circular boundary defined by a semiconductor wafer that is centered on the wafer support. Thus, when the lift pins are in an extended position relative to the surface of the wafer support, the lift pins will support whatever wafer is present at that wafer station. When the lift pins are caused to retract into the wafer support, the wafer supported thereby is brought into contact with the upper surface of the wafer support. During such lift pin retraction, the wafer may experience small vibrations, e.g., caused by equipment wear and tear. The vibration sensor or sensors may be used to evaluate the nature of such vibration and provide an indication of the state of health of the lift pin mechanism. Vibration sensors may, for example, include accelerometers, piezoelectric vibration sensors, optical distance measurement sensors or optical microphones (such sensors may, for example, detect vibration by measuring displacements of the substrate of the autocalibration wafer relative to the wafer support, thereby providing insight as to the level of vibration experienced thereby), and other types of sensors.

The orientation/tilt sensor or sensors 232 may be used to evaluate whether a wafer support or other components are supporting the autocalibration wafer (and thus other wafers) in a level manner. For example, if one of the lift pins for a wafer support has become shorter or longer than the other lift pins, then wafers supported thereby will exhibit a slight degree of tilting. Such tilting may cause one side of the wafer to contact the wafer support before the other sides of the wafer, which may cause slight variations in how the wafer is placed on the wafer support and may cause sliding movement between some of the lift pins and the wafer during placement on the wafer support in some circumstances (which may damage the wafer and/or produce particulate contamination). Additionally, the levelness of the wafer support itself may be evaluated using such a sensor after the autocalibration wafer is placed thereupon. Thus, levelness of both wafer supports and other equipment may be evaluated using an autocalibration wafer with an orientation sensor. Orientation sensors may, for example, include accelerometers and tilt sensors or inclinometers.

Figure 3:
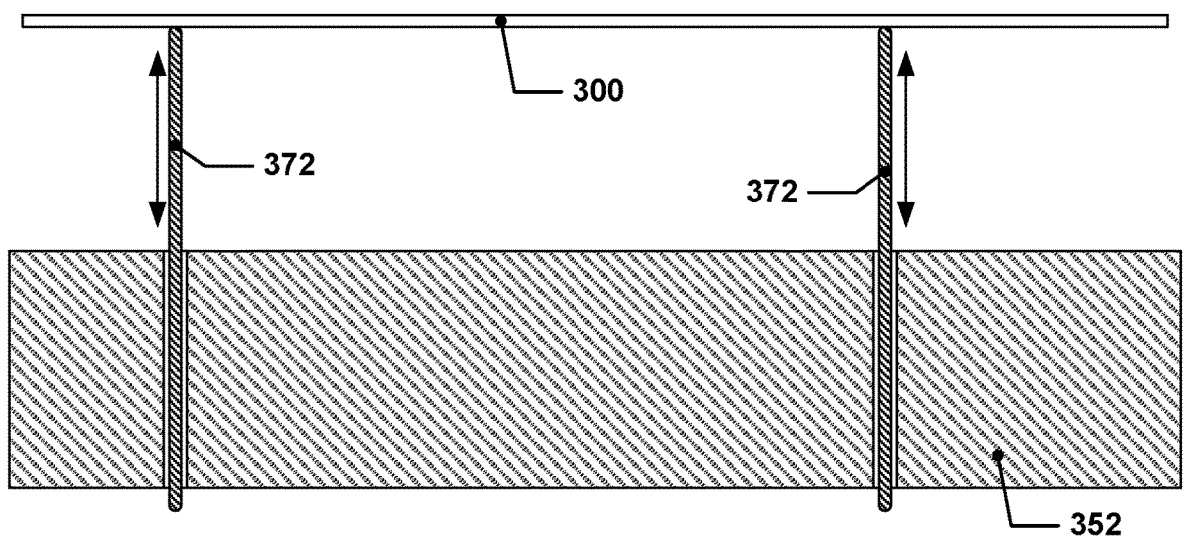
FIG. 3 depicts a diagram of a wafer support with lift pins.

FIG. 3 depicts a diagram of a wafer support 352 with extended lift pins 372, which are shown as supporting an autocalibration wafer 300. The lift pins 372 may be retracted downward (and/or the wafer support 352 translated upward) to cause the autocalibration wafer 300 to be placed on the wafer support 352.

The proximity sensor or sensors 234 may be used to evaluate the height of various structures at a wafer station. For example, it may be desirable to evaluate the height of an edge ring or a portion of the edge ring above the wafer support, e.g., above an ESC of the wafer support, about its circumference (non-uniform circumferential height of an edge ring may cause process non-uniformities to develop or increase). If proximity sensors are provided in the autocalibration wafer and positioned in locations that permit distance measurement, either directly or indirectly, in between the autocalibration wafer and the edge ring (or other structure), the resulting data may be used to determine how uniform the height of the edge ring or a portion thereof is about its circumference.

In other implementations of autocalibration wafers, the autocalibration wafer may be placed onto the edge ring, allowing it to be supported by the edge ring. In some such implementations, the autocalibration wafer may have a portion or portions that extend beyond the inner diameter of the edge ring and that may rest on the uppermost surface of the edge ring (whereas the semiconductor wafers that are intended to be used with the edge ring would typically be contained entirely within the inner diameter of the edge ring). In other such implementations, however, the autocalibration wafer may be sized with a diameter that is similar to that of the semiconductor wafers with which the edge ring is configured to be used. In some such implementations, the edge ring may have a stepped inner diameter, e.g., the upper surface of the edge ring may have a diameter slightly larger than that of the semiconductor wafers with which the edge ring is to be used, and the bottom surface of the edge ring may have a diameter slightly smaller than that of those semiconductor wafers. The resulting geometry is a recessed annular surface in the edge ring that can be used to support the semiconductor wafer during processing. Thus, an autocalibration wafer supported by such an edge ring may have a small gap between it and the wafer support that supports the autocalibration wafer. The proximity sensors may be used to determine the size of this gap at various locations about the circumference of the autocalibration wafer/edge ring. The resulting measurements may be analyzed to determine the degree of levelness or the thickness variance in the portion of the edge ring between the wafer support and the autocalibration wafer.

Figure 4:
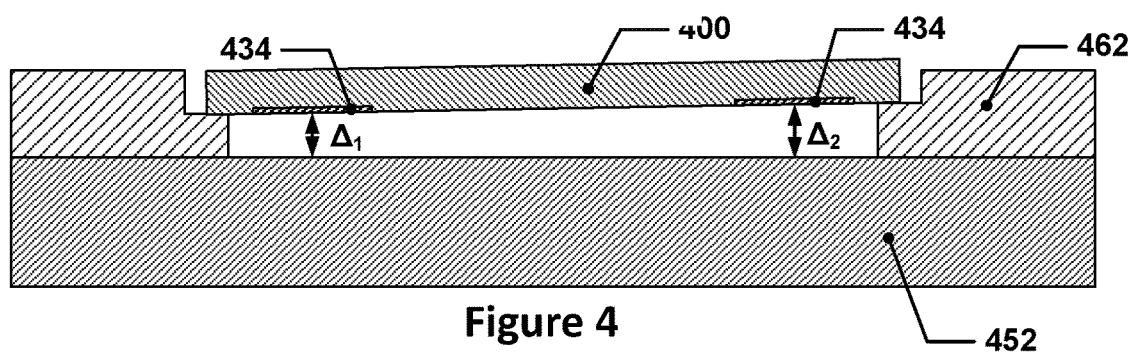
FIG. 4 depicts a diagram of a side view of an autocalibration wafer with a set of proximity sensors that may be used to determine edge ring height.

FIG. 4 depicts a diagram of a side view of an autocalibration wafer with a set of proximity sensors that may be used to determine edge ring height. In FIG. 4, an edge ring 462 is positioned on a wafer support 452. An autocalibration wafer 400 is positioned so as to rest on a circumferential ledge of the edge ring 462 and is thus suspended slightly above the wafer support 452. As can be seen, the edge ring has a height in the ledge area that is non-uniform—the right side of the ledge is higher than the left, leaving the autocalibration wafer 400 at a slight angle with respect to the wafer support 452 and the edge ring 462. Proximity sensors 434 in the autocalibration wafer 400 may be configured to measure the distance between each proximity sensor 434 and the closest facing surface, e.g., the top surface of the wafer support 452. In this case, the left proximity sensor 434 has measured a distance $\Delta_1$ and the right proximity sensor 434 has measured a distance $\Delta_2$. These distances may be evaluated against one or more conditions to determine if edge ring height has exceeded an allowable value. For example, in some implementations, if $|\Delta_1-\Delta_2|>x$ or $\max(\Delta_1, \Delta_2)>y$, then the edge ring may be deemed to have an out-of-limits edge ring height and corrective action may be taken, e.g., requiring installation of a new edge ring.

In some such implementations, two sets of proximity sensors may be provided on an autocalibration wafer—one set that is positioned so as to obtain distance measurements between the autocalibration wafer and an edge ring, and the other set positioned so as to obtain distance measurements between the autocalibration wafer and a structure other than the edge ring, such as a calibration wafer placed in the middle of the edge ring or a surface of the wafer support. In such implementations, the autocalibration wafer may be positioned in a location just above the edge ring, e.g., supported by lift pins or the wafer-handling robot, and the proximity sensors may be used to obtain distance measurements between the autocalibration wafer and the edge ring and the autocalibration wafer and the other structure. In such implementations, the autocalibration wafer may be sized larger than a typical semiconductor wafer (or have portions that protrude beyond the diameter thereof) used in the semiconductor processing tool such that it radially overlaps the edge ring by a sufficient margin to allow some of the proximity sensors mounted thereto to radially overlap with the edge ring and thus determine distances between an upward-facing surface of the edge ring and those proximity sensors. Other proximity sensors may be located on the autocalibration wafer such that they radially overlap with the center opening of the edge ring, allowing those proximity sensors to obtain distance measurements between the autocalibration wafer and, for example, a calibration wafer that is placed in the center of the edge ring or the exposed surface of the wafer support if such a wafer is not present.

By obtaining simultaneous measurements from both sets of proximity sensors and subtracting, for example, the autocalibration wafer/edge ring distances from the corresponding autocalibration wafer/wafer support or autocalibration wafer/calibration wafer distances, estimates of edge ring height at each proximity sensor location may be determined.

Figure 5:
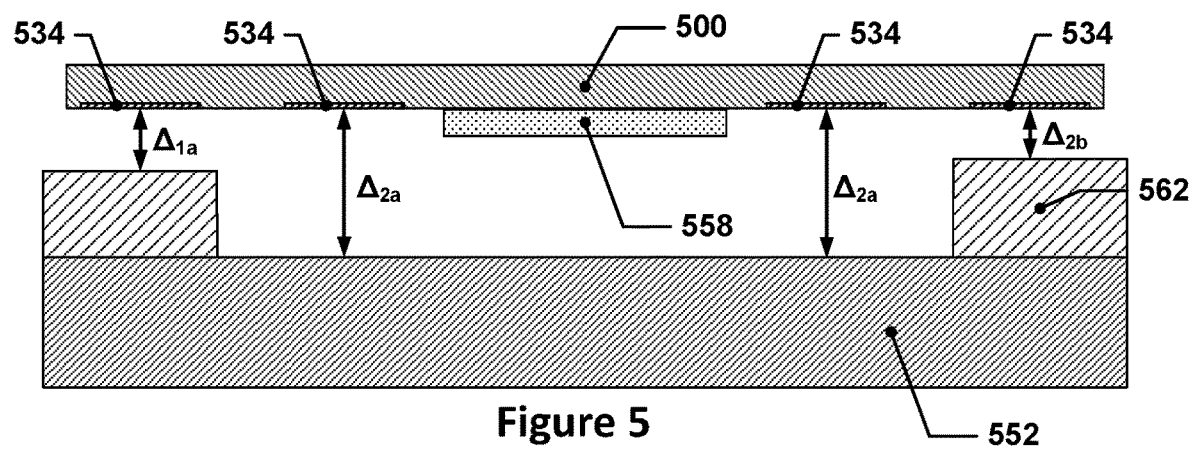
FIG. 5 depicts a diagram of a side view of another autocalibration wafer with two sets of proximity sensors, each set located along a different diameter circular path.

FIG. 5 depicts a diagram of a side view of another autocalibration wafer with two sets of proximity sensors, each set located along a different diameter circular path. In FIG. 5, an autocalibration wafer 500 is supported over a wafer support 552 and edge ring 562 by an end effector 558 of a wafer-handling robot. Outermost proximity sensors 534 are located at radial positions that radially overlap with the edge ring 562 when the autocalibration wafer 500 is nominally centered over the edge ring 562, and innermost proximity sensors 534 are located at radial positions that radially overlap with the interior of the edge ring 562. The proximity sensors 534 may be controlled to simultaneously determined distances between the proximity sensors 534 and the surfaces directly beneath the proximity sensors, e.g., distances $\Delta_{1a}$, $\Delta_{2a}$, $\Delta_{1b}$, and $\Delta_{2b}$, which may be evaluated to determine whether or not the height of the edge ring varies beyond acceptable bounds. For example, if $|\Delta_{2a}-\Delta_{2b}|>x$ or $\max(\Delta_{2a}, \Delta_{2b})>y$, or if $|(\Delta_{1a}-\Delta_{1b})-(\Delta_{2a}-\Delta_{2b})|>x$ or $\max(((\Delta_{1a}-\Delta_{1b}), \Delta_{2a}-\Delta_{2b}))>y$, then the height of the edge ring may be deemed to have exceeded an allowable threshold. In some such implementations, this measurement can be used to create a closed-loop system where edge ring lift pins may be actuated to adjust the edge ring height above the wafer support, e.g., above an ESC, to keep the edge ring height above the wafer support, e.g., ESC, at an optimal value. A similar technique may be used for initial calibration of edge ring lift pins, e.g., to determine at which individual height each edge ring lift pin must be at in order to have the edge ring level with respect to the wafer support. For clarity, it is noted that wafer supports may have multiple sets of lift pins—for example, one set may include lift pins located in locations within the area of a wafer support where a semiconductor wafer is to be placed, and another set may include lift pins located outside of that area, but within a zone of the wafer support occupied by an edge ring. Each set of lift pins may be separately actuated in order to lift or lower a semiconductor wafer or lift and lower an edge ring.

Various types of proximity sensors may be used, including, for example, capacitive distance sensors, inductive distance sensors, optically based distance sensors, and so forth. In some instances, the autocalibration wafer may include one or more other types of sensors as well, e.g., temperature sensors, pressure sensors, humidity sensors, photosensors, etc.

The various sensors included in an autocalibration wafer may be communicatively connected with a first controller 208 that may include one or more first processors 210 and one or more first memories 212. The first controller 208 may also be electrically connected with a power source 214, e.g., a battery, capattery, or other power source. In some implementations, the power source 214 may be operatively connected with a charging feature, e.g., with electrical contact pins that are placed in a location that aligns with charging features located at, for example, a docking station used to store the autocalibration wafer 200 when the autocalibration wafer 200 is placed into the docking station. In the implementation shown in FIG. 2, a wireless charging feature 216 is shown, which may, for example, be an inductive charging coil, such as a Qi-compatible inductive charging coil or other suitable wireless charging interface. In such cases, a docking station used to store the autocalibration wafer 200 may have a similar wireless charging interface configured to charge the autocalibration wafer 200 when the autocalibration wafer 200 is placed therein.

The first controller 208 may also be communicatively connected with a first wireless communications interface, e.g., a WiFi, Bluetooth, or other wireless communications interface, so that commands and/or data may be sent from and/or to the first controller 208, and thus the autocalibration wafer 200. For example, a semiconductor processing tool that interfaces with the autocalibration wafer 200 may include a second controller having one or more second processors and one or more second memories. The second controller may be communicatively connected with a second wireless communications interface that may, in turn, be configured to interface with the first wireless communications interface of the autocalibration wafer. Thus, the autocalibration wafer 200 may be able to wirelessly communicate with the semiconductor processing tool, allowing information, commands, and other data to be transmitted between the autocalibration wafer 200 and the semiconductor processing tool.

Figure 6:
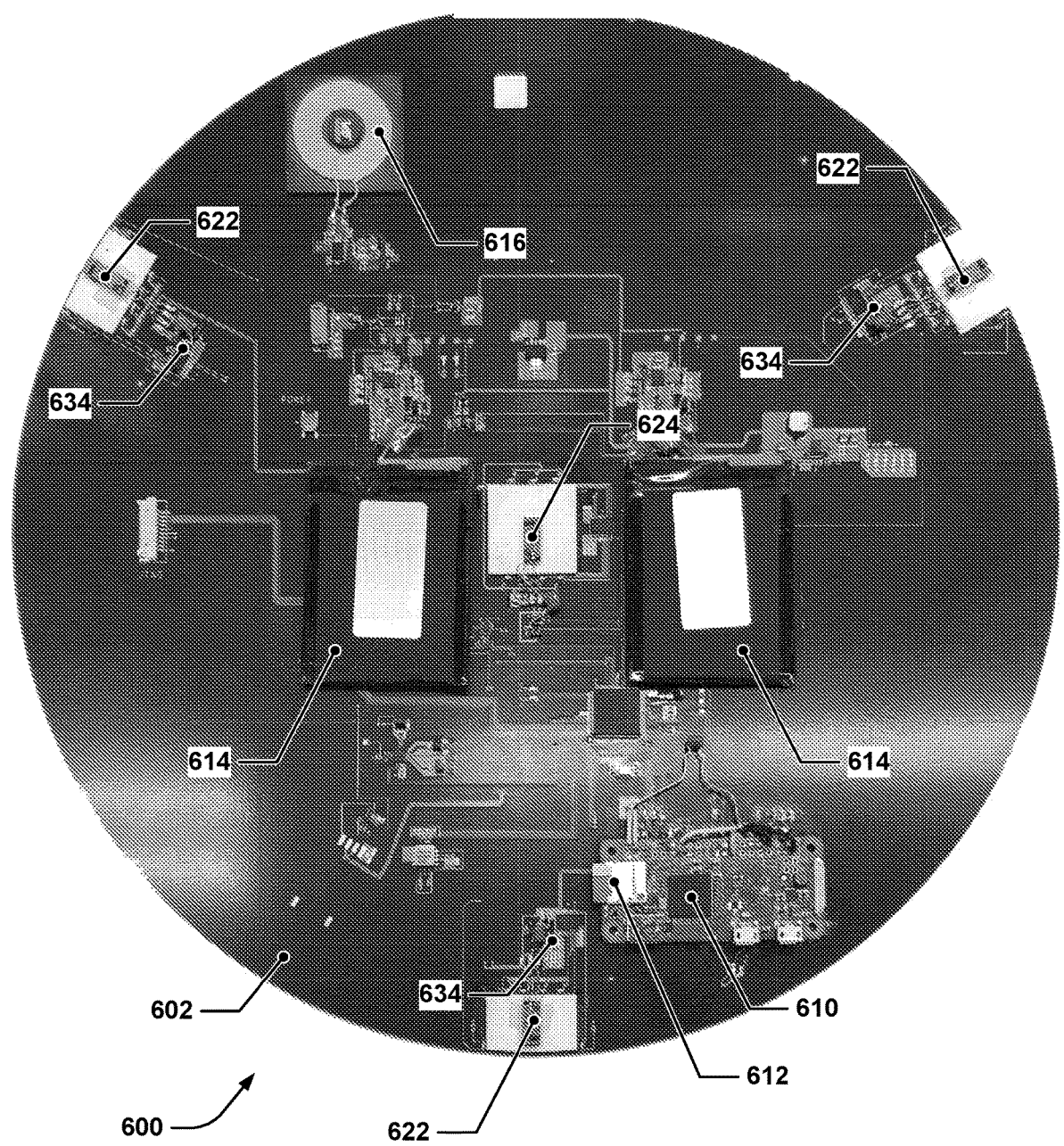
FIG. 6 is a photograph of an example autocalibration wafer.

FIG. 6 is a photograph of an example autocalibration wafer. The autocalibration wafer 600 includes a substrate 602 that has printed circuit traces that provide electrical connectivity between a variety of components, including power sources 614, which are rechargeable batteries in this example, a processor 610, a memory device 612, and wireless charging feature 616, which may be used to inductively transfer power to the rechargeable batteries during wireless charging. Also visible in FIG. 6 are three first imaging sensors 622 mounted at equidistantly spaced locations around the perimeter of the substrate 602, as well as a centrally mounted second imaging sensor 224. Located in the general vicinity of each first imaging sensor 622 is a corresponding proximity sensor 634, which, in this example, are capacitive proximity sensors.

Figure 7:
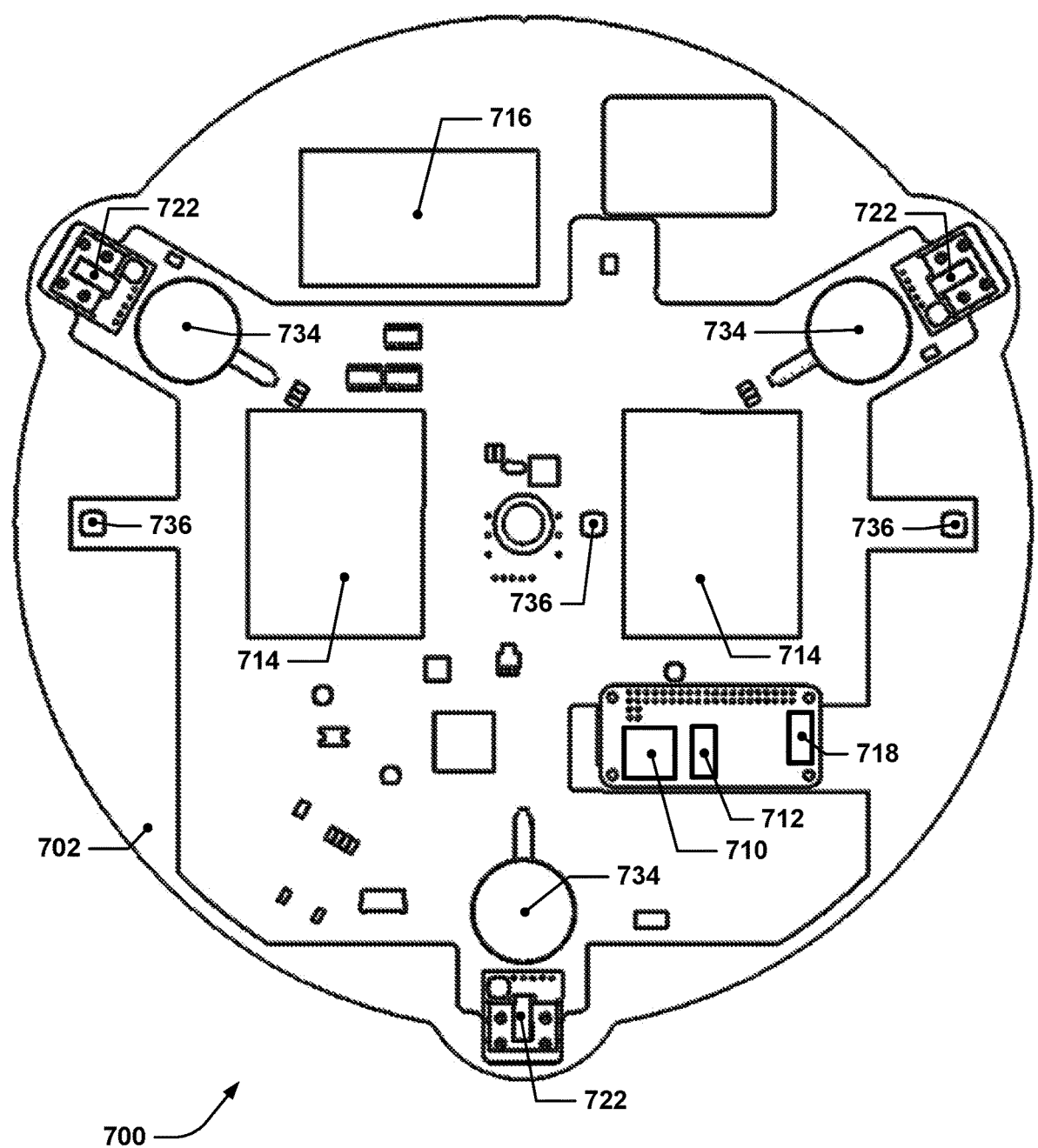
FIG. 7 is a plan view of another example autocalibration wafer.

FIG. 7 depicts a line drawing plan view of another example autocalibration wafer 700. The autocalibration wafer 700, in this example, has a generally circular substrate 702 that has three lobes spaced around the outer circumference, each lobe housing a corresponding first imaging sensor 722. In this example, the substrate 702 generally has a diameter that is the same as a typical semiconductor wafer; the lobes extend beyond this diameter and allow the first imaging sensors 722 to be positioned such that the photosensitive areas of the first imaging sensors 722 may be centered, for example, over the outer edge of a semiconductor wafer placed beneath, and centered under, the autocalibration wafer 700. The autocalibration wafer 700 in this example also includes two power sources 714, e.g., rechargeable batteries, that may be charged using a wireless charging feature 716, e.g., an inductive charging coil. The batteries may provide power to various electrical components of the autocalibration wafer 700, such as processor 710, memory 712, wireless communications interface 718, the first imaging sensors 722, the second imaging sensor 724, proximity sensors 734, and accelerometers 736, which may be used as orientation or tilt sensors.

Figure 8A:
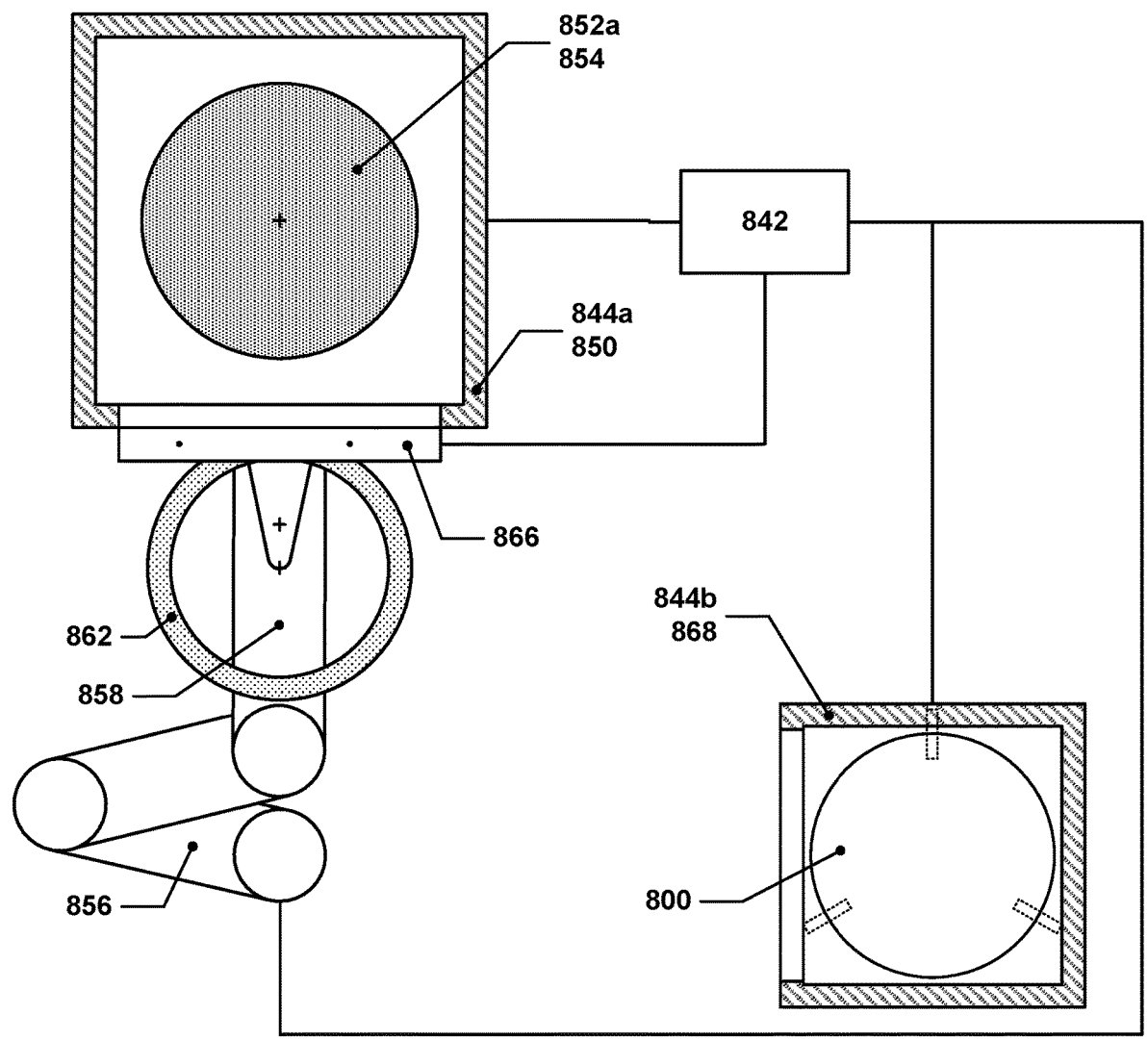
FIGS. 8a through 8i depict a schematic of a semiconductor processing tool during various phases of operation.

FIGS. 8a through 8i depict a schematic of a semiconductor processing tool during various stages of using an autocalibration wafer. In FIG. 8a, a portion of a semiconductor processing tool is shown. The depicted portion of the semiconductor processing tool includes two wafer stations 844a and 844b, although the tool may include further wafer stations as well. Each wafer station corresponds with a location in which one or more wafers may be placed during various operations performed by the semiconductor processing tool. Wafer stations may, for example and without limitation, exist within a process chamber or process chambers of the tool, in buffers used to store wafers before or after processing, in airlocks or loadlocks that allow wafers to be transferred between environments at different pressures, load ports, front-opening unified pods (FOUPs) that may be docked to a load port, etc. In FIG. 8a, the wafer station 844a is provided by a semiconductor processing chamber 850; in contrast, the wafer station 844b is provided by a docking station 868 that is dedicated for storage of an autocalibration wafer 800 (although such a dedicated docking station may not be included in some implementations). The docking station 868 may have features (not shown) for charging the autocalibration wafer 800 or otherwise be configured to interface with various aspects of the autocalibration wafer 800. In some implementations, the docking station, may be located in a vacuum transfer module (VTM) (or be attached thereto) to allow it to be accessed by a wafer-handling robot in the vacuum transfer module, which may then be trained using the autocalibration wafer. In other implementations, the docking station may be located in an equipment front-end module (EFEM) or other atmospheric or near-atmospheric pressure location, in which case the autocalibration wafer may first be retrieved using a wafer-handling robot located in the EFEM and then transferred to another wafer-handling robot located in a VTM.

Each wafer station 844 may have an associated wafer support 852, such as the wafer support 852a/pedestal 854 of wafer station 844a (no wafer support is shown in the wafer station 844b, but it may also have a wafer support that may receive the autocalibration wafer 800 when placed therein). In some instances, a wafer station may be associated with an active wafer centering (AWC) system 866, which may allow measurements of wafer center locations to be obtained as wafers are introduced to, or removed from, an associated wafer station 844. In this example, the AWC system 866 is associated with the wafer station 844a and includes two vertically oriented optical beam sensors (represented by the dots within the AWC system 866) that may detect when an edge of a wafer crosses through either optical beam. As discussed earlier, the AWC system 866 may be used to determine the center location of a wafer supported by an end effector 858 of a wafer-handling robot 856 of the tool relative to a particular, known frame of reference, thereby allowing a determination to be made as to any positioning corrections that may need to be made before placing the wafer at a desired location.

As shown in FIG. 8a, the wafer-handling robot 856 is supporting an edge ring 862 on the end effector 858 in preparation for placing the edge ring 862 on the wafer support 852a/pedestal 854. The autocalibration wafer 800, in the interim, is in temporary storage in the wafer station 844b/docking station 868.

Figure 8B:
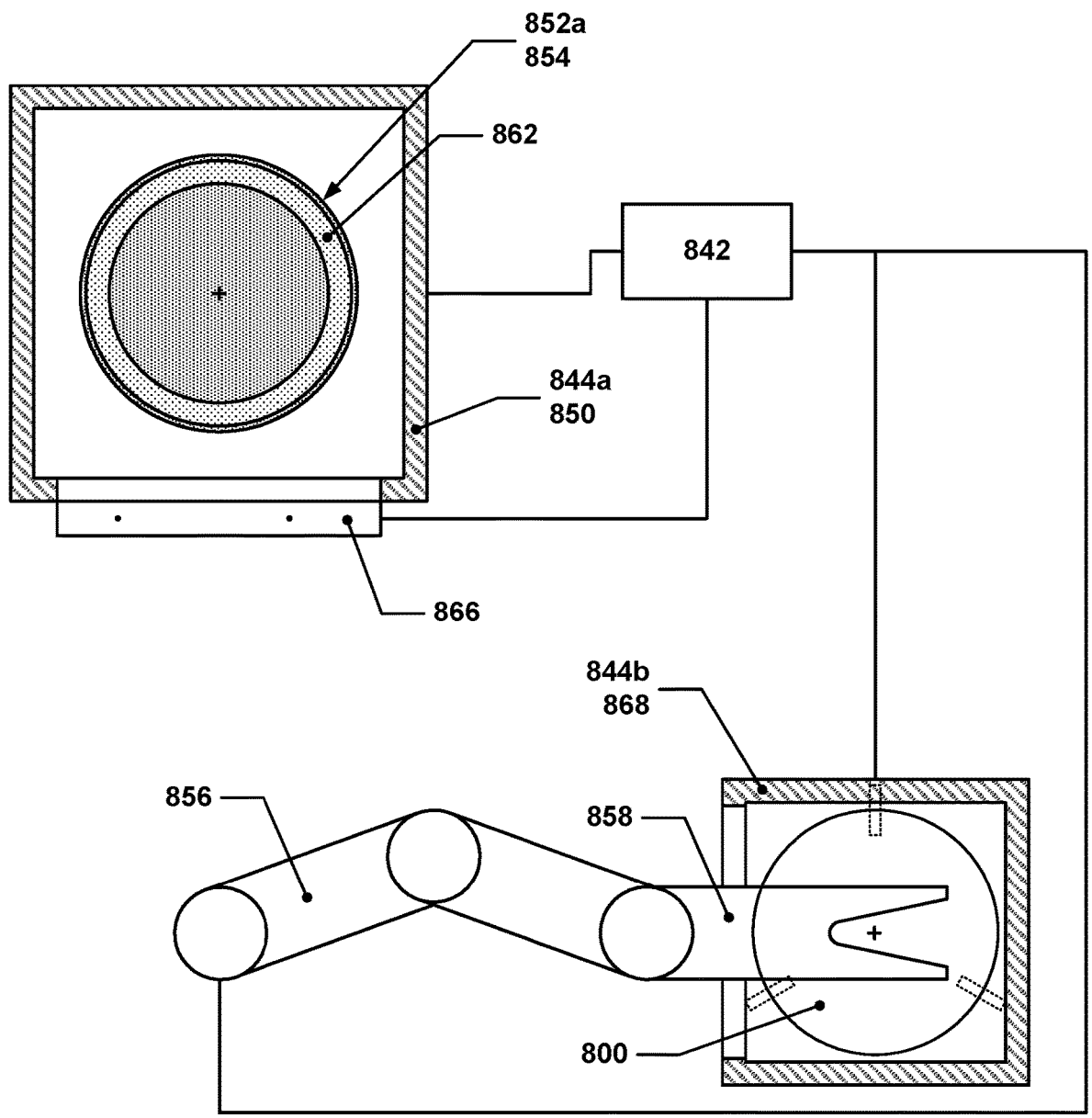

In FIG. 8b, the wafer-handling robot 856 has been actuated to place the edge ring 862 in a location that is nominally centered on the wafer support 852a/pedestal 854 and has been further actuated to retrieve the autocalibration wafer 800 from the wafer station 844b/docking station 868.

Figure 8C:
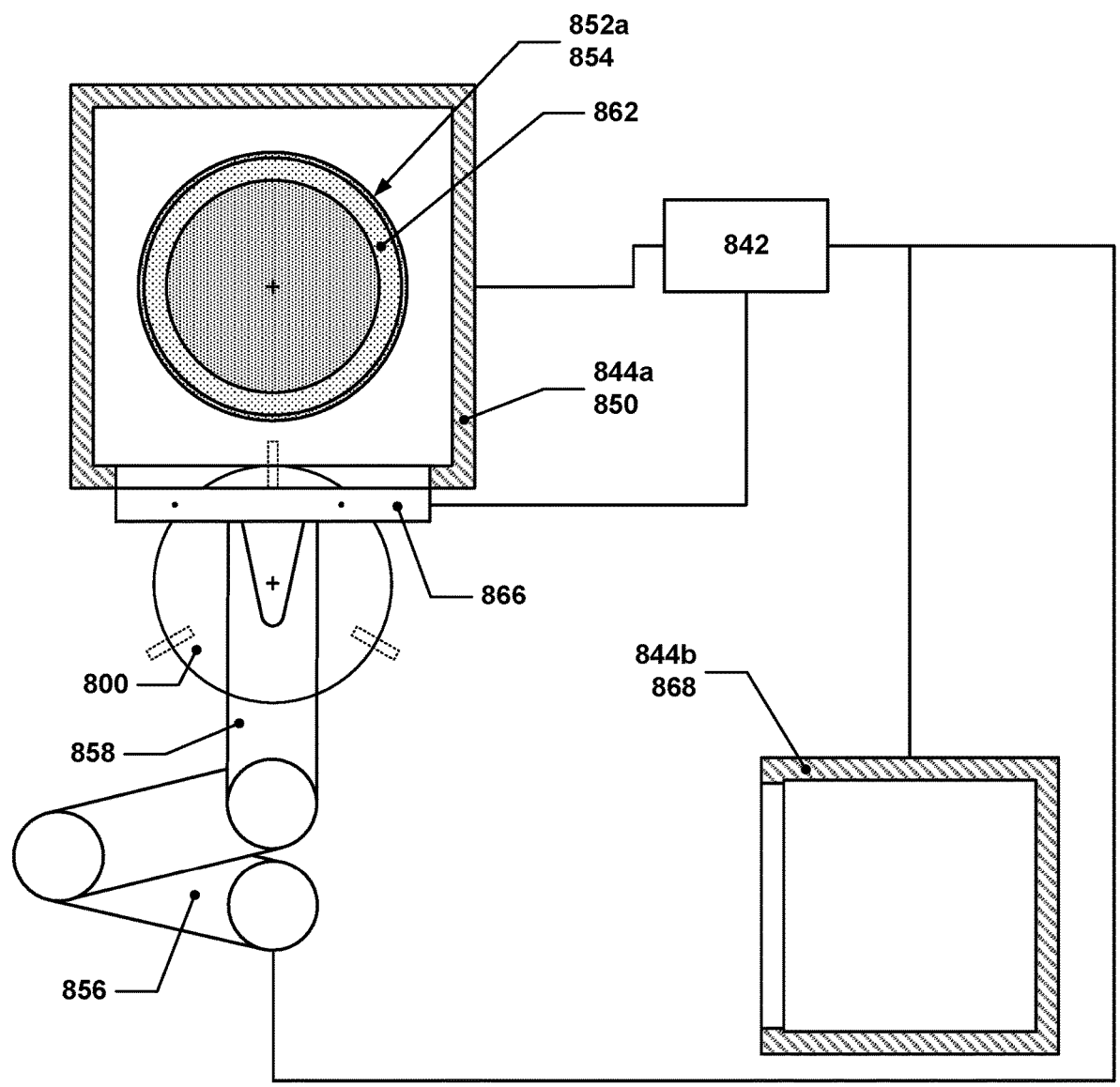

In FIG. 8c, the wafer-handling robot 856 has retrieved the autocalibration wafer 800 from the wafer station 844b/docking station 868 and is preparing to position the autocalibration wafer over the wafer support 852a/pedestal 854 and the edge ring 862.

Figure 8D:
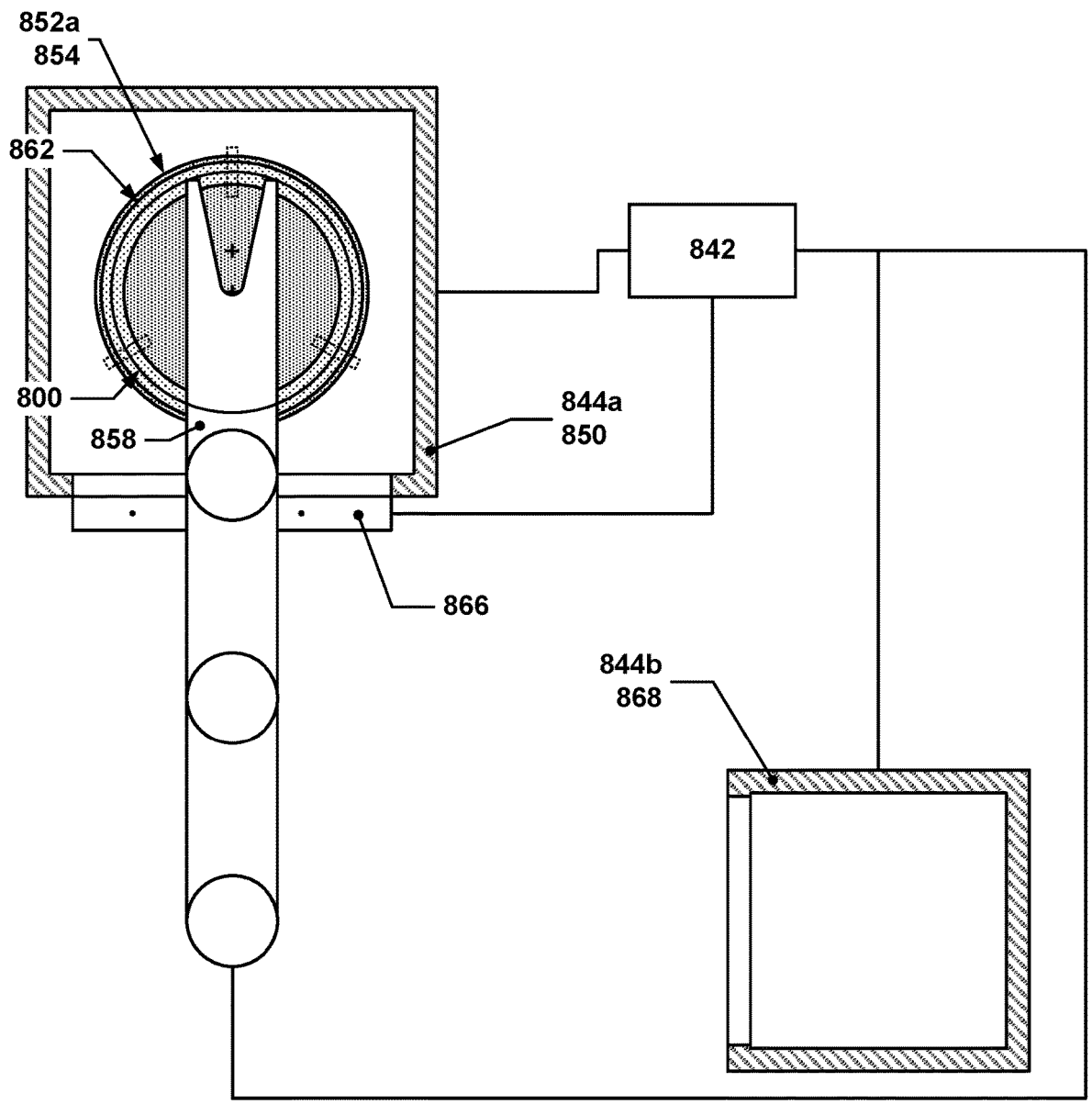
Figure 8E:
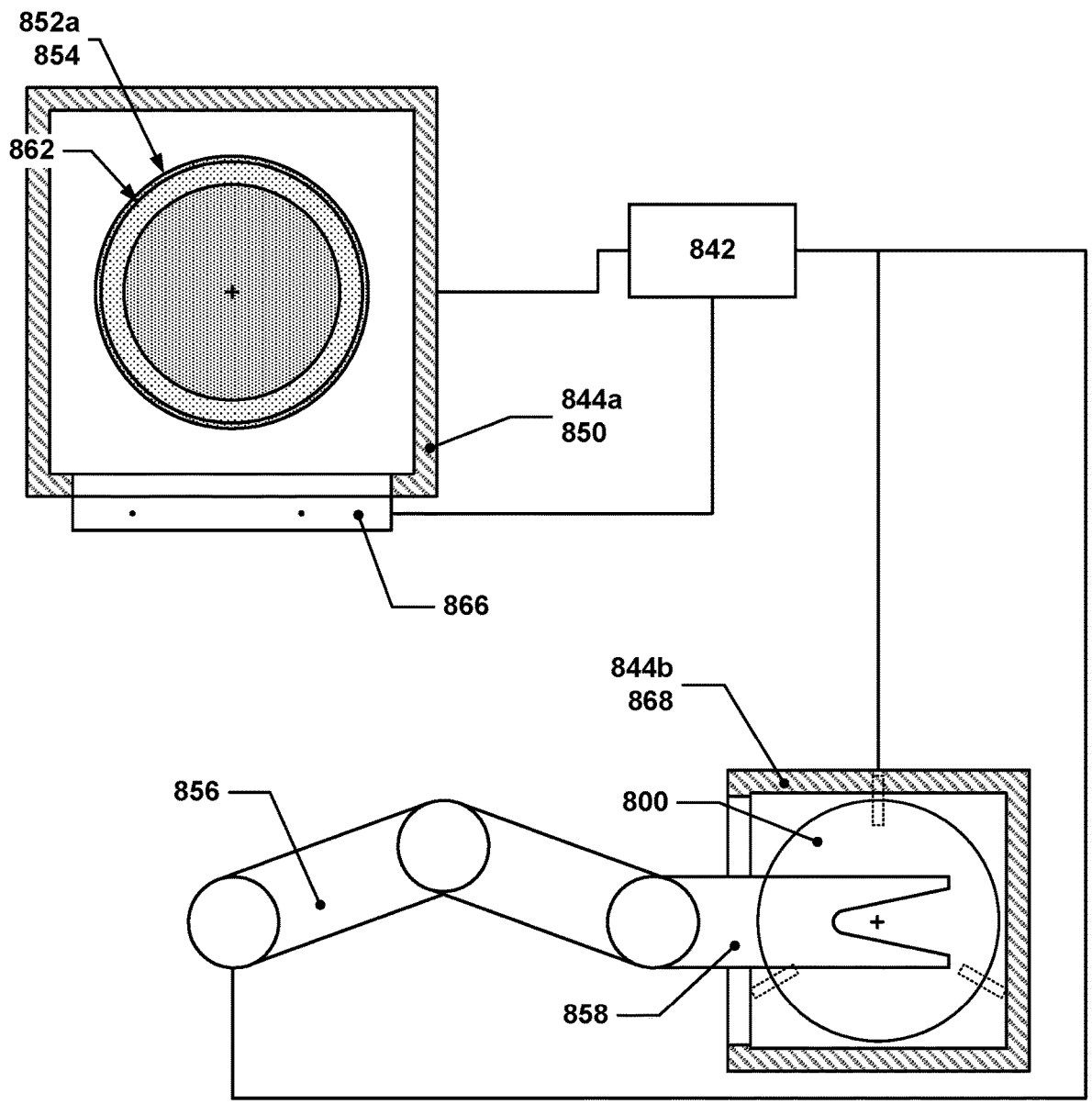

In FIG. 8d, the wafer-handling robot 856 has extended the end effector 858 so as to position the autocalibration wafer 800 over the wafer support 852a/pedestal 854 and the edge ring 862; the autocalibration wafer 800 is thus positioned such that the fields of view of downward-facing first imaging sensors of the autocalibration wafer 800, which are indicated by the three dotted rectangles spaced along the outer edge of the autocalibration wafer 800, include the edge ring 862 and one or more features of the wafer support 852a/pedestal 854. A first controller of the autocalibration wafer 800 may then be caused by the second controller 842 to obtain image data from the first imaging sensors of, for example, the gaps in between the inner edge of the edge ring 862 and a fiducial of the wafer support 852a/pedestal 854, e.g., an outer edge of an ESC of the wafer support 852a. As discussed earlier, these gaps may be used to determine the amount by which the center of the edge ring 862 is offset with respect to the center of the wafer support 852a/pedestal 854; if this offset exceeds a permissible threshold, then the edge ring may be repositioned to reduce the offset. In this example, the edge ring 862 has been acceptably placed, and the wafer-handling robot 856 may, as shown in FIG. 8e, remove the autocalibration wafer 800 from the wafer station 844a and return it to the wafer station 844b.

Figure 8F:
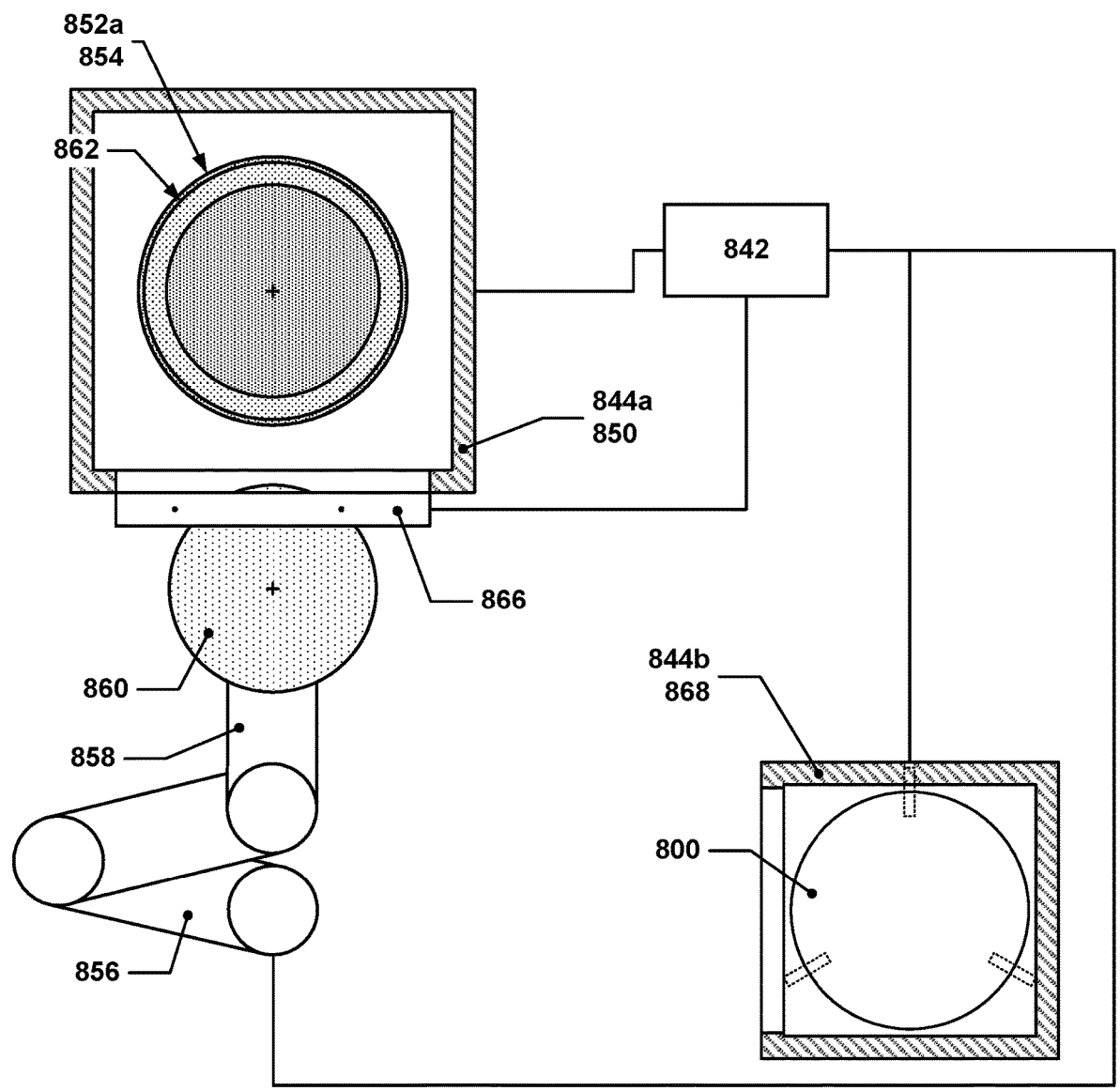
Figure 8G:
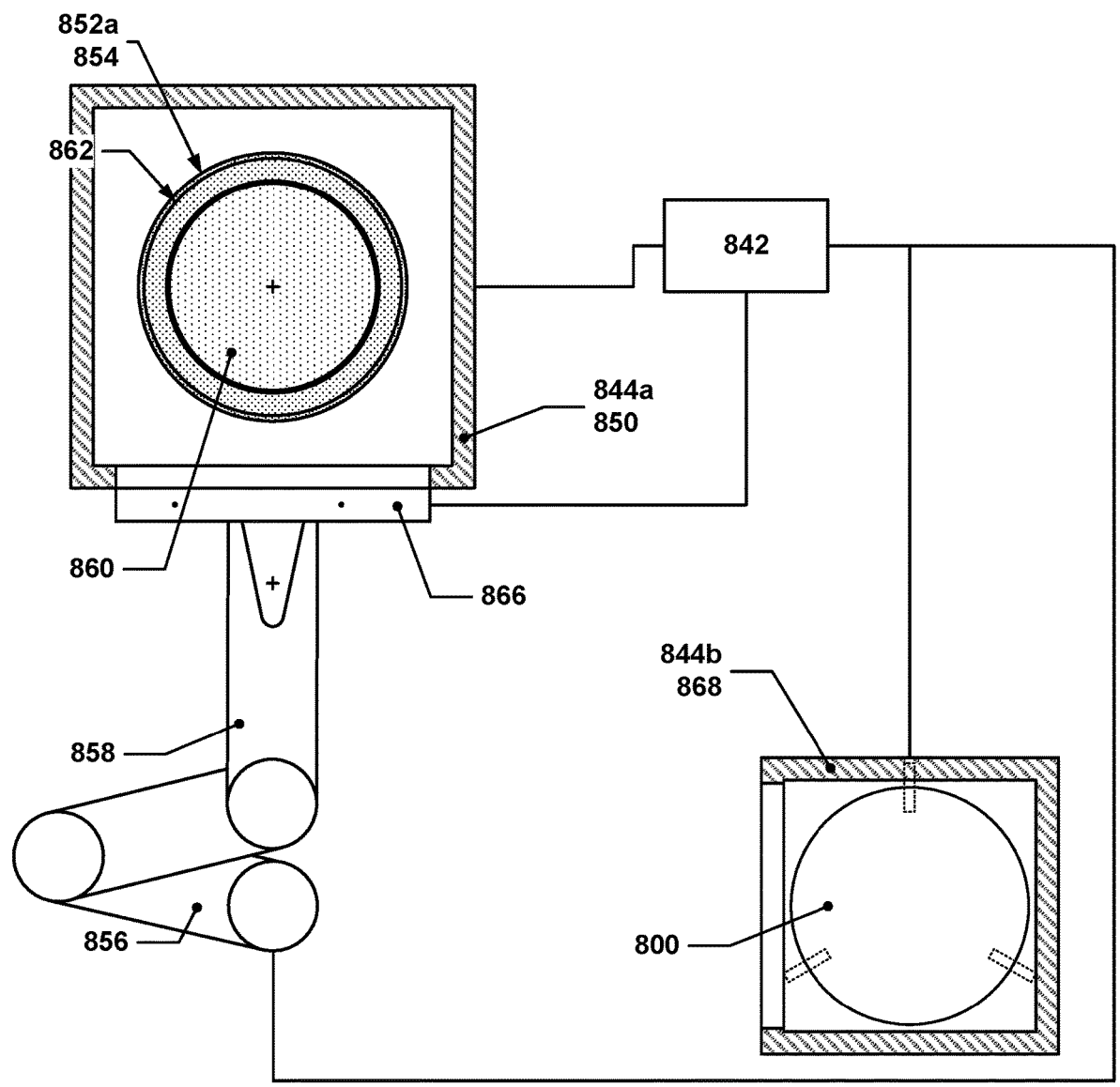

In FIG. 8f, the wafer-handling robot has been actuated to retrieve a calibration wafer 860, which may be stored in the docking station 868 as well, e.g., underneath or above the autocalibration wafer 800, or may be obtained from a different location entirely, e.g., from a loadlock or airlock. The calibration wafer 860 may then be placed in the wafer station 844a/semiconductor processing station 850 and transferred to the wafer support 852a/pedestal 854 such that it is nominally centered with respect to the center of the edge ring 862, as shown in FIG. 8g.

Figure 8H:
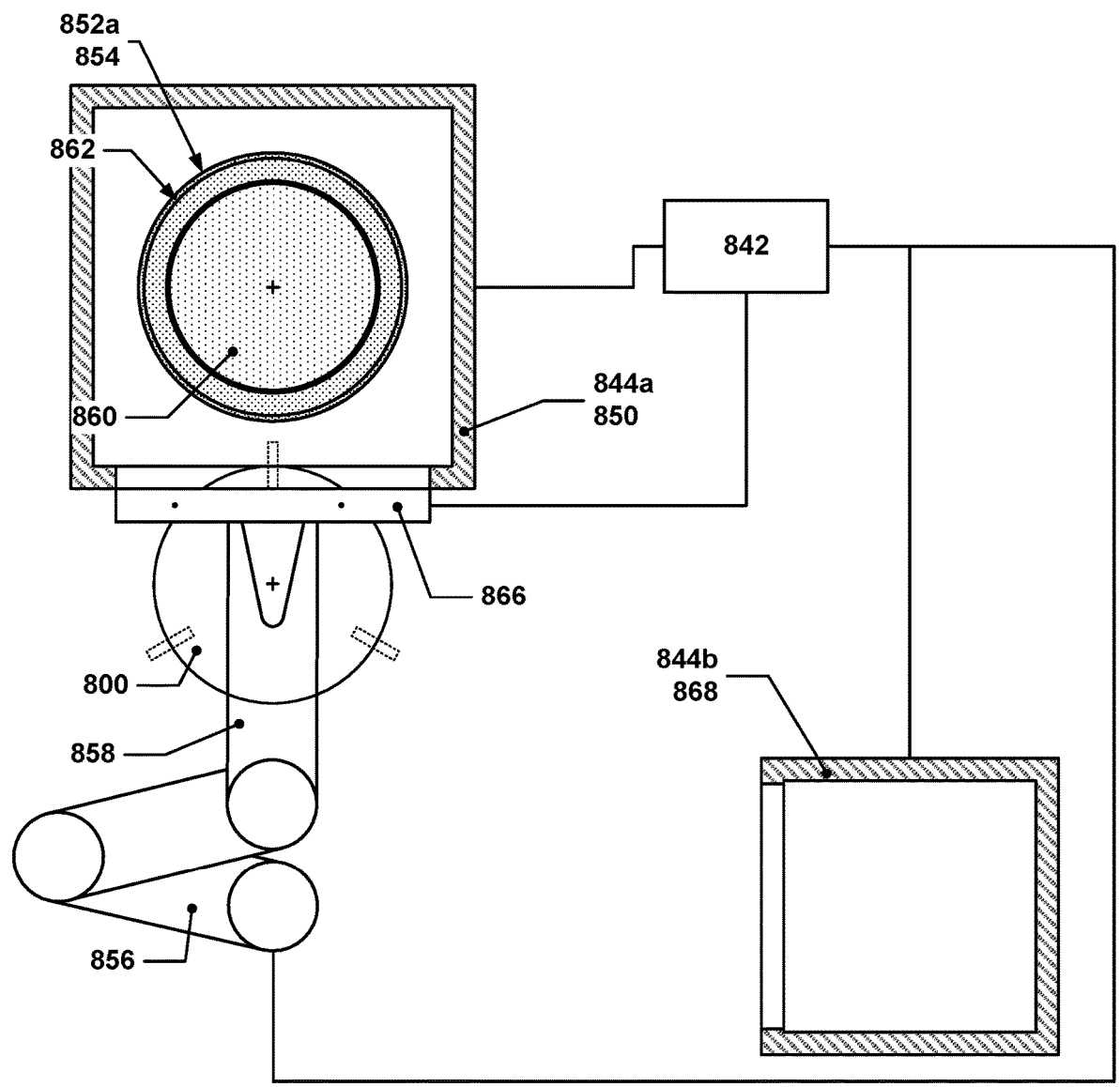
Figure 8I:
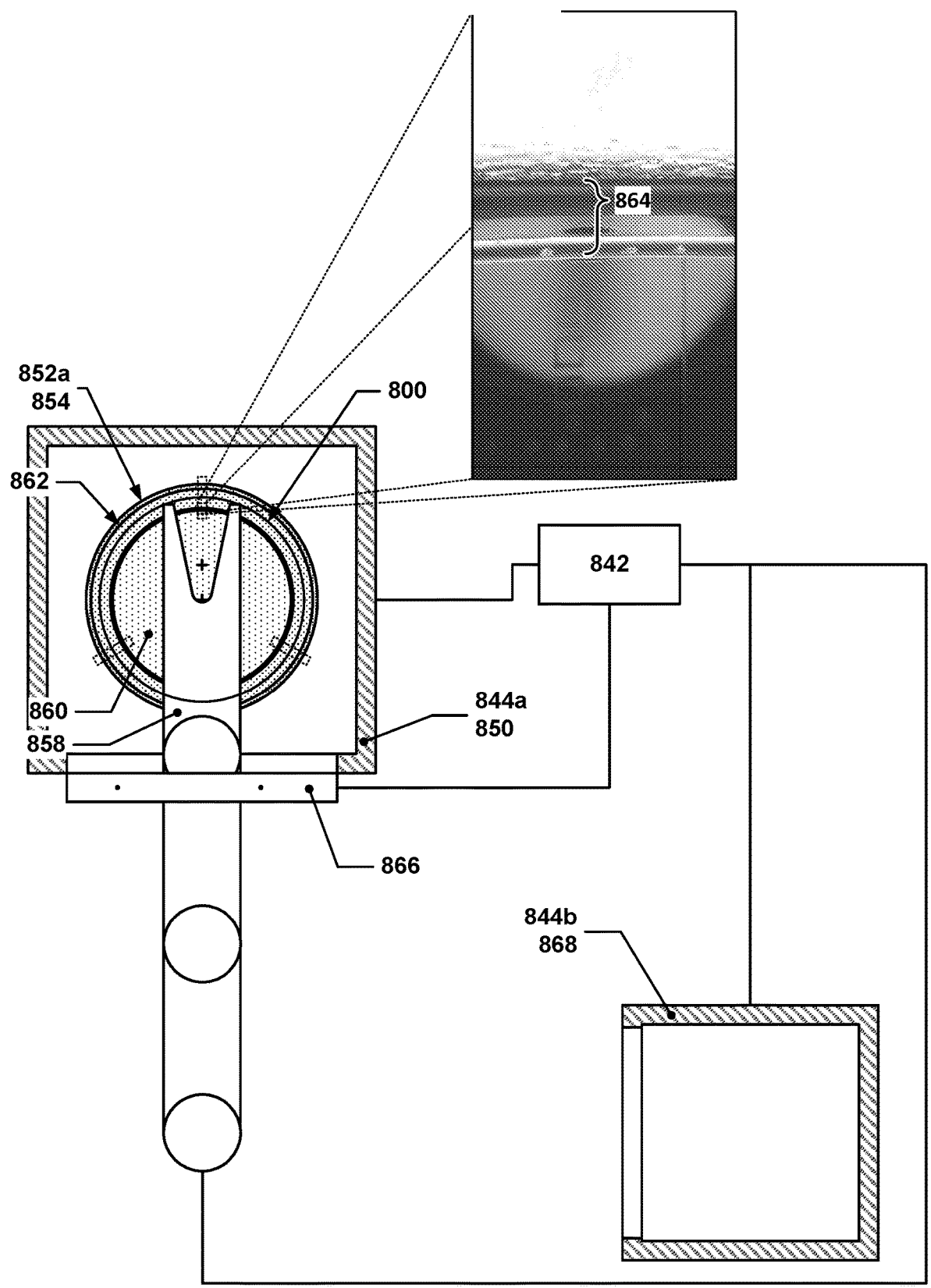

In FIG. 8h, the wafer-handling robot has again been actuated to retrieve the autocalibration wafer 800 from the wafer station 844b/docking station 868; in FIG. 8i, the wafer-handling robot has been further actuated to position the autocalibration wafer 800 over the wafer support 852a/pedestal 854, the calibration wafer 860, and the edge ring 862. Similar to FIG. 8d, the autocalibration wafer 800 may then be controlled to obtain image data of the gaps in between the edge ring 862 and the calibration wafer 860, such as gap 864, thereby allowing a determination to be made as to any offset between the center of the calibration wafer 860 and the center of the edge ring 862.

Various techniques that may be practiced with an autocalibration wafer such as those discussed above are explored in more detail below with reference to FIGS. 9 through 14.

Figures 9, 10:
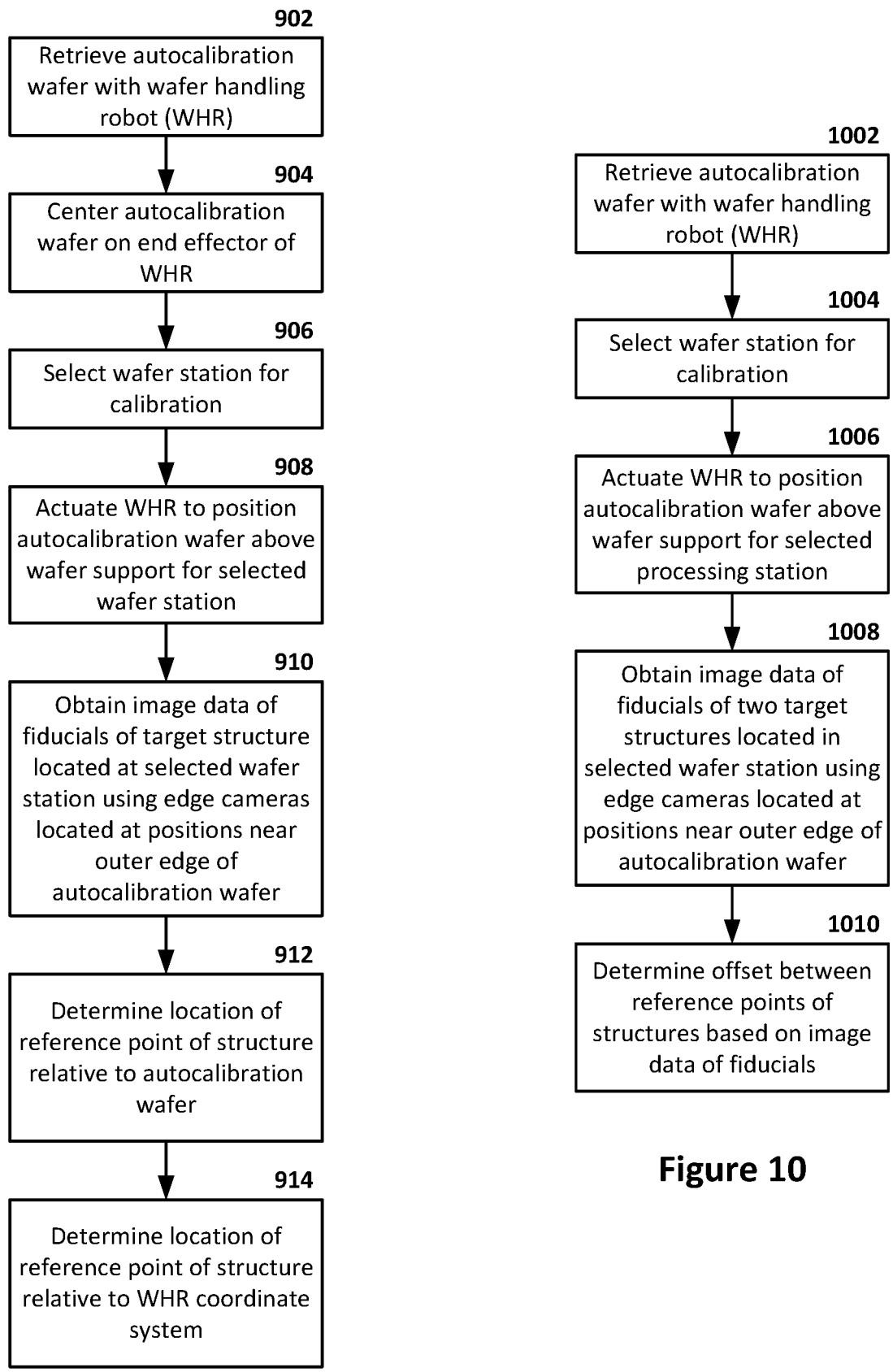
FIG. 9 depicts a flow chart of a technique for determining the location of a reference point of a structure at a wafer station using an autocalibration wafer.
FIG. 10 depicts a flow chart of a technique for determining the relative positioning of two structures at a wafer station using an autocalibration wafer.

FIG. 9 depicts a flow chart of a technique for determining the location of a reference point of a structure at a wafer station using an autocalibration wafer. Such a technique may be used, for example, in teaching a wafer-handling robot the various locations at which wafers may be placed (or retrieved from). In block 902, an autocalibration wafer may be retrieved using an end effector of a wafer-handling robot; in block 904, the autocalibration wafer may be centered on the end effector of the wafer-handling robot (blocks 902 and 904 may be performed simultaneously in some implementations). For example, the autocalibration wafer may be caused to be placed on the end effector such that the center of the autocalibration wafer (or some other known reference point on the autocalibration wafer) is centered on a known reference point of the end effector, thereby establishing a spatial relationship between the two reference points and allowing measurements that are obtained using the autocalibration wafer to be mapped or transformed into the coordinate system used by the wafer-handling robot.

Such placement of the autocalibration wafer on the end effector may be accomplished through any suitable mechanism, including through the use of a physical indexing feature or other contact-based approach for ensuring that the autocalibration wafer is properly positioned on the end effector. However, the imaging features of the autocalibration wafer itself may alternatively be used, in some instances, to ensure proper autocalibration wafer centering on the end effector. For example, just prior to loading of the autocalibration wafer onto the end effector, the autocalibration wafer may be positioned above the end effector, and one or more of the imaging sensors of the autocalibration wafer may be activated to cause an image of the end effector, or a region thereof, to be obtained. The imaged portion of the end effector may, for example, include a fiducial that defines a reference point on the end effector, e.g., a location on the end effector that coincides with the XY center point of a theoretical semiconductor wafer that is perfectly placed on the end effector. This image data may then be analyzed to determine the degree to which the reference point of the autocalibration wafer, e.g., the center of the autocalibration wafer, is offset from the reference point/fiducial of the end effector. The wafer-handling robot can then be actuated to cause the end effector to move in a manner that reduces or cancels out this offset before the autocalibration wafer is placed on the end effector, thereby centering the autocalibration wafer on the end effector.

In block 906, a wafer station may be selected for calibration, e.g., determination of a reference point on a structure, e.g., a wafer support, of the wafer station where the centers of wafers delivered to the wafer station are intended to be located. In block 908, the wafer-handling robot may be actuated to cause the end effector and autocalibration wafer to be positioned above the selected wafer station such that the autocalibration wafer is generally centered, for example, over the reference point of the wafer support for the selected wafer station. Such initial positioning may be based on, for example, an estimate of the wafer support reference point location determined based on the as-designed locations of the various components in the system, which may generally allow for placement accuracy within a millimeter or a few millimeters in most cases.

In block 908, the autocalibration wafer may be caused to obtain image data of a fiducial or fiducials on a target structure located at the selected wafer station; the fiducial or fiducials may be associated with the reference point of the wafer station where, for example, the centers of wafers delivered to the wafer station are intended to be located. For example, the outer edge of an ESC of a wafer support at the selected wafer station may serve as the fiducial; such a fiducial may not directly indicate the reference point of the wafer station, but may nonetheless unambiguously define it, e.g., a circular or arcuate edge of an ESC may define a center point that serves as the reference point. In another example, a wafer support may include some type of fiducial, e.g., an etched "+" or other marking, that directly marks the reference point, e.g., the center of the wafer support may be the reference point and the intersection of the two lines in the "+" may indicate the reference point.

In block 912, the location of the reference point of the structure, e.g., wafer support, of the selected wafer station relative to the autocalibration wafer may be determined based on the image data of the fiducials. For example, the image data may indicate that the reference point of the structure has an XY offset from a reference point of the autocalibration wafer, e.g., the center of the autocalibration wafer, of (0.3 mm, 0.5 mm) in the coordinate system of the autocalibration wafer.

In block 914, the location of the reference point of the structure may then be determined relative to the wafer-handling robot coordinate system. For example, the XY offsets determined in block 912 relative to the autocalibration wafer coordinate system may be subjected to a coordinate system transform in order to translate them into equivalent coordinates in the coordinate system of the wafer-handling robot, e.g., to account for possible angular misalignment between the autocalibration wafer coordinate system and the wafer-handling robot coordinate system.

If the calibration technique of FIG. 9 is used, it may be desirable in some instances to calibrate the autocalibration wafer prior to implementing the technique. For example, it may be desirable to establish the positions of the imaging sensor or sensors used to obtain the image data relative to a reference point, e.g., the center point, of the autocalibration wafer, so that locational information determined from such sensors can be appropriately processed. Each imaging sensor may, for example, be thought of as providing XY location data (based on the rectangular or linear array of pixels each such sensor may have) in a coordinate system that is specific to each imaging sensor and is offset from the reference point of the autocalibration wafer by a particular XY distance and/or rotational angle. Calibrating the autocalibration wafer allows for such XY and angular offsets to be determined for the coordinate system each imaging sensor. Any locations that are then later determined from the imaging sensor data may then be suitably transformed so as to be accurately located with respect to the coordinate system of the reference point of the autocalibration wafer.

In an example of such a calibration, the autocalibration wafer may be placed in a fixture that has indexing pins or other alignment features that contact the outer edge of the autocalibration wafer and physically constrain the autocalibration wafer to be centered over a fiducial that is part of the fixture and that is known to be centered with respect to the constrained outer edge of the autocalibration wafer. Once the autocalibration wafer is mounted in the fixture and centered over the fiducial, a centrally mounted imaging sensor may be caused to obtain an image of the fiducial, and a determination may then be made, for example, as to which pixel or pixels coincide with the center point indicated by the fiducial, thereby providing information that may later be used to transform any locational data obtained from images of the centrally mounted imaging sensor into a coordinate system associated with the reference point. Similar fiducials may be provided in the fixture at locations that coincide with the fields of view of other imaging sensors as well, allowing for the calibration of all of the imaging sensors prior to use.

FIG. 10 depicts a flow chart of a technique for determining the relative positioning of two structures at a wafer station using an autocalibration wafer. The technique of FIG. 10 begins in block 1002, in which an autocalibration wafer is retrieved using a wafer-handling robot of a semiconductor processing tool, e.g., from a docking station or other holding area used to store the autocalibration wafer. In block 1004, a wafer station of the semiconductor processing tool may be selected for calibration. The structures for which relative positioning is to be determined are assumed to already have been located at the selected wafer station, e.g., the selected wafer station may have, for example, an edge ring (a first structure) that is placed on a wafer support (a second structure).

In block 1006, the wafer-handling robot may be actuated to position the autocalibration wafer above the wafer support of the selected wafer station. The wafer-handling robot may, for example, be positioned so that the autocalibration wafer is nominally centered above the wafer support/edge ring of the selected wafer station, thereby causing first imaging sensors positioned along the outer perimeter of the autocalibration wafer to be positioned over the edge ring and wafer support in a manner that allows the first imaging sensors to obtain images of fiducials of the two structures, e.g., the inner edge of the edge ring and the edge of a feature of the wafer support, e.g., the outer edge of an ESC of the wafer support. In block 1008, the autocalibration wafer may be caused to obtain such images. In block 1010, the images may be analyzed to determine, for example, gap sizes between the fiducials in each image. For example, edge-finding algorithms may be used to identify the inner edge of the edge ring and the edge of the wafer support in each image, and the relative distances for the gap in between each pair of edges determined. The determined gaps between each pair of edges may be estimated based on the assumed vertical distance between the first imaging sensors and the imaged structures; such estimates may be somewhat inaccurate, but will generally be similarly scaled in each image. In the case where the fiducials for each structure are located along a common reference circle, e.g., arcuate outer or inner edges of the edge ring that are all coradial with one another (or a single circular edge thereof) may serve as fiducials for the edge ring, and arcuate edges of the wafer support that are all coradial with one another (or a single circular edge thereof) may serve as fiducials for the wafer support. It will be understood that other fiducials may be used to similar effect, and the techniques discussed herein may generally be applicable to any suitable fiducials and applicable algorithms for determining relative offset between such structures based on the selected fiducials.

In block 1010, a determination may be made, based on the relative gap sizes between the imaged fiducials of the two structures, as to the offset between reference points, e.g., centers, of both structures. Such an offset may be compared against a threshold offset to see if the off-centeredness of the two structures is within acceptable limits. Such a threshold offset may be established based on the non-uniformity requirements of a particular semiconductor processing technique. If off-centeredness measurements are not within acceptable limits, appropriate actions may be taken, e.g., one of the structures may be repositioned based on the measured center offsets and the procedure may be repeated until the off-centeredness measurement is within acceptable limits.

Figure 11:
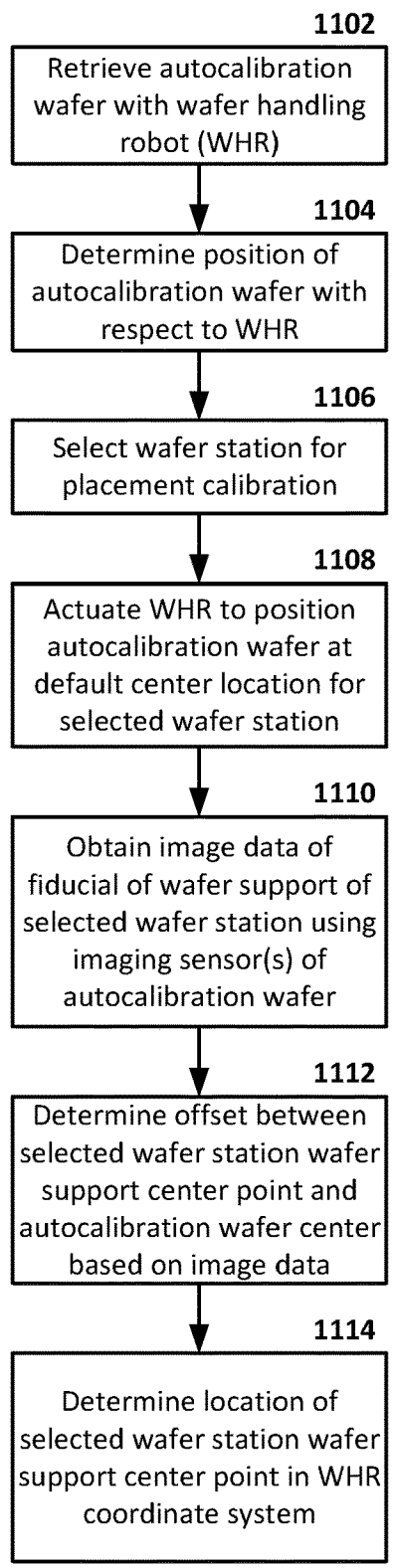
FIG. 11 depicts a flow chart of a technique for determining the location of the center point of a wafer support using an autocalibration wafer.

FIG. 11 depicts a flow chart of a technique for determining the location of the center point of a wafer support using an autocalibration wafer. In block 1102, an autocalibration wafer may be retrieved using the end effector of a wafer-handling robot. In block 1104, the position of the autocalibration wafer relative to the wafer-handling robot end effector may be determined. Blocks 1102 and 1104 may, in some instances, be performed in tandem, e.g., the wafer-handling robot may be controlled to cause the autocalibration wafer to be picked up by the end effector (as discussed earlier herein) such that the autocalibration wafer is centered on a reference point of the end effector, thus establishing the position of the autocalibration wafer relative to the end effector.

In block 1106, a wafer station may be selected for determination of the center point of a wafer support thereof. In block 1108, the wafer-handling robot may be actuated to cause the autocalibration wafer to be positioned above the wafer support of the selected wafer station, e.g., at a default center location associated with that wafer station.

In block 1110, image data may be obtained, for example, of a fiducial or fiducials of the wafer support using one or more imaging sensors of the autocalibration wafer. Such a fiducial may, for example, be an etched pattern located at the center of the wafer support. Alternatively, the fiducial may be a circular edge of a portion of the wafer support, e.g., of an ESC that is part of the wafer support, that defines a center point of the wafer support. In the former case, an imaging sensor located near or at the center of the autocalibration wafer may be used to image the fiducial. In the latter case, imaging sensors located near the outer edge of the autocalibration wafer may be used to image the fiducials.

In block 1112, the image data may be analyzed to determine an offset between a reference point, e.g., center point, of the autocalibration wafer and the reference point of the selected wafer station defined by the fiducial. In block 1114, the offset determined in block 1112 may be transformed into the coordinate system of the wafer-handling robot. If desired, the "default" location corresponding to the center of the selected wafer support may be updated to account for the offset determined in block 1114 (alternatively, the default location may be left as-is but then adjusted based on the offset for each subsequent wafer placement at that wafer station). In some implementations, the wafer-handling robot may then be actuated to cause the wafer-handling robot to shift the autocalibration wafer so that the autocalibration wafer center is positioned at the updated center location for the wafer support (similar to block 1108). In such implementations, blocks 1110 through 1114 may be repeated, if desired, to verify that the updated centered position is adequately centered. If the updated default location (or correction of the default location) is found to still produce a center-to-center offset that is not within acceptable limits, then the process may be repeated one or more times.

While the above discussion has focused on using an autocalibration wafer to determine the absolute location of the center of a wafer support or other structure with respect to the coordinate system used by the wafer-handling robot, autocalibration wafers may also be used to determine relative positioning between two components, as discussed further below.

Figure 12:
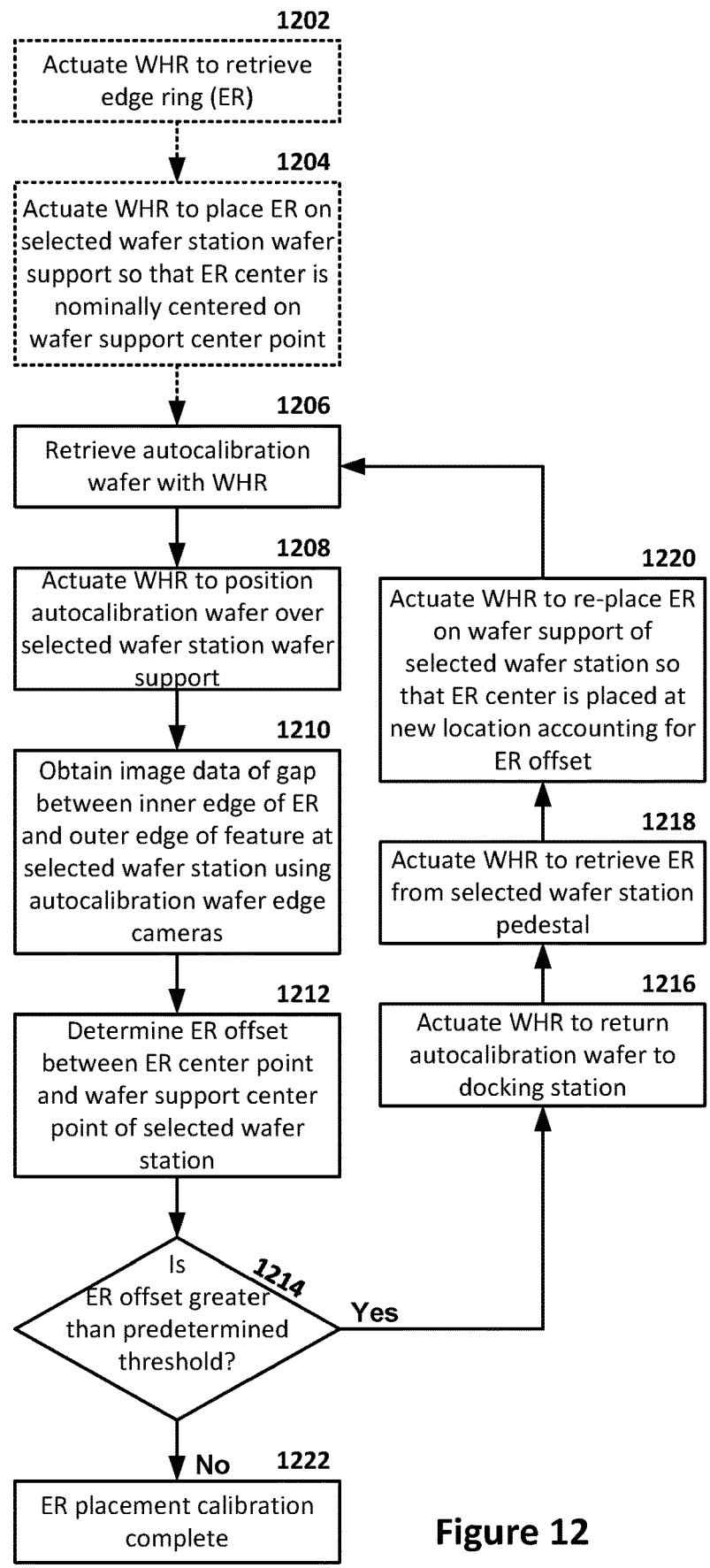
FIG. 12 depicts a flow chart of a technique for calibrating the placement of an edge ring on a wafer support.

FIG. 12 depicts a flow chart of a technique for calibrating the placement of an edge ring on a wafer support. In block 1202, a wafer-handling robot of a semiconductor processing tool may be actuated to cause the wafer-handling robot to retrieve the edge ring from a wafer station. In block 1204, the wafer-handling robot may be further actuated to cause the edge ring to be placed on a wafer support, e.g., pedestal, of a selected wafer station of the semiconductor processing tool. Blocks 1202 and 1204 may be optional, as the edge ring may have been manually placed or installed onto the wafer support, or may have been previously placed or installed on the wafer support, e.g., during another phase of operation.

In block 1206, the wafer-handling robot may be controlled to cause the wafer-handling robot to retrieve an autocalibration wafer from a docking station or other location. In block 1208, the wafer-handling robot may be further actuated to cause the autocalibration wafer to be positioned at a location over the wafer support of the selected wafer station (and the edge ring positioned thereupon).

Once positioned over the wafer support of the selected wafer station, the autocalibration wafer may be caused, in block 1210, to obtain image data of the gaps between the inner edge of the edge ring and the outer edge (or other fiducial) of a feature of the wafer support, e.g., the outer edge of an ESC that is part of the wafer support, using the edge cameras, e.g., first imaging sensors, of the autocalibration wafer.

In block 1212, an estimated offset may be determined between the center of the edge ring and the center of the wafer support based on the relative sizes of the gaps between the fiducials in the images. In block 1214, a determination may be made as to whether or not the estimated edge ring/wafer support offset exceeds a predetermined threshold offset. If the estimated edge ring/wafer support offset does exceed the predetermined threshold offset, then the technique may proceed to block 1216, in which the wafer-handling robot may be actuated to remove the autocalibration wafer from the position above the wafer support and returned, for example, to the docking station (or to some other temporary holding location). The wafer-handling robot may then, in block 1218, be actuated to retrieve the edge ring from the wafer support of the selected wafer station. For example, lift pins may be used to lift the edge ring off of the wafer support so that the end effector of the wafer-handling robot may be inserted beneath the edge ring, and the edge ring then lowered onto the end effector by retracting the lift pins into the wafer support.

After the wafer-handling robot has been used to retrieve the edge ring from the wafer support in block 1218, the wafer-handling robot may be further controlled to cause the edge ring to be re-placed on the wafer support such that the edge ring center is placed at a new location that accounts for the edge ring offset, thereby causing the edge ring and the wafer support to be more accurately centered on one another. After block 1218, the technique may return to block 1206, and a further evaluation of the edge ring/wafer support center offset may be obtained. If necessary, this portion of the technique may be repeated for a threshold number of times or until the estimated center offset between the edge ring and the wafer support is within the predetermined threshold offset. If the estimated edge ring/wafer support offset is found to be within the predetermined threshold offset in block 1214, then the technique may proceed to block 1222, in which the edge ring placement calibration may be deemed to be complete.

It will be understood that using the autocalibration wafer to evaluate relative offsets between two structures may be accomplished without precise positioning of, or even knowledge of, the autocalibration wafer relative to the end effector of the wafer-handling robot. In particular, the techniques discussed herein may be used when the autocalibration wafer is sufficiently centered on the end effector such that the fields of view of the first imaging sensors of the autocalibration wafer are able to image the various gaps in between fiducials of the two structures. It will also be understood that a similar technique may be used to center other components relative to the wafer support, e.g., to center a calibration wafer relative to the wafer support.

For edge rings, once an edge ring is properly placed on a wafer support, it may generally remain in that position for a large number of wafer processing operations. For calibration wafer centering, however, the calibration wafer merely acts as a stand-in or representative of wafers that will be placed in future operations. As such, once the calibration wafer is centered on a desired structure, e.g., a wafer support or edge ring, using the autocalibration wafer techniques discussed herein, the calibration wafer may be removed from the centered location using the wafer-handling robot and used to teach an active wafer centering (AWC) system that may then, in turn, "learn" the desired center point of the calibration wafer relative to the end effector with respect to a given wafer-handling robot kinematic path; future placements of wafers on the end effector of the wafer-handling robot may then be evaluated using the active wafer centering system in order to determine the offset between the center points of such wafers and the learned center point. The wafer-handling robot may then be actuated to place the wafer on the wafer support in a manner that accounts for this determined offset. It will be understood that while edge rings may generally remain in position for a large number of processing operations, edge rings may occasionally be replaced;

similar AWC techniques may be performed, as discussed earlier, during such subsequent edge ring placements as well in order to compensate for any misalignment between such an edge ring and the end effector.

Figure 13:
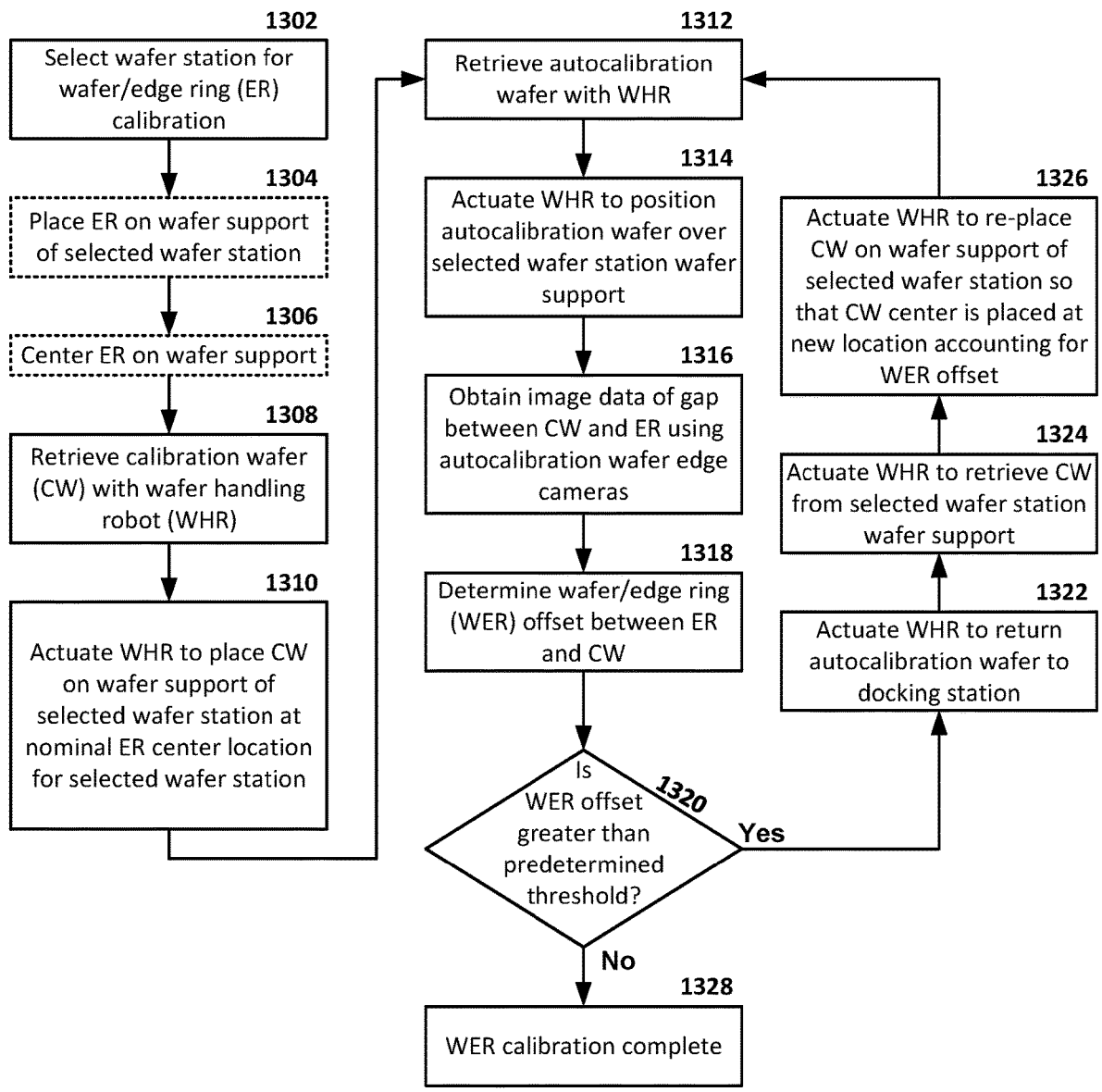
FIG. 13 depicts a flow chart of a technique for calibrating the placement of a wafer relative to an edge ring on a wafer support.

The techniques discussed herein may also be used to determine relative offsets between two movable components, e.g., an edge ring and a wafer. As an example, FIG. 13 depicts a flow chart of a technique for calibrating the placement of a wafer relative to an edge ring on a wafer support.

In block 1302, a wafer station of a semiconductor processing tool may be selected in block 1302. Similar to the technique of FIG. 12, an edge ring may be placed on a wafer support of the selected wafer station in block 1304, and the edge ring then centered on the wafer support in block 1306 using, for example, the centering technique discussed above with respect to FIG. 12. Blocks 1304 and 1306 may be optional; the edge ring may also have been placed on the wafer support of the selected wafer station through other means, e.g., manual placement, or may have already been in place on the wafer support prior to selection of the selected wafer station.

In block 1308, the wafer-handling robot may be caused to retrieve a calibration wafer, e.g., an unprocessed or dummy wafer that has the same size and thickness as a wafer for processing, from a storage location. In block 1310, the wafer-handling robot may be caused to transfer the calibration wafer to the wafer support of the selected wafer station such that the center of the calibration wafer is nominally centered on the center of the edge ring.

In block 1312, the wafer-handling robot may be controlled to retrieve an autocalibration wafer from a storage location, such as a docking station or other location accessible to the wafer-handling robot. In block 1314, the wafer-handling robot may be controlled to position the autocalibration wafer over the wafer support of the selected wafer station such that the autocalibration wafer is generally centered over the center points of the calibration wafer and/or the edge ring. In block 1316, the autocalibration wafer may be controlled to cause the edge cameras of the autocalibration wafer, e.g., the first imaging sensors, to obtain image data of the gap between the edge ring and the calibration wafer.

In block 1318, the image data may be analyzed to determine a wafer/edge ring offset between the inner diameter of the edge ring and the outer diameter of the calibration wafer based on the relative gap sizes in the images. In block 1320, a determination may be made as to whether the wafer/edge ring offset exceeds a predetermined threshold offset; if so, then the technique may proceed to block 1322, in which the wafer-handling robot may be actuated to return the autocalibration wafer to the docking station (or some other temporary holding location), and then to block 1324, in which the wafer-handling robot may be further actuated to retrieve the calibration wafer from the wafer support of the selected wafer station. For example, lift pins for the wafer support may be caused to raise the calibration wafer off of the edge ring so that the wafer-handling robot end effector may be positioned beneath the calibration wafer. Once so positioned, the lift pins may be further controlled to lower the calibration wafer onto the end effector.

In block 1326, the wafer-handling robot may be actuated to re-place the calibration wafer onto the wafer support of the selected wafer station such that the calibration wafer center is placed at a new location that account for the wafer/edge ring offset determined in block 1318. The technique may then return to block 1312 to initiate a further autocalibration wafer imaging operation of the gap sizes between the calibration wafer and the edge ring; this re-placement and re-analysis of the centeredness of the calibration wafer and the edge ring may be performed multiple times, e.g., until the determined wafer/edge ring offset falls below the predetermined threshold or until a predetermined number of such repetitions has occurred. In the event that it is determined in block 1320 that the wafer and edge ring are sufficiently centered on one another, i.e., the determined wafer/edge ring offset is within the predetermined threshold, then the technique may proceed to block 1328, where the wafer/edge ring placement calibration may be deemed complete. At this point, the calibration wafer may be removed from the wafer station using the wafer-handling robot and used to train, for example, an active wafer centering system—much in the same manner that a calibration wafer that is manually centered with respect to a wafer support, e.g., through using a fixture or other mechanical centering system, would be used. The training of an active wafer centering system based on a centered wafer or a wafer that has otherwise been placed on a wafer-handling robot end effector in a calibrated wafer is well-known in the industry and is not described in depth in this disclosure in the interest of brevity.

It will be understood that the above techniques may be practiced in a variety of different ways to achieve similar results. For example, in tools having multiple wafer-handling robots or wafer-handling robots that have dual arms/end effectors, one wafer-handling robot arm/end effector may be used to place or re-position objects, e.g., calibration wafers and/or edge rings, on wafer supports, whereas the other wafer-handling robot arm/end effector may be used to hold the autocalibration wafer. Thus, for example, the first arm may be used to place an edge ring on a wafer support and then retracted; the second arm may then move the autocalibration wafer over the placed edge ring to obtain a measurement of center-to-center offset between the edge ring and the wafer support. The second arm may then be retracted and, if necessary, the edge ring may be lifted clear of the wafer support, e.g., through use of lift pins, and the first arm may be used to reposition the edge ring to correct for the center-to-center offset between the edge ring and the wafer support. The first arm may then be withdrawn, and the second arm may move the autocalibration wafer over the edge ring and wafer support again to obtain a second measurement of center-to-center offset; this process may be repeated as needed until the desired amount of center-to-center offset between the edge ring and wafer support is achieved.

It will be further understood that autocalibration wafer-guided placement of wafers and/or edge rings on wafer supports may be an iterative process in which estimates of the relative offset between two structures, e.g., the wafer and the wafer support, the edge ring and the wafer support, or the edge ring and the wafer, may be obtained using the autocalibration wafer and then used to guide re-placement of one of the two structures relative to the other structure, which may stay stationary. Such autocalibration wafer-assisted placement and evaluation may generally be repeated until the measured offset is within a predetermined maximum allowable offset for a given set of components for a given semiconductor processing tool. In some instances in which an edge ring and a calibration wafer are both subjected to centering operations using an autocalibration wafer, a further evaluation may be made of the relative center offset between whichever pair of the three components (edge ring, wafer support, and calibration wafer) had not been directly centered relative to one another. For example, if an edge ring is centered relative to a wafer support, and a calibration wafer is then centered relative to the edge ring, then the calibration wafer would not have been directly centered relative to the wafer support (only indirectly centered via the edge ring centering). In such an implementation, the auto-calibration wafer may be used to additionally evaluate the centeredness of the calibration wafer relative to the wafer support. In some such implementations, the predetermined threshold offsets for each pair of structures may be selected so that it is possible for two of the three center-to-center offsets to be within their respective predetermined threshold offsets while the third center-to-center offset may actually exceed its respective predetermined offset (it is, of course, also possible to select predetermined threshold offsets such that this scenario cannot occur, although this may, in some cases, permit unacceptable process uniformities in some instances or may require that some predetermined thresholds be lower than may generally be necessary, which may increase the number of centering iterations that may need to be performed). Generally speaking, in such implementations, the threshold offsets may typically be selected such that a 2-out-of-3 success/1-out-of-3 failure scenario for threshold offset compliance is avoided for most cases, but if, for example, the edge ring is positioned relative to the wafer support at the limit of the predetermined edge ring/wafer support offset in a particular direction, and the calibration wafer is positioned relative to the edge ring at the limit of the predetermined wafer/edge ring offset in that same direction, then the calibration wafer would be at a maximum center-to-center offset from the wafer support, which might exceed the maximum center-to-center offset that is specified for the calibration wafer/wafer support.

In such implementations, should a 2-out-of-3 success/1-out-of-3 failure scenario occur, then the semiconductor processing tool may take various corrective actions. For example, in some implementations, the controller of the semiconductor processing tool may cause one or both of the calibration wafer and the edge ring to be removed by the wafer-handling robot and then re-placed using similar techniques to those discussed above, but using, for example, a more stringent respective predetermined threshold offset for placement.

It will also be understood that some semiconductor processing tools may conduct both calibration wafer and edge ring placement/centering operations using the autocalibration wafer by centering both components relative to the wafer support (rather than centering the edge ring with respect to the wafer support and the calibration wafer with respect to the edge ring or vice-versa).

Figure 14:
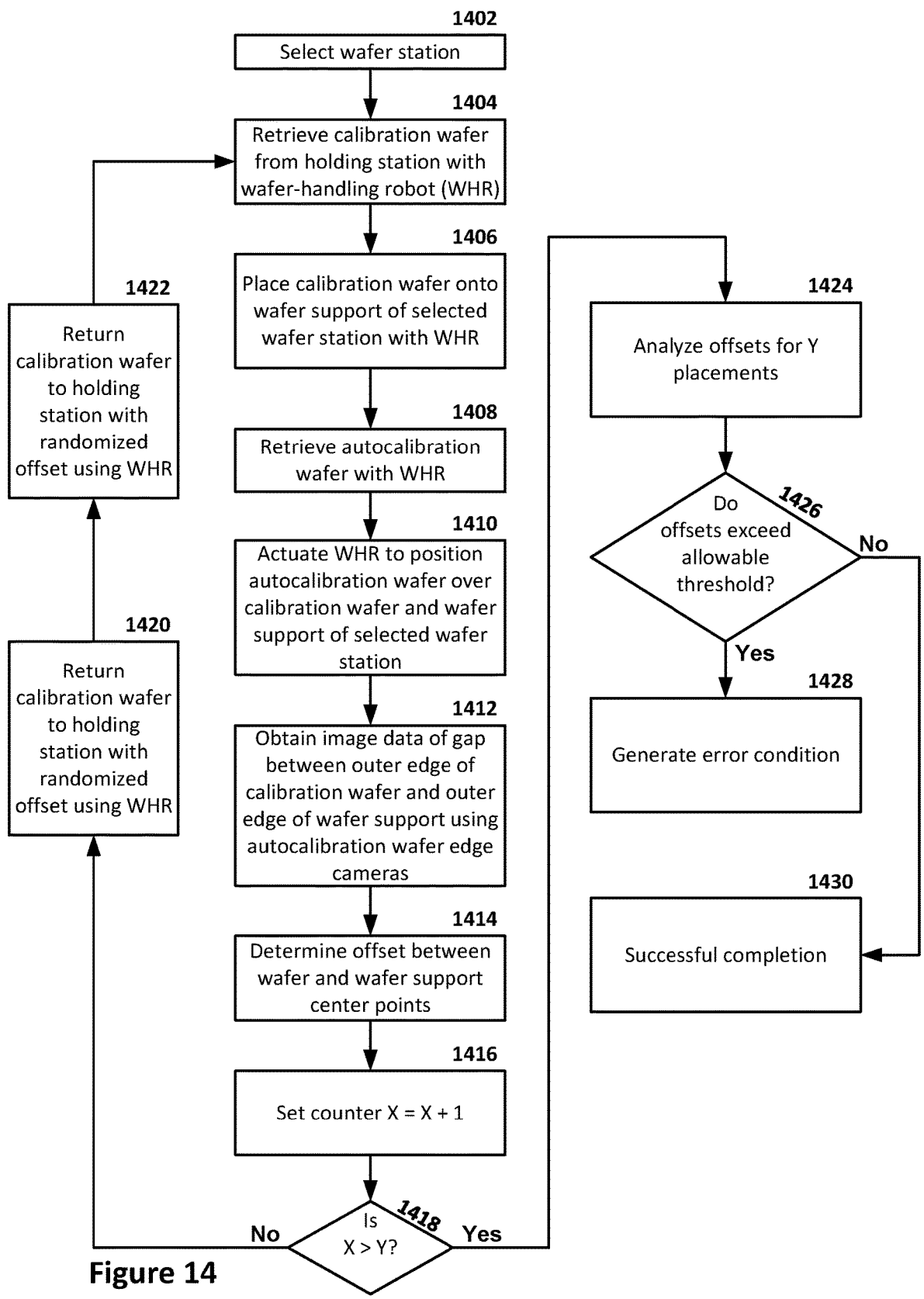
FIG. 14 depicts a flow chart of a technique for verifying repeatability of wafer placement.

Once a calibration wafer has been centered on a wafer support or an edge ring that is centered on a wafer support and then used to train an active wafer centering system, the trained active wafer centering system may then optionally be tested using the autocalibration wafer to ensure that the trained active wafer centering system will provide reliably centered wafer placements. FIG. 14 depicts a flow chart of such a technique for verifying repeatability of wafer placement (the technique of FIG. 14 is intended to be practiced after an active wafer centering system has already been taught); this technique assumes that the active wafer centering system has been trained with a wafer that is centered relative to a wafer support, but may also be used, with appropriate modification, with an active wafer centering system that is trained using a wafer that is centered relative to an edge ring, for example.

In block 1402, a wafer station of a semiconductor processing tool may be selected; the selected wafer station will have had a calibration wafer previously centered on the wafer support thereof, e.g., using the techniques discussed above, and an active wafer centering system associated with that wafer station will have been trained based on that calibration wafer's centered location. In block 1404, a wafer-handling robot of the semiconductor processing tool may be caused by a controller of the semiconductor processing tool to retrieve a calibration wafer from a holding station, e.g., a buffer, FOUP, or other location, of the semiconductor processing tool. In block 1406, the wafer-handling robot may be controlled to cause the calibration wafer to be placed onto a wafer support of the selected wafer station.

Subsequent to the placement of the calibration wafer onto the wafer support, the wafer-handling robot may be caused, in block 1408, to retrieve an autocalibration wafer from, for example, a docking station or other storage location. In block 1410, the wafer-handling robot may be actuated to cause the autocalibration wafer to be positioned over the calibration wafer and the wafer support of the selected wafer station such that each first imaging sensor of the autocalibration wafers has the edge of the calibration wafer and an edge of the wafer support within its field of view.

In block 1412, the autocalibration wafer may be caused to obtain image data of the gaps in between the edge of the calibration wafer and the edge of the wafer support, and in block 1414, a determination may be made as to the offset between the center of the wafer support and the center of the calibration wafer; this offset may be stored for later reference. In block 1416, a counter X may be incremented to X+1, and in block 1418, a determination may be made if X exceeds a given threshold Y. X may represent the number of test placements that has been performed as part of the technique, and Y may represent the total number of test placements that are to be performed as part of the technique.

If it is determined in block 1418 that X is not greater than Y, then the technique may proceed to block 1420 before returning to block 1404. In block 1420, the calibration wafer may be returned to its original location in the holding station or other location with a randomized offset before the wafer-handling robot is returned to a default or "home" position in block 1422. The randomized offset may be selected so as to be within the typical expected offsets for a wafer under normal operational use, e.g., offsets less than 0.8 mm. Thus, when the calibration wafer is again retrieved by the wafer-handling robot in block 1404 (which will generally be caused to return to the same position to retrieve the calibration wafer each time), the calibration wafer will have a correspondingly random offset position with respect to the end effector of the wafer-handling robot. It will also be understood that the randomization of the wafer placement may instead occur at other times, e.g., just prior to retrieving the calibration wafer from the holding station or other location, the wafer-handling robot may be caused to undergo a random displacement such that the calibration wafer's position with respect to the end effector is similarly randomized. Such randomization may serve to be representative of slight misalignments of wafers that are placed in the holding station during normal operation.

If it is determined in block 1418 that sufficient test wafer placements have been performed, the technique may proceed to block 1424, in which the center offsets for the Y wafer placements may be evaluated or analyzed. Such analysis may include any of a variety of different analysis techniques or tests, e.g., statistical parameters of the captured population of test wafer center offsets may be determined and compared against corresponding thresholds. For example, the mean, median, and standard deviation of the offsets may be determined and evaluated against corresponding thresholds for such values to determine if an acceptable consistency of wafer placement resulted from the test technique. In block 1426, the offsets may be compared against those thresholds (or, more accurately, the statistical parameters derived from the offsets may be compared against their corresponding thresholds) to determine if the test was successful or not. If the comparison of block 1426 indicates that one or more allowable parameters was exceeded, then the technique may proceed to block 1428, in which an error condition may be generated. If the comparison of block 1426 indicates that the one or more parameters are all within acceptable limits, then the technique may proceed to block 1430, in which the technique may be successfully completed.

It will be understood that similar techniques may also be practiced using edge rings, e.g., performing repeated edge ring placements and randomizing the end effector/edge ring offset between each placement in order to evaluate the repeatability of edge ring placement.

Figure 15:
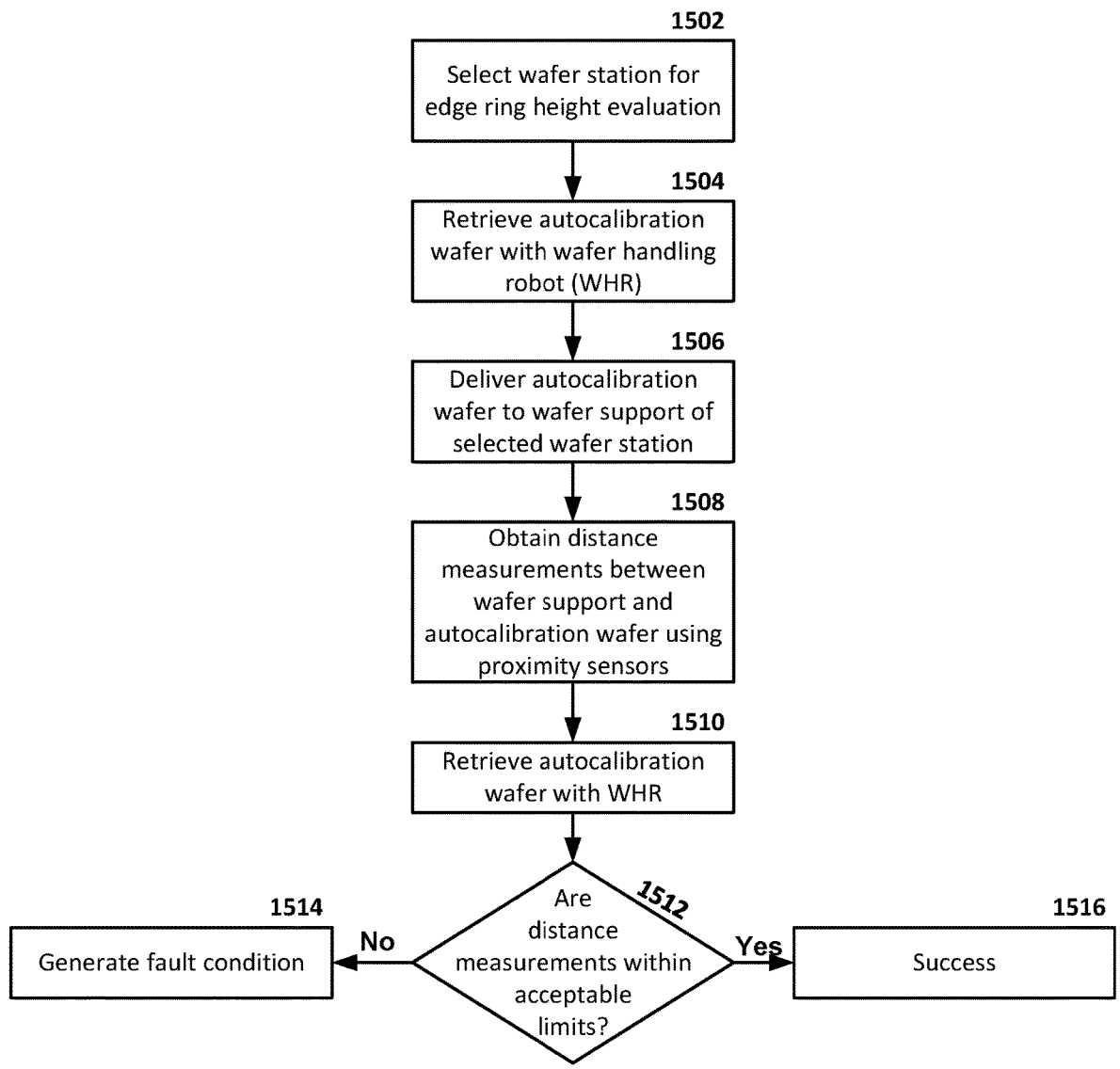
FIG. 15 depicts a flow chart of a technique for evaluating the height of an edge ring.

FIG. 15 depicts a flow chart of a technique for evaluating the height of an edge ring. In block 1502, a wafer station of a semiconductor processing tool may be selected; the wafer station that is selected should already have an edge ring that is in place on a wafer support thereof. For example, the technique of FIG. 15 may be performed at regular intervals during processing operations using an edge ring that is left in place on a wafer support during such operations in order to determine if the edge ring has degraded in a non-uniform manner (or to an unacceptable extent regardless of uniformity) as a result of exposure to repeated semiconductor wafer processing cycles.

In block 1504, an autocalibration wafer may be retrieved with a wafer-handling robot and then delivered to the wafer support of the selected wafer station. Such delivery of the autocalibration wafer to the wafer support may include placement of the autocalibration wafer directly on the edge ring, e.g., by lifting the calibration wafer off of the wafer-handling robot with lift pins and then lowering the autocalibration wafer onto the edge ring by retracting the lift pins.

In block 1508, the autocalibration wafer may be caused to obtain distance measurements between the autocalibration wafer and the wafer support using proximity sensors of the autocalibration wafer. In some implementations, such distance measurements may typically be obtained using proximity sensors located at at least three locations about the circumference of the autocalibration wafer, thereby allowing for a determination to be made as to the orientation of a plane defined by the autocalibration wafer relative to a plane defined by the top surface of the wafer support; if the distance between the two planes at any point around a circle of a diameter at or near the inner diameter of the edge ring and centered on the edge ring exceeds a particular threshold, then this may indicate that the edge ring thickness is out of tolerance and that the edge ring should be replaced.

In block 1510, the autocalibration wafer may be removed from the wafer support using the wafer-handling robot, and in block 1512, the obtained distance measurements may be evaluated and a determination may be made as to whether the measured distances indicate that the edge ring is or is not within acceptable height limits. For example, if any of the proximity distances falls below (or above) a predetermined threshold, then this may indicate that the edge ring height is too small (or too high). Another metric that may be used to evaluate edge ring height is the variation between the different distance measurements. For example, the difference between the largest distance measurement for an edge ring and the shortest distance measurement for that edge ring for a given measurement cycle using the autocalibration wafer may be compared against another predetermined threshold to determine if the edge ring height varies to an unacceptable amount about the circumference of the edge ring. If it is determined in block 1512 that the distance measurements are within acceptable limits, then the technique may proceed to block 1516, where a success condition may be determined. If it is determined in block 1512 that the distance measurements are not within acceptable limits, then the technique may proceed to block 1514, where a failure or fault condition may be generated. Such a condition may cause the semiconductor processing tool to halt further processing operations at that wafer station until a new edge ring has been installed, centered, and then had a height measurement performed.

Figure 16:
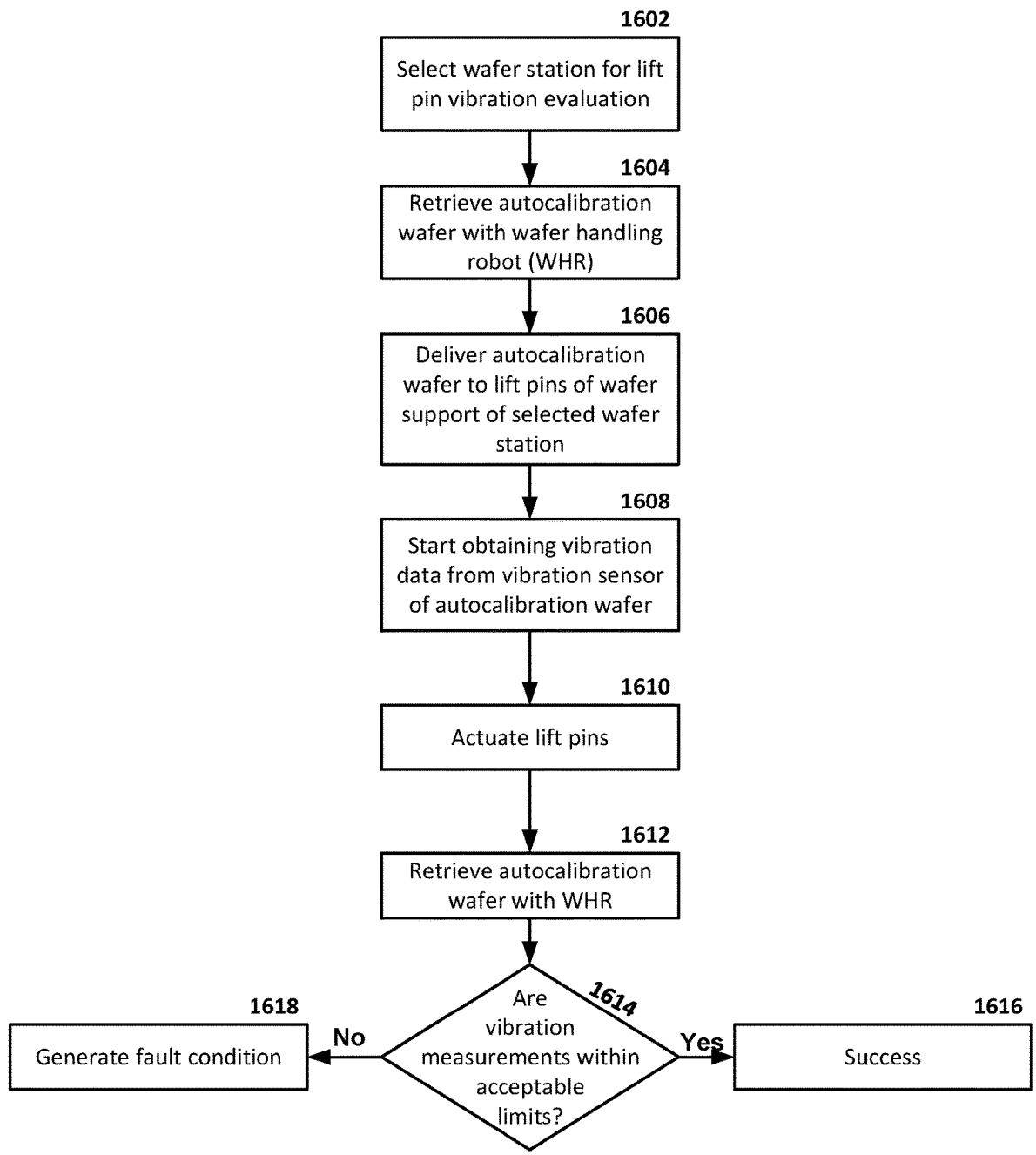
FIG. 16 depicts a flow chart of a technique for evaluating lift pin vibration.

As mentioned earlier, in some implementations, autocalibration wafers may be used to determine dynamic characteristics of semiconductor processing tools, e.g., lift pin vibration and tilt, as well. FIG. 16 depicts a flow chart of a technique for evaluating lift pin vibration.

The technique of FIG. 16 may begin in block 1602, in which a wafer station for lift pin vibration evaluation may be selected. In block 1604, a wafer-handling robot may be actuated to retrieve an autocalibration wafer from, for example, a storage location such as a docking station. In block 1606, the autocalibration wafer may be positioned above a wafer support of the selected wafer station, after which lift pins of the wafer support may be caused to lift the autocalibration wafer off of the end effector of the wafer-handling robot. In block 1608, the autocalibration wafer may be caused to start obtaining vibration data from a vibration sensor of the autocalibration wafer; it will be understood that such data may also be obtained earlier or continuously in some implementations. In block 1610, the lift pins may be actuated to cause the autocalibration wafer, for example, to be moved vertically relative to the wafer support. In some implementations, such movement may include lowering the autocalibration wafer onto the wafer support and then lifting it again, as would normally be experienced by a semiconductor wafer during normal wafer placement operations. In other implementations, the lift pins may be actuated in a way that does not correspond with normal wafer placement movements but which may be designed to be more likely to provoke a particular vibratory response. In either case, the autocalibration wafer is exposed to movement through the actuation of the lift pins, and vibration data may be collected by the vibration sensor or sensors during such movement.

In block 1612, the wafer-handling robot may be controlled to cause the autocalibration wafer to be retrieved from the lift pins, and in block 1614, the vibration data may be analyzed to determine if it is within acceptable limits. For example, if the magnitude of vibration exceeds a predetermined threshold, or if the magnitude of a particular frequency component of the vibration exceeds a predetermined threshold, then a determination may be made that the vibration measurements are beyond acceptable limits, and the technique may proceed to block 1618, in which a fault condition may be generated. The duration of lift pin movement during each stage of its movement can also be measured and compared against an acceptable range to determine whether a fault condition exists in the lift pin mechanism. In such instances, the semiconductor processing tool may, for example, suspend wafer processing operations using that wafer processing station until the lift pin mechanism has been serviced and the issue resolved. If the lift pin mechanism is controlled via actuators, a closed loop system can be implemented to use the vibration data to automatically calibrate the lift pin mechanism. In some implementations, the semiconductor processing tool may generate a warning that the lift pin mechanism requires maintenance or repair, but may continue to perform semiconductor processing operations at that wafer station (and use the lift pin mechanism) until a later vibration evaluation of the lift pins indicates that the vibration that occurs during lift pin actuation has exceeded a second set of acceptable limits. In some such implementations, the semiconductor processing tool may cause the lift pin mechanism to operate at a reduced performance level, e.g., at a slower speed as compared with normal lift pin mechanism speed, after encountering a fault condition in order to potentially reduce the magnitude of vibration experienced. Such reduced throughput operation may be continued until the lift pin mechanism is serviced and the issue resolved or until the vibration produced through operation of the lift pin mechanism degrades to a further, unacceptable level, in which case use of that wafer station and lift pin mechanism may be suspended until maintenance can be performed. The vibration data of the lift pin mechanism may be sent to an off-the-tool data center with big data and machine-learning capabilities that may receive vibration data from a large number of similar semiconductor processing tools to establish a healthy versus unhealthy lift pin vibration signature. In such cases, raw vibration data or a vibration signature (after machine-learning feature extraction) may be sent to data center. The data center may use received vibration data across a fleet of semiconductor processing tools to train machine-learning models, e.g., neural networks, tensor flow, etc., to classify lift pin mechanisms as healthy or unhealthy.

Figure 17:
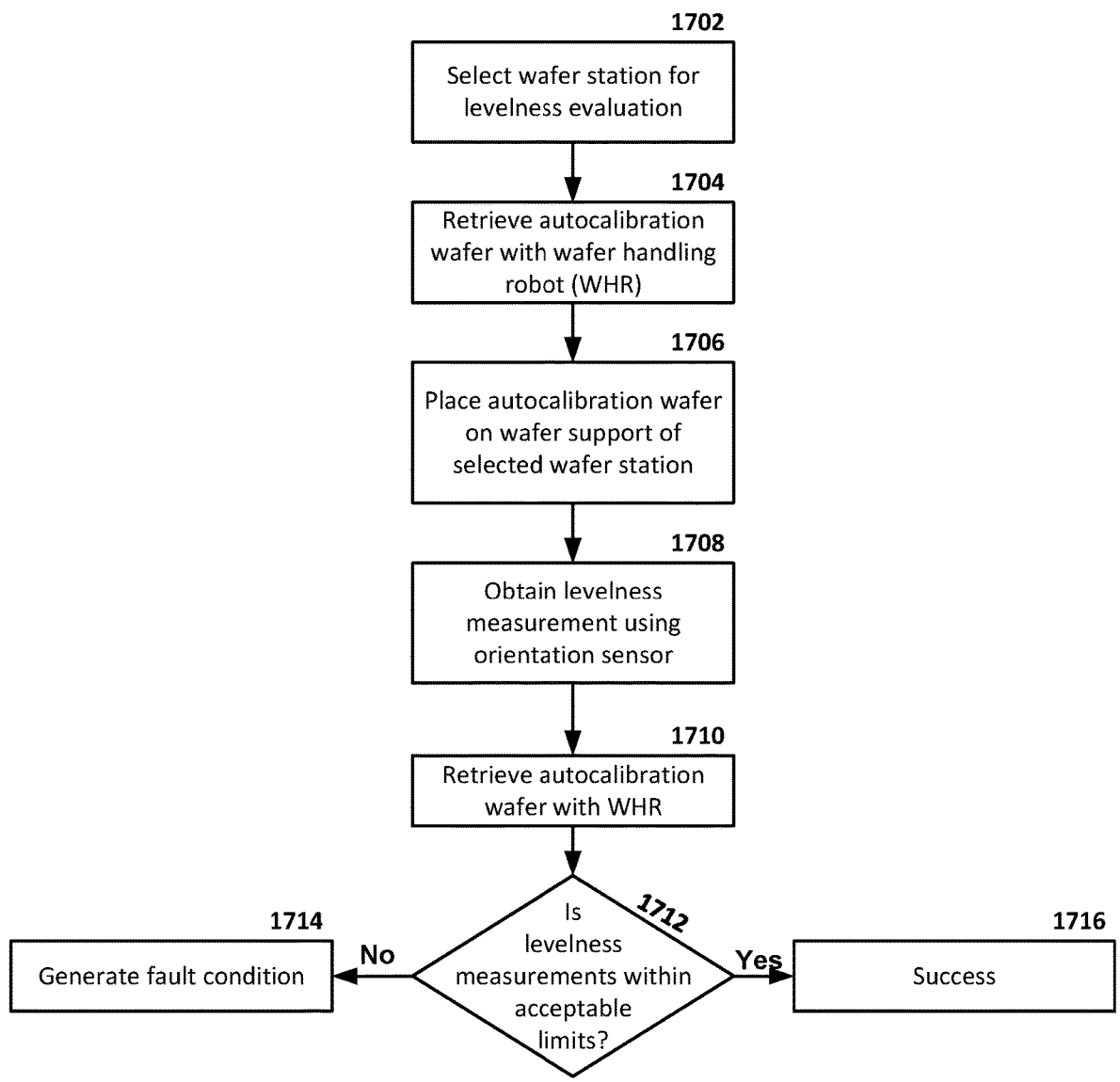
FIG. 17 depicts a flow chart of a technique for evaluating pedestal levelness.

Another test technique that may be performed with an autocalibration wafer is to assess the levelness of a wafer support (or other equipment, e.g., a wafer-handling robot end effector, a lift pin mechanism, load port module (LPM), wafer support, ESC, etc.). FIG. 17 depicts a flow chart of a technique for evaluating wafer support levelness, although the technique may be practiced for a variety of different wafer-handling components.

In block 1702, a wafer station of a semiconductor processing tool may be selected for levelness measurement of a wafer support thereof.

In block 1704, a wafer-handling robot of the semiconductor processing may be caused to retrieve an autocalibration wafer from a docking station or other storage location, and in block 1706, the wafer-handling robot may be controlled to cause the autocalibration wafer to be placed directly on the wafer support. If an edge ring is present on the wafer support and would interfere with allowing the autocalibration wafer to be placed directly on the wafer support, then the edge ring may be caused to be removed, e.g., using the wafer-handling robot of the semiconductor processing tool, prior to placement of the autocalibration wafer on the wafer support.

Once the autocalibration wafer is placed on the wafer support, the autocalibration wafer may be caused to obtain levelness measurements in block 1708 using, for example, an orientation sensor, such as an accelerometer or tilt sensor. In some implementations, multiple levelness sensors may be utilized to obtain such measurements.

In block 1710, the autocalibration wafer may be retrieved from the wafer support using the wafer-handling robot, and in block 1712, a determination may be made as to whether the levelness measurements of the wafer support are within acceptable limits. If not, then the technique may proceed to block 1714, in which a fault condition may be generated. If so, then the technique may proceed to block 1716, in which a success condition may be generated.

It will be appreciated that the various techniques described herein may be combined in various ways to provide a completely automated system for configuring a semiconductor processing tool. For example, a semiconductor processing tool may be configured to have an "initial setup" mode that it may be placed in where the tool may retrieve and center edge rings on each wafer support in a semiconductor processing chamber using the autocalibration wafer and then, for each wafer support, center a calibration wafer the associated edge ring using the autocalibration wafer, train an active wafer centering system and wafer-handling robot with the centered calibration wafer, and then verify that the trained active wafer centering system produces reliable wafer placement. The semiconductor processing tool may also periodically perform various health checks, such as checking to see if the center-to-center offset for an edge ring and calibration wafer has drifted to an unacceptable distance, checking to see if the edge ring height is still within acceptable bounds after a predetermined time period or number of wafer processing operations has been performed, and/or checking to see if the wafer support is level and/or if the lift pin vibration is within acceptable bounds.

As noted above, the controller may be part of a system that may include semiconductor processing equipment, including a processing tool or tools, chamber or chambers, platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, as well as various parameters affecting semiconductor processing, such as the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

It will be understood that while the above discussions have focused on autocalibration wafer systems that typically feature a plurality of imaging sensors and, in various further implementations, one or more additional sensors, some implementations may feature a single center-mounted imaging sensor and no edge-located imaging sensors or only edge-located imaging sensors and no center-mounted imaging sensor; such implementations may, in some instances, provide correspondingly less functionality than implementations featuring both a center-mounted and edge-mounted imaging sensors, although not necessarily. This disclosure is to be understood as encompassing such alternative implementations as well.

The term "wafer," as used herein, may refer to semiconductor wafers or substrates or other similar types of wafers or substrates. A wafer station, as the term is used herein, may refer to any location in a semiconductor processing tool in which a wafer may be placed during any of various wafer processing operations or wafer transfer operations. Wafer support is used herein to refer to any structure in a wafer station that is configured to receive and support a semiconductor wafer, e.g., a pedestal, an electrostatic chuck, a wafer support shelf, etc.

The term "nominally centered," as used herein, refers to a relative placement of two or more objects such that certain locations, e.g., center points or similar locations, are generally aligned with one another in the XY plane. Such alignment may not be perfect for various reasons, e.g., slippage of one of the objects, sensor drift, etc., but in most cases, a nominally centered object may be within a millimeter or two of a perfectly centered object.

It is also to be understood that the use of ordinal indicators, e.g., (a), (b), (c), herein is for organizational purposes only, and is not intended to convey any particular sequence or importance to the items associated with each ordinal indicator. For example, "(a) obtain information regarding velocity and (b) obtain information regarding position" would be inclusive of obtaining information regarding position before obtaining information regarding velocity, obtaining information regarding velocity before obtaining information regarding position, and obtaining information regarding position simultaneously with obtaining information regarding velocity. There may nonetheless be instances in which some items associated with ordinal indicators may inherently require a particular sequence, e.g., "(a) obtain information regarding velocity, (b) determine a first acceleration based on the information regarding velocity, and (c) obtain information regarding position"; in this example, (a) would need to be performed (b) since (b) relies on information obtained in (a)-(c), however, could be performed before or after either of (a) or (b).

It is to be understood that use of the word "each," such as in the phrase "for each <item> of the one or more <items>" or "of each <item>," if used herein, should be understood to be inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, when a selected item may have one or more sub-items and a selection of one of those sub-items is made, it will be understood that in the case where the selected item has one and only one sub-item, selection of that one sub-item is inherent in the selection of the item itself.

It will also be understood that references to multiple controllers that are configured, in aggregate, to perform various functions are intended to encompass situations in which only one of the controllers is configured to perform all of the functions disclosed or discussed, as well as situations in which the various controllers each perform sub-portions of the functionality discussed. For example, an autocalibration wafer may include a controller that is configured to control the operation of the various sensors on the autocalibration wafer and communicate data therefrom to another controller associated with a semiconductor processing tool; the semiconductor processing tool controller may then analyze such data to determine various operational parameters for use with the semiconductor processing tool.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A system comprising: a semiconductor processing tool including: a wafer-handling robot; one or more wafer stations; and a first controller, wherein: each wafer station includes one or more corresponding wafer supports, the wafer-handling robot and the first controller are communicatively connected; and an autocalibration wafer including: a substrate sized to be carried by the wafer-handling robot and having a first side that is configured to contact an end effector of the wafer-handling robot when the substrate is carried by the wafer-handling robot; a plurality of first imaging sensors supported by the substrate and positioned at locations offset from a common point of the substrate, each first imaging sensor having a downward-facing field of view when the substrate is oriented with the first side facing downwards; and a second controller, wherein: the second controller is communicatively connected with each of the first imaging sensors, and the second controller and the first controller, in aggregate, are configured to: a) select a first wafer support of the one or more wafer supports of a first wafer station of the one or more wafer stations, b) cause the wafer-handling robot to position the autocalibration wafer above the first wafer station, c) cause each first imaging sensor to obtain a corresponding first image of a fiducial of the first wafer support while the autocalibration wafer is positioned above the first wafer support, d) cause the wafer-handling robot to retrieve a first edge ring, e) cause the wafer-handling robot to transfer the first edge ring to the first wafer support such that a center point of the first edge ring is nominally centered on a center point of the first wafer support when viewed along a vertical axis, f) cause the wafer-handling robot to position the autocalibration wafer over the first wafer support and the first edge ring, g) cause each first imaging sensor to obtain a corresponding second image of a fiducial of the first wafer support and a fiducial of the first edge ring while the autocalibration wafer is positioned over the first wafer support and the first edge ring, and h) determine an edge ring/wafer support horizontal offset between the center point of the first edge ring and the center point of the first wafer support based on gap sizes between the fiducials of the first wafer support and the first edge ring in the second images.

2. The system of claim 1, wherein the first imaging sensors are arranged in a circular array about the common point.

3. The system of claim 1, wherein the substrate is nominally circular and has the same diameter as semiconductor wafers that the semiconductor processing tool is configured to process.

4. The system of claim 1, wherein the substrate is nominally circular and has the same diameter as an edge ring that the semiconductor processing tool is configured to use.

5. The system of claim 1, wherein the substrate is nominally circular and has a diameter in between an outer diameter and an inner diameter of an edge ring that the semiconductor processing tool is configured to use.

6. The system of claim 1, wherein the substrate is nominally circular and has a diameter within 10% of the average between an outer diameter and an inner diameter of an edge ring that the semiconductor processing tool is configured to use.

7. The system of claim 1, wherein: the autocalibration wafer further includes a rechargeable battery configured to provide power to at least the second controller and the first imaging sensors; and the autocalibration wafer further includes a wireless charging feature configured to charge the rechargeable battery when interfaced with an electromagnetic field.

8. The system of claim 1, wherein: the autocalibration wafer further includes a first wireless communications interface, the first wireless communications interface includes one or more wireless communications interfaces selected from the group consisting of: a Bluetooth transceiver and a WiFi transceiver, and the first wireless communications interface is communicatively connected with the second controller.

9. The system of claim 1, wherein: the autocalibration wafer further includes one or more orientation sensors, each orientation sensor is selected from the group consisting of: an inclinometer and an accelerometer, and the one or more orientation sensors are communicatively connected with the second controller.

10. The system of claim 1, wherein: the autocalibration wafer further includes one or more vibration sensors, each vibration sensor is selected from the group consisting of: an accelerometer, a laser microphone, and an optical distance measurement sensor, and the one or more vibration sensors are communicatively connected with the first second controller.

11. The system of claim 1, wherein: the autocalibration wafer further includes one or more proximity sensors each configured to measure a distance between the first side and an object located beneath that proximity sensor when the first side is facing downward, each proximity sensor is selected from the group consisting of: an optical proximity sensor, an inductive proximity sensor, and a capacitive proximity sensor, and the one or more proximity sensors are communicatively connected with the second controller.

12. The system of claim 1, wherein: the first imaging sensors are arranged in a circular array about the common point, the substrate is nominally circular and has the same diameter as semiconductor wafers that the semiconductor processing tool is configured to process, the substrate is a nominally circular disk having a diameter selected from the group consisting of: 200 mm, 300 mm, and 450 mm, and the autocalibration wafer further includes: a rechargeable battery configured to provide power to at least the second controller and the first imaging sensors, a wireless charging feature configured to charge the rechargeable battery when interfaced with an electromagnetic field, a first wireless communications interface that is communicatively connected with the second controller and includes one or more wireless communications interfaces selected from the group consisting of: a Bluetooth transceiver and a WiFi transceiver, one or more vibration sensors communicatively connected with the second controller, and one or more proximity sensors, each proximity sensor communicatively connected with the second controller and configured to measure a distance between the first side and an object located beneath that proximity sensor when the first side is facing downward.

13. The system of claim 1, wherein the second controller and the first controller, in aggregate, are further configured to: i) determine location information for a center point of the first wafer support based on the first images, j) cause the wafer-handling robot to retrieve a calibration wafer, k) cause the wafer-handling robot to transfer the calibration wafer to the first wafer support such that a center point of the calibration wafer is nominally centered on a center point of the first wafer support when viewed along a vertical axis, l) cause the wafer-handling robot to position the autocalibration wafer over the first wafer support and the calibration wafer, m) cause each first imaging sensor to obtain a corresponding second image of a fiducial of the first wafer support and a fiducial of the calibration wafer while the autocalibration wafer is positioned over the first wafer support and the calibration wafer, and n) determine a wafer/wafer support horizontal offset between the center point of the calibration wafer and the center point of the first wafer support based on gap sizes between the fiducials of the first wafer support and the calibration wafer in the second images.

14. The system of claim 13, wherein the first controller and the first second controller, in aggregate, are further configured to: o) compare the wafer/wafer support horizontal offset to a threshold wafer/wafer support horizontal offset, and p) cause, responsive to determining that the wafer/wafer support horizontal offset is above the threshold wafer/wafer support horizontal offset, the wafer-handling robot to reposition the calibration wafer relative to the first wafer support to reduce the wafer/wafer support horizontal offset.

15. The system of claim 1, wherein the first controller and the second controller, in aggregate, are further configured to: i) compare the edge ring/wafer support horizontal offset to a threshold edge ring/wafer support horizontal offset, and j) cause, responsive to determining that the edge ring/wafer support horizontal offset is above the threshold edge ring/wafer support horizontal offset, the wafer-handling robot to reposition the first edge ring relative to the first wafer support to reduce the edge ring/wafer support horizontal offset.

16. The system of claim 1, wherein the first controller and the second controller, in aggregate, are further configured to: i) cause the wafer-handling robot to retrieve a calibration wafer, j) cause the wafer-handling robot to transfer the calibration wafer to the first wafer support such that a center point of the calibration wafer is nominally centered on the center point of the first edge ring when viewed along the vertical axis, k) cause the wafer-handling robot to position the autocalibration wafer over the first wafer support, the first edge ring, and the calibration wafer, l) cause each first imaging sensor to obtain a corresponding second image of a fiducial of the calibration wafer and the fiducial of the first edge ring while the autocalibration wafer is positioned over the first wafer support, the calibration wafer, and the first edge ring, m) compare the edge ring/wafer horizontal offset to a threshold edge ring/wafer horizontal offset, and n) cause, responsive to determining that the edge ring/wafer horizontal offset is above the threshold edge ring/wafer horizontal offset, the wafer-handling robot to reposition the calibration wafer relative to the first edge ring to reduce the edge ring/wafer horizontal offset.

17. The system of claim 9, wherein the first controller and the second controller, in aggregate, are further configured to: i) cause the wafer-handling robot to transfer the autocalibration wafer to the first wafer station, and j) cause the one or more orientation sensors to obtain an inclination measurement for the substrate.

18. The system of claim 10, wherein the first wafer support includes a plurality of lift pins, and the first controller and the second controller, in aggregate, are further configured to: i) cause relative translation to occur between the lift pins and the first wafer support such that the lift pins protrude from the first wafer support, j) cause the wafer-handling robot to transfer the autocalibration wafer to the lift pins, k) cause further relative translation to occur between the lift pins and the first wafer support while the autocalibration wafer is supported by the lift pins, l) obtain vibration data from the one or more vibration sensors during (k), m) evaluate the vibration data to determine if the vibration data indicates that vibrations that exceed a predetermined threshold, and n) provide a notification when the vibration data exceeds the predetermined threshold.

19. The system of claim 11, wherein the first controller and the second controller, in aggregate, are further configured to: i) determine that one of the one or more wafer supports of the one or more wafer stations supports an edge ring, j) cause the autocalibration wafer to be placed onto the edge ring, k) cause each proximity sensor to measure a distance between the wafer support that is supporting the edge ring and the autocalibration wafer, l) determine one or more height measurements associated with the edge ring based on the one or more distances, m) evaluate the one or more height measurements to determine if a height associated with the edge ring exceeds a predetermined threshold, and n) provide a notification when the height associated with the edge ring exceeds the predetermined threshold.

* * * * *